United States Patent
Toda

(10) Patent No.: US 7,369,433 B2
(45) Date of Patent: May 6, 2008

(54) SEMICONDUCTOR MEMORY DEVICE

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 136 days.

(21) Appl. No.: 11/476,023

(22) Filed: Jun. 28, 2006

(65) Prior Publication Data
US 2007/0019467 A1    Jan. 25, 2007

(30) Foreign Application Priority Data
Jul. 25, 2005    (JP) ............................. 2005-214416

(51) Int. Cl.
*G11C 16/04* (2006.01)
(52) U.S. Cl. .............................. 365/185.03; 365/185.17
(58) Field of Classification Search ........... 365/185.03, 365/185.17, 185.2, 185.23
See application file for complete search history.

(56) References Cited
U.S. PATENT DOCUMENTS

| | | | |
|---|---|---|---|
| 6,288,935 B1 | 9/2001 | Shibata et al. | |
| 6,477,087 B2 * | 11/2002 | Tanaka et al. | ......... 365/185.22 |
| 6,807,096 B2 | 10/2004 | Toda | |
| 6,847,555 B2 | 1/2005 | Toda | |
| 7,006,380 B2 | 2/2006 | Toda | |
| 2007/0019467 A1 | 1/2007 | Toda | |
| 2007/0121376 A1 * | 5/2007 | Toda | ....................... 365/185.2 |

OTHER PUBLICATIONS

U.S. Appl. No. 11/476,023, filed Jun. 28, 2006, Toda.
U.S. Appl. No. 11/561,194, filed Nov. 17, 2006, Toda.
U.S. Appl. No. 11/563,408, filed Nov. 27, 2006, Edahiro, et al.
U.S. Appl. No. 11/623,907, filed Jan. 17, 2007, Suzuki et al.
U.S. Appl. No. 11/674,342, filed Feb. 13, 2007, Toda, et al.
U.S. Appl. No. 11/674,384, filed Feb. 13, 2007, Toda.
U.S. Appl. No. 11/691,636, filed Mar. 27, 2007, Toda, et al.
U.S. Appl. No. 11/832,987, filed Aug. 2, 2007, Toda.

* cited by examiner

*Primary Examiner*—Vu A. Le
(74) *Attorney, Agent, or Firm*—Oblon, Spivak, McClelland, Maier & Neustadt, P.C.

(57) ABSTRACT

A semiconductor memory device includes: first and second cell arrays each having a plurality of memory cells; and a sense amplifier circuit for reading out data of the first and second cell arrays, wherein plural information cells and at least one reference cell are set in each of the first and second cell arrays, one of four data levels L0, L1, L2 and L3 (where, L0<L1<L2<L3) being written into the information cell, reference level Lr (where, L0<Lr<L1) being written into the reference cell to used for detecting the data level of the information cell, and wherein the sense amplifier circuit detects a cell current difference between the information cell and the reference cell simultaneously selected from the first and second cell arrays.

21 Claims, 40 Drawing Sheets

FIG. 10

| (HB, LB) | T2 | T1 | T3 |
|---|---|---|---|
| (0, 0) | 0 | 0 | 0 |
| (0, 1) | 0 | 0 | 1 |
| (1, 1) | 1 | 0 | 1 |
| (1, 0) | 1 | 1 | 1 |

|  | CLK /CLK Generation Step |
| --- | --- |
| HB Sense | T2 |
| LB Sense | T1/T3 |

|  | vpr(1) | vpr(2) |
|---|---|---|
| HBL | 0 |  |
| LBL |  | 1 |

|    | vp1 | | vp2 | | vp3 | |
|----|-----|-----|-----|-----|-----|-----|
| HB | 0 | 1 | 0 | 1 | 0 | 1 |
| LB | 0 1 0 1 | | 0 1 0 1 | | 0 1 0 1 | |

SEMICONDUCTOR MEMORY DEVICE

CROSS-REFERENCE TO RELATED APPLICATION

This application is based on and claims the benefit of priority from the prior Japanese Patent Application No. 2005-214416, filed on Jul. 25, 2005, the entire contents of which are incorporated herein by reference.

BACKGROUND OF THE INVENTION

1. Field of the Invention

This invention relates to a semiconductor memory device (EEPROM), in which electrically rewritable and non-volatile memory cells are arranged therein.

2. Description of the Related Art

EEPROM flash memories are classified in general into NAND-type and NOR-type ones. A NAND-type flash memory is formed of NAND strings (i.e., NAND cell units) each having plural memory cells connected in series in such a way that adjacent cells share source/drain diffusion layers. Therefore, the cell density is higher than that of a NOR-type one. Besides the NAND-type flash memory has a feature with low power consumption because plural memory cells may be written in a lump by use of FN tunnel current. Considering these features, the NAND-type flash memory is mainly applied to a file memory with a large capacity.

By contrast, since a NOR-type flash memory has, in spite of the large power consumption, a possibility of high speed access, it is mainly applied to mobile apparatuses.

Recently, however, a mobile apparatus tends to deal with an image data and the like with a large quantity of data. Therefore it is required of the mobile apparatus to contain a flash memory which has a high-speed performance and a large capacity with the same level as a file memory. Accordingly, to adapt a NAND-type flash memory to a high-speed system with a buffer memory such as DRAMs, there has been provided a method of improving the data transmission rate, in which, for example, cell data is read out to a page buffer and then serially transferred and output.

Even the above-described method is used, there is a limit for improving the speed of the NAND-type flash memory because cell current thereof is one several tenth of that of a NOR-type flash memory, so that it is difficult to sense data at a high rate as in the NOR-type flash memory with a reference level. The sense amplifier used in a NAND-type flash memory sensing cell data with detecting whether the bit line voltage is discharged or not in accordance with cell data, it takes a time by the micro second for data-sensing.

To increase the cell current of the NAND-type flash memory, it is useful to increase the cell size (i.e., channel width), but this will dilute such a feature of the NAND-type flash memory that the cell area is small.

For the purpose of making possible to store a large quantity of data, there has been provided a flash memory with a multi-value data storage scheme. Further, there has been provided a method of reducing the read time by reducing the read number in the multi-value data storage scheme (for example, refer to Unexamined Japanese Patent Application Publication No. 2001-93288).

Further, there has been provided a memory device with a multi-value data storage scheme, in which two memory cells connected to a pair of bit lines constitute a pair cell, and multi-value data is stored as been defined by a combination of different threshold voltages in the pair cell (for example, refer to Unexamined Japanese Patent Application Publication No. 2004-319007).

SUMMARY OF THE INVENTION

According to an aspect of the present invention, there is provided a semiconductor device including:

first and second cell arrays each having a plurality of electrically rewritable and non-volatile memory cells arranged therein; and a sense amplifier circuit configured to read out data of the first and second cell arrays, wherein plural information cells and at least one reference cell are set in each of the first and second cell arrays, one of four data levels L0, L1, L2 and L3 (where, L0<L1<L2<L3) being written into the information cell, reference level Lr (where, L0<Lr<L1) being written into the reference cell to used for detecting the data level of the information cell, and wherein the sense amplifier circuit is configured to detect a cell current difference between the information cell and the reference cell simultaneously selected from one of the first and second cell arrays and the other, respectively.

According to another aspect of the invention, there is provided a semiconductor memory device including:

first and second cell arrays each having word lines and bit lines disposed in parallel and a plurality of electrically rewritable and non-volatile memory cells arranged at the crossings thereof, plural information cells and at least one reference cell being set in each of the first and second cell arrays, one of four data levels L0, L1, L2 and L3 (where, L0<L1<L2<L3) being written into the information cell, a reference level Lr (where, L0<Lr<L1) being written into the reference cell to be used for detecting the data level of the information cell;

word line driver circuits configured to selectively drive word lines in the first and second cell arrays; and a sense amplifier circuit connected to a pair of bit lines, to which the information cell and the reference cell simultaneously selected from one and the other of the first and second cell arrays, are coupled, so as to detect a cell current difference between the information cell and the reference cell, thereby reading out data of the information cell, wherein each of the word line driver circuits has at least two driving modes with respect to driving plural word lines simultaneously selected at a data read time and applied with respectively predetermined word line voltages as follows: a first driving mode for applying a first voltage necessary for data-sensing to a first word line from the beginning; and a second driving mode for applying a third voltage higher than a second voltage necessary for data-sensing to a second word line, and then restoring the third voltage to the second voltage.

According to still another aspect of the invention there is provided a semiconductor memory device including:

first and second bit lines constituting a pair;

a plurality of first NAND strings selectively coupled to the first bit line, the first NAND string including a plurality of memory cells connected in series, each memory cell serving as an information cell to be written into one of four data levels of L0, L1, L2 and L3 (where, L0<L1<L2<L3);

a plurality of second NAND strings selectively coupled to the second bit line, the second NAND string including a plurality of memory cells connected in series, each memory cell serving as an information cell to be written into one of the four data levels of L0, L1, L2 and L3;

at least one third NAND string selectively coupled to the first bit line, the third NAND string including a plurality of memory cells connected in series, each memory cell serving as an reference cell to be written into data level Lr (where, L0<Lr<L1);

at least one fourth NAND string selectively coupled to the second bit line, the fourth NAND string including a plurality of memory cells connected in series, each memory cell serving as an reference cell to be written into the data level Lr;

a decode circuit configured to select one of the first NAND strings and the fourth NAND string simultaneously, or one of the second NAND strings and the third NAND string simultaneously, at a read time; and a sense amplifier circuit configured to be coupled to the first and second bit lines to detect a cell current difference between a selected information cell and a selected reference cell, thereby sensing data of the selected information cell.

According to still another aspect of the invention, there is provided a data read method of a semiconductor memory device with NAND strings arranged therein, each NAND string including a plurality of memory cells connected in series, which are selectively driven by different word lines to store multi-value data, comprising first and second read steps sequentially performed to detect different data levels of a selected memory cell in a selected NAND string, wherein the first read step is performed with a first read voltage applied to a selected word line and a first pass voltage applied to non-selected word lines, the first pass voltage being set to turn on cells without regard to cell data;

the second read step is performed with a second read voltage applied to the selected word line and a second pass voltage applied to the non-selected word lines, the second read voltage being higher than the first read voltage, the second pass voltage being set to turn-on cells without regard to cell data and stepped down from the first pass voltage; and at the switching time from the first read step to the second read step, the first read voltage is boosted to a third read voltage higher than the second read voltage and then restored to the second read voltage.

BRIEF DESCRIPTION OF THE DRAWINGS

FIG. 10 shows data transitions in accordance with data read steps.

DETAILED DESCRIPTION OF THE EMBODIMENTS

Illustrative embodiments of this invention will be explained with reference to the accompanying drawings below.

In a semiconductor memory device in accordance with this embodiment, the main portion of the memory cell array is set as an area of "information cells", into each of which one of plural physical quantity levels (i.e., data levels) is written while the remaining portion is set as an area of "reference cell(s)", into which a fixed physical quantity level (i.e., reference level) is written for serving for detecting the data levels. In other words, there is prepared a common reference cell in correspondence with plural information cells, and the reference cell constitutes a pair with each of the plural information cells.

The detail will be explained below. In case of a four-value data storage scheme, an information cell is set to have a data level selected in L0, L1, L2 and L3 (where L0<L1<L2<L3). L0 is an erase state with the lowest level; and L1, L2 and L3 are write states, which are obtained by writing data into the cell of data level L0. Reference level Lr of the reference cell is set lower than the lowest write level L1, preferably as follows: L0<Lr<L1.

In the embodiment described below, cell's threshold voltage levels are used as the physical quantity levels (data levels).

[Memory Chip Configuration]

Figure 1:
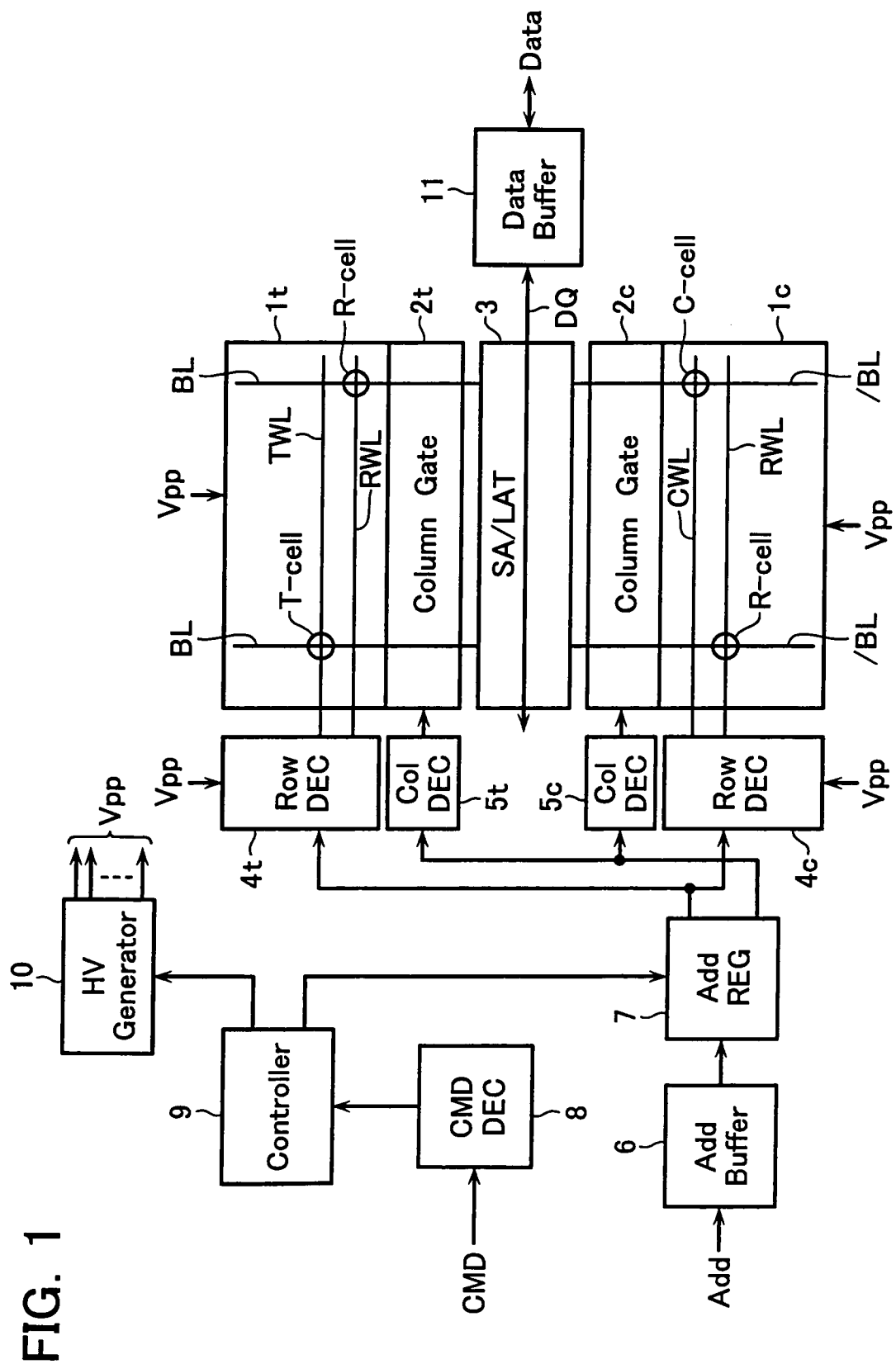
FIG. 1 shows a functional block configuration of a NAND-type flash memory in accordance with an embodiment of the present invention.

FIG. 1 shows a NAND-type flash memory configuration in accordance with an embodiment. A memory cell array 1 is divided into two cell arrays 1t and 1c, which share a sense amplifier circuit 3. In this cell array configuration, it is used such an open bit line scheme that bit lines BL and /BL are simultaneously selected in the cell arrays 1t and 1c, and constitute a pair.

Main memory cells arranged in each cell array 1t, 1c are used as "information cells" for storing data; and the remaining cell(s) as "reference cell(s)" for storing reference levels for data-reading. Data in the cell arrays 1t and 1c are reversed in logic. In the below-description, an information cell in the cell array 1t is referred to as "T-cell" while one in the cell array 1c is referred to as "C-cell". There is prepared at least one reference cell, "R-cell", in each cell array 1t, 1c.

At a data read time, when an information cell T-cell is selected in one cell array 1t with a word line TWL and the bit line BL in a pair of bit lines BL and /BL, a reference cell R-cell is selected in the other cell array 1c with a reference word line RWL, which is selected simultaneously with the word line TWL, and the bit line /BL, and these T-cell and R-cell constitute a pair.

Similarly, when an information cell C-cell is selected in one cell array 1c with a word line CWL and the bit line /BL in a pair of bit lines BL and /BL, a reference cell R-cell is selected in the other cell array 1t with a reference word line RWL, which is selected simultaneously with the word line CWL, and the bit line BL, and these C-cell and R-cell constitute a pair.

There is no difference in structure between the information cells T-cell, C-cell and the reference cell R-cell. One reference cell R-cell is fixedly selected in the cell array 1c in correspondence with plural information cells T-cell in the cell array 1t; and one reference cell R-cell is fixedly selected in the cell array 1t in correspondence with plural information cells C-cell in the cell array 1c.

The reason why the open bit line scheme is used in this embodiment is that it is in need of applying different voltages to a word line (TWL or CWL) and a reference word line RWL, which are simultaneously selected (as explained later).

A pair of bit lines BL and /BL in the cell arrays 1t and 1c are selected with column gates 2t and 2c to be coupled to the sense amplifier circuit 3. Data transferring between the sense amplifier circuit 3 and external input/output terminals is performed via a data bus DQ disposed on the area of the sense amplifier circuit 3 and a data buffer 11.

The column gates 2t and 2c are controlled with column decoders 5t and 5c, respectively. There are prepared word line select/drive circuits (row decoders) 4t and 4c for selectively driving word lines in the cell arrays 1t and 1c, respectively.

Address, Add, is supplied to the row decoders 4t, 4c and column decoders 2t, 2c via address buffer 6 and address register 7.

Command, CMD, supplied from the outside of the chip for defining an operation mode, is decoded in a command decoder 8 and supplied to a controller 9, which controls write and erase sequences and a data read operation.

It is required of the cell arrays 1t, 1c and row decoders 4t, 4c and so on to be applied with various high voltages Vpp serving as write voltage Vpgm, verify voltage Vr, pass voltages Vpass, Vread and the like used in accordance with operation modes. To generate such the high voltages Vpp, there is prepared a high voltage generation circuit 10, which is also controlled with the controller 9.

Figure 2:
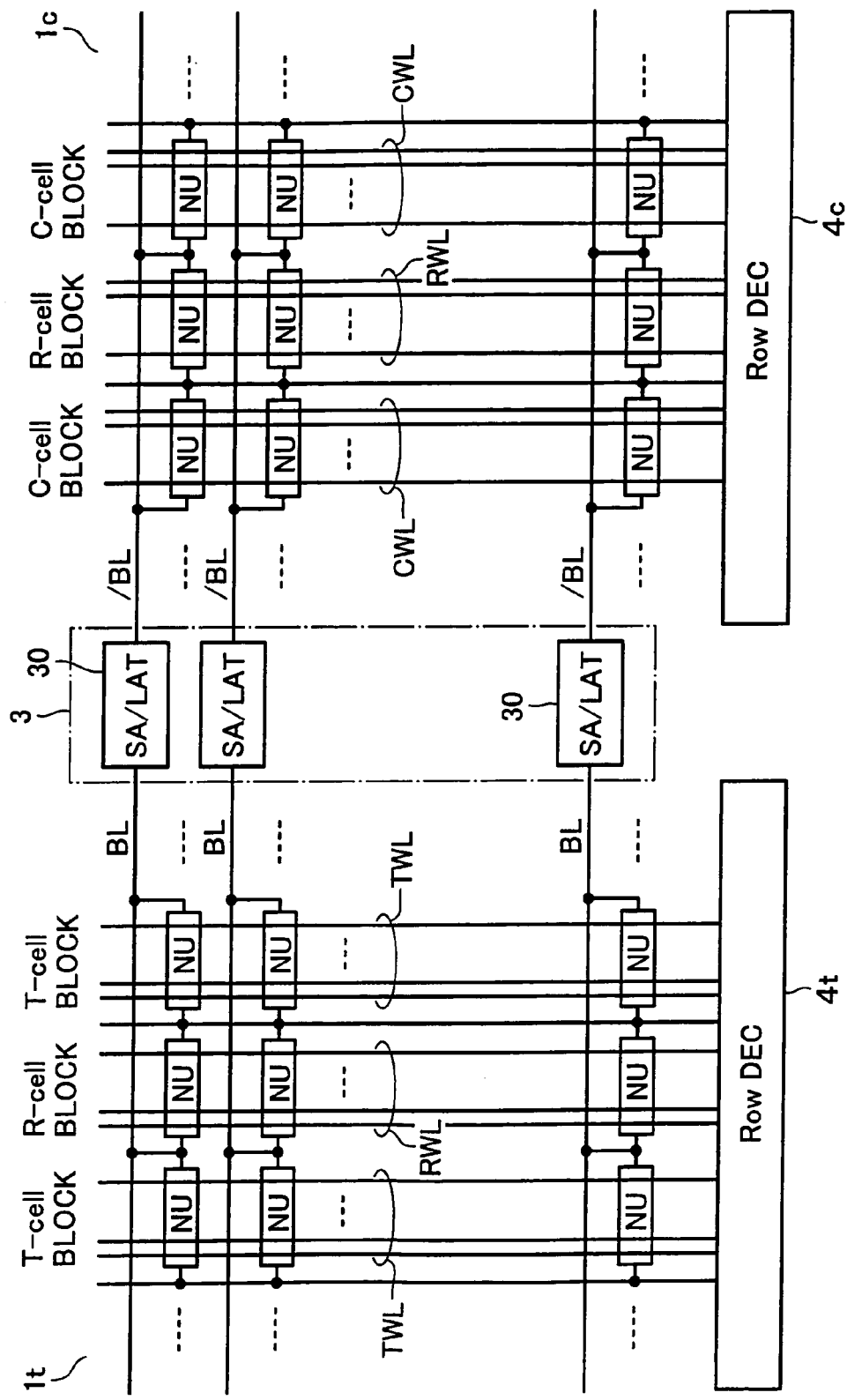
FIG. 2 shows the layout of the memory cell array and the sense amplifier circuit of the flash memory.
Figure 3:
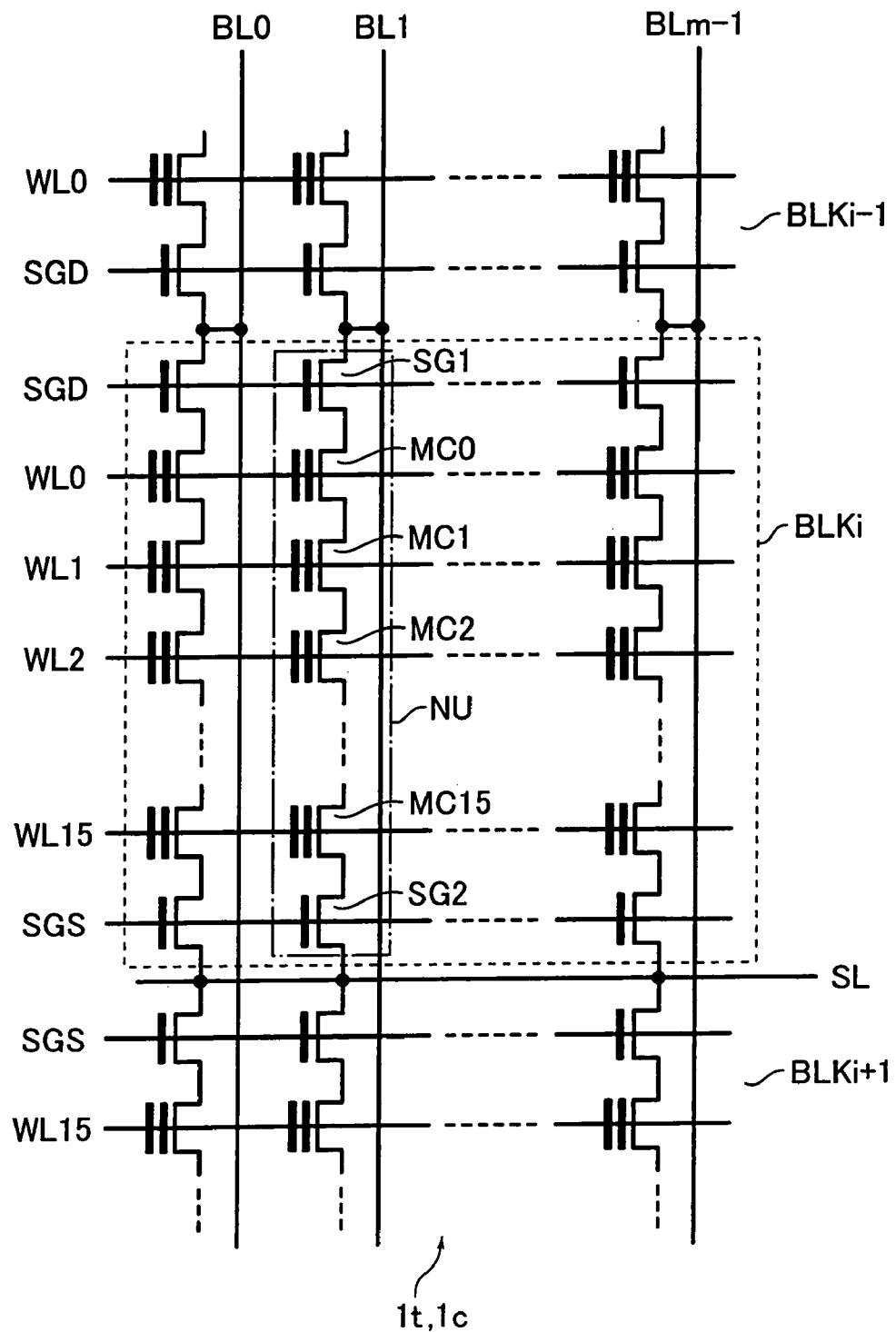
FIG. 3 shows an equivalent circuit of the memory cell array.

FIGS. 2 and 3 show a detailed internal configuration of the cell arrays 1t and 1c. As shown in FIG. 2, each of the cell arrays 1t and 1c is formed of a plurality of NAND cell units (i.e., NAND strings), NU, arranged in a matrix manner. Each NAND string NU has, as shown in FIG. 3, a plurality of, sixteen in the example shown in the drawing, electrically rewritable and non-volatile semiconductor memory cells, MC0-MC15, connected in series. Each memory cell is a MOS transistor with a stacked gate structure of a floating gate and a control gate, which stores data in accordance with the carrier storage state of the floating gate in a non-volatile manner.

One end of a NAND string NU is coupled to a bit line BL via a select gate transistor SG1; and the other end to a common source line SL via another select transistor SG2.

Control gates of the memory cells are coupled to different word lines WL0-WL15. Gates of the select gate transistors SG1 and SG2 are coupled to select gate lines SGD and SGS, respectively, which are disposed in parallel with the word lines. A set of NAND strings sharing the word lines WL0-WL15 constitutes a "block" serving as a unit of data erase. Usually, there are prepared plural blocks (BLKi−1, BLKi, BLKi+1,) in the direction of the bit line BL.

As shown in FIG. 2, each one selected in blocks arranged in each of cell arrays 1t and 1c is set as a reference cell (R-cell) NAND block; and the remaining blocks as information cell (T-cell, C-cell) NAND blocks. It being optional which NAND block is used as a reference cell-use block, once a reference cell-use block is selected, it should be used fixedly as the reference cell-use block hereinafter.

The row decoders 4t and 4c select blocks as follows: when one of the information cell NAND blocks, T-cell block, is selected in the cell array 1t, a reference cell NAND block, R-cell block, is selected simultaneously in the cell array 1c; and when one of the information cell NAND blocks, C-cell block, is selected in the cell array 1c, a reference cell NAND block, R-cell block, is selected simultaneously in the cell array 1t.

Suppose that, for example, the uppermost bit "0" and "1" of the block address are assigned to the cell arrays 1t and 1c, respectively. Further, the row decoders 4t and 4c are configured to have such a selection mode that in case of the uppermost bit="0", the reference cell-use block on the cell array 1c side is selected while in case of the uppermost bit="1", the reference cell-use block on the cell array it side is selected.

With respect to address in a block, i.e., address portion for selecting word lines in a block, it may be dealt with that the same address is assigned to the information cell-use block and the reference cell-use block. With this address assignment, it is possible to select a word line TWL (or CWL) and a corresponding reference word line RWL in the information cell-use block and the reference cell-use block, respectively.

Figure 4:
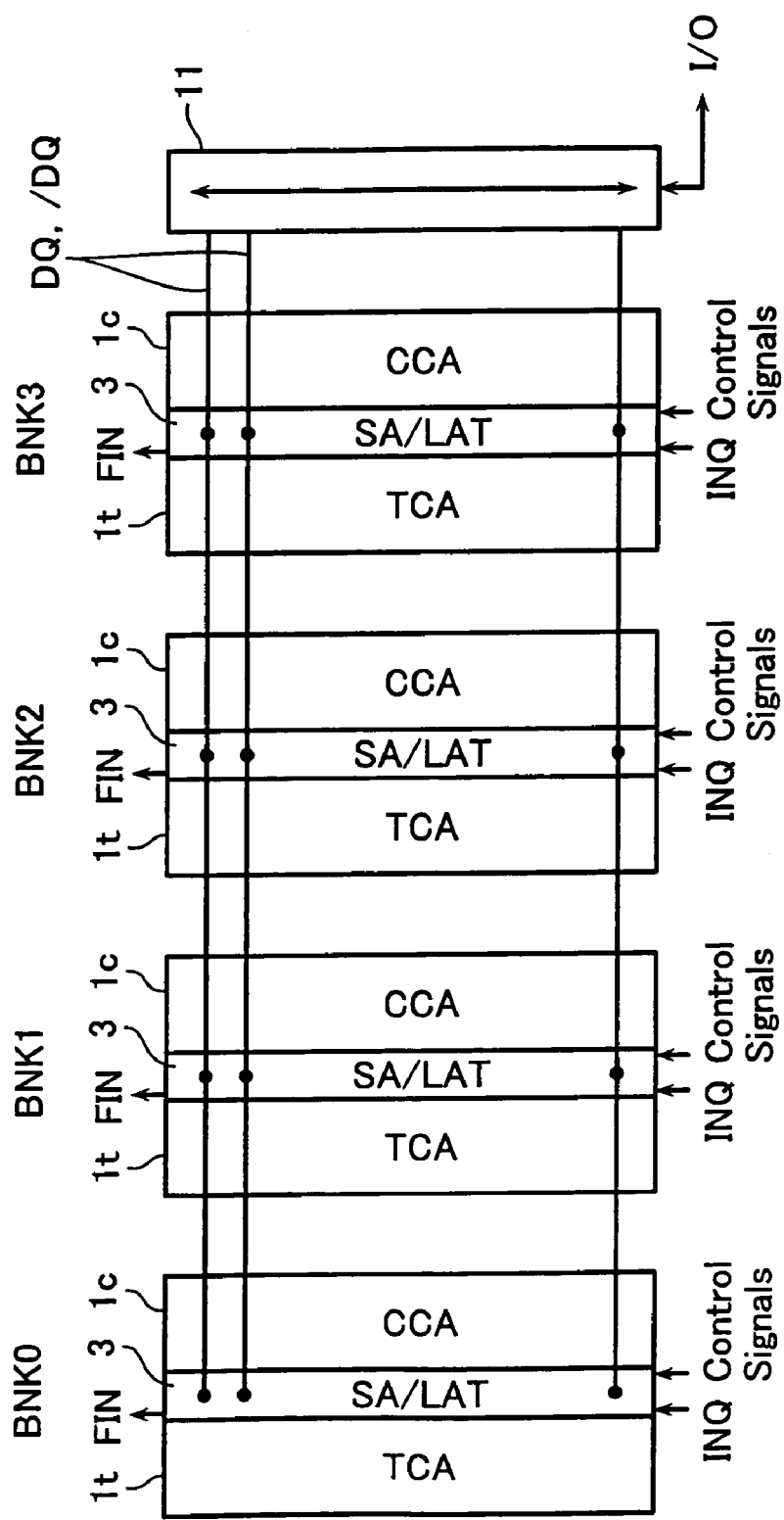
FIG. 4 shows the layout of the plural banks.

FIG. 1 shows only one sense amplifier circuit serving as a page buffer and two cell arrays 1t and 1c sharing it. In a practical memory chip, as shown in FIG. 4, one sense amplifier circuit 3 for reading one page data and two cell arrays 1t and 1c sharing it constitute a unit serving as a "page bank", and a plurality of page banks, four page banks BNK0-BNK3 in the example shown in FIG. 4, are arranged as sharing data lines DQ and /DQ. With this arrangement, it becomes possible to do an interleave operation among the page banks, thereby being possible to do continuous page access.

Figure 5:
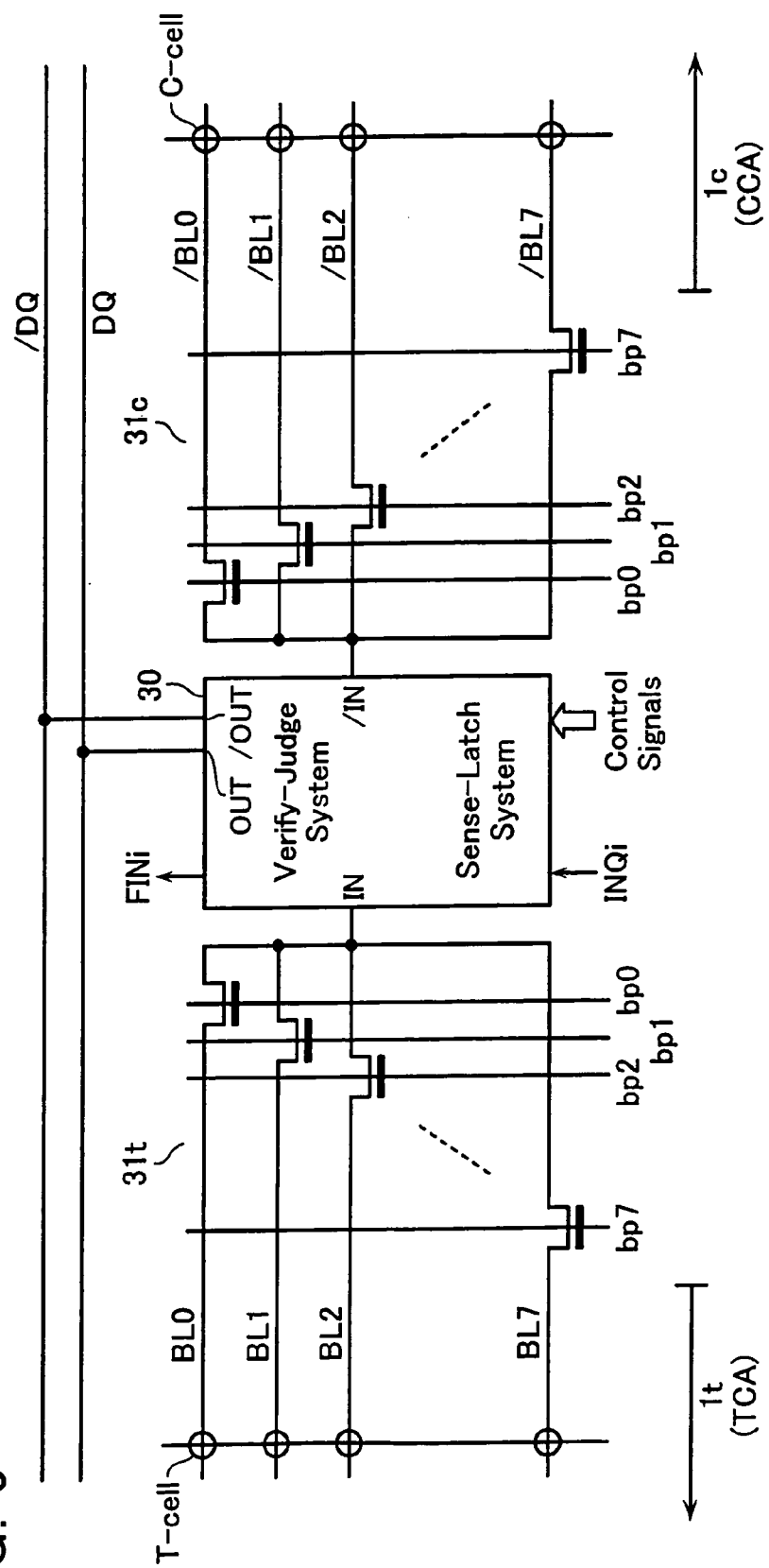
FIG. 5 shows the select circuit between the bit line pairs and the sense amplifier units.

FIG. 5 shows a sense unit 30 and bit line select circuits 31t and 31c for selecting a bit line pair in the sense amplifier circuit 3. The sense unit 30 has, as described later, a sense-latch system for sensing and holding data and a verify-judge system for verifying data write or erase and judging the verified result.

The bit line select circuits 31t and 31c each selects one in eight bit lines BL0-BL7 in the cell arrays 1t and 1c, respectively, based on select signals bp0-bp7, and couples it to the sense unit 30. That is, the select circuits 31t and 31c select one of eight pairs of bit lines. Select signals bp0-bp7 constitute a part of a page address signal.

Various control signals are input to the sense unit 30. INQi and FINi are input and output signals, respectively, used for judging the verify result at data write or erase time. The sense-latch system is selectively connectable to the data lines DQ and /DQ, which serve as global data lines. The pair of data lines DQ, /DQ are, as shown in FIG. 4, disposed over the entire page banks, and serve for data-transferring between selected page banks.

With the input and output signals INQi and FINi used for judging the verify result, a verify-judging circuit is configured for each page bank with satisfying such a relationship that output signal FINi from a certain sense unit serves as input signal INQi+1 for the following sense unit. In a verify-write or verify-erase sequence, when data write or erase for a page bank has been finished in its entirety, the final output signal FIN(="H") is output as a pass flag.

Each pair of data lines DQ and /DQ is suitably selected in the data buffer 11, so that output data is transferred to terminals I/O of the memory chip, and if necessary bit width conversion may be performed in the data buffer 11.

Figure 6:
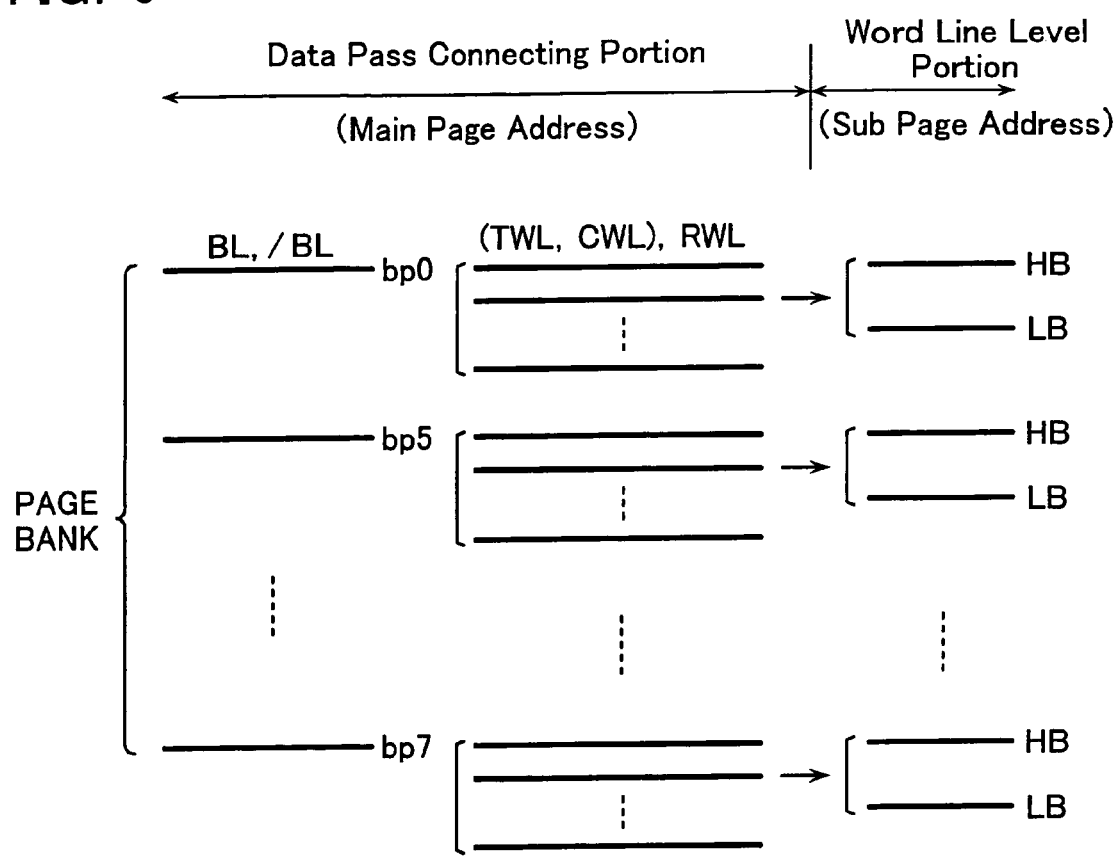
FIG. 6 shows the page address structure.

Each of erase-verify, write and read is performed in a lump for the entire memory cells in each page in a page bank. An address structure for page-selecting as described above is shown schematically in FIG. 6.

Address includes a data pass connecting portion for defining what information cell is to be connected to a sense unit and a word line level portion for defining how to set the level of a selected pair of word lines. The data pass connecting portion is a main page address for selecting pairs of bit lines BL, /BL, the number of which corresponds to that of sense units in a page bank, and a pair of word lines TWL (or CWL) and RWL. A set of memory information cells simultaneously selected with the main address constitutes one page serving as a unit of data write and read.

The word line level portion is a sub-page address set in the main page address in case of multi-value data storage scheme. This sub-page address selects one of the level combinations between the word lines TWL (or CWL) and RWL, thereby designating bit information of the multi-value data. In detail, in this embodiment, in which a four-value data storage scheme is used, the sub-page address designates two-bit data of a higher page (higher bit) HB and a lower page (lower bit) LB.

Page data is accessed in a lump. It should be determined in accordance with the application system of the memory whether bit data of a page are transferred as multi-bit data as it is or subjected to random accessing. Another page bank being accessed during page data is transferred, it becomes possible to execute a bank interleave operation, so that continuous data transferring may be performed without interrupting.

Since, in case of four-value data write, the history of level setting the four-value data is indispensable, there is such a restriction with respect to the order for selecting sub-page address in the main page address that the higher page write should be performed in advance of the lower page. So long as this restriction is kept, there is no need of continuously programming the higher bit and the lower bit, and it is possible to interpose a read operation between the higher bit write and the lower bit write.

With respect to data read, there are two cases as follows: one case where there is a restriction of sub-page selection order; and another case where sub-pages are read out optionally, i.e., independently of each other. Preferably, it is used such a data bit assignment that sub-pages are read out independently of each other.

[Principle of the Four-value Data Storage]

Figure 7:
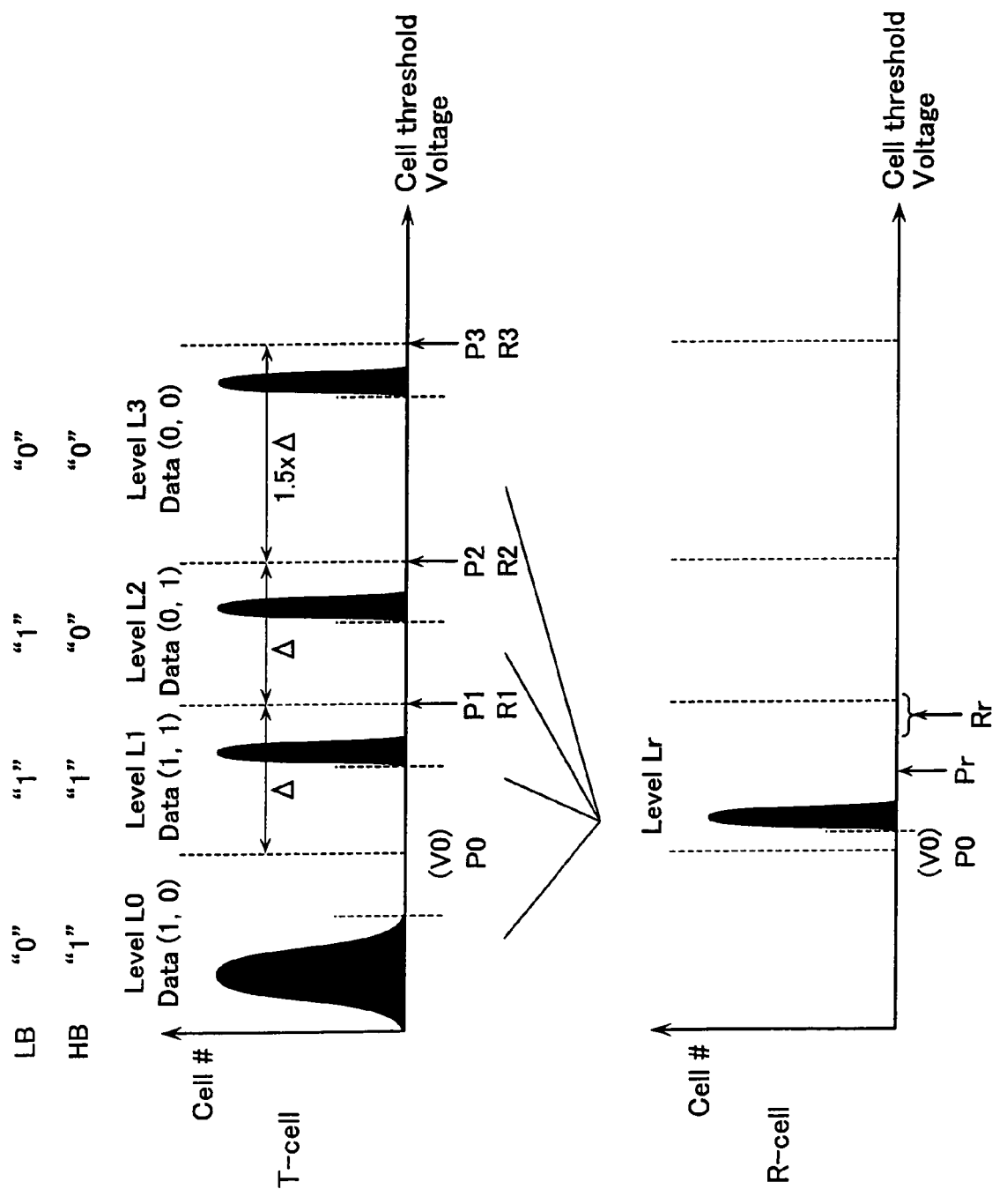
FIG. 7 shows data levels and data bit assignment of four-value data in accordance with the embodiment in association with T-cell and R-cell.
Figure 8:
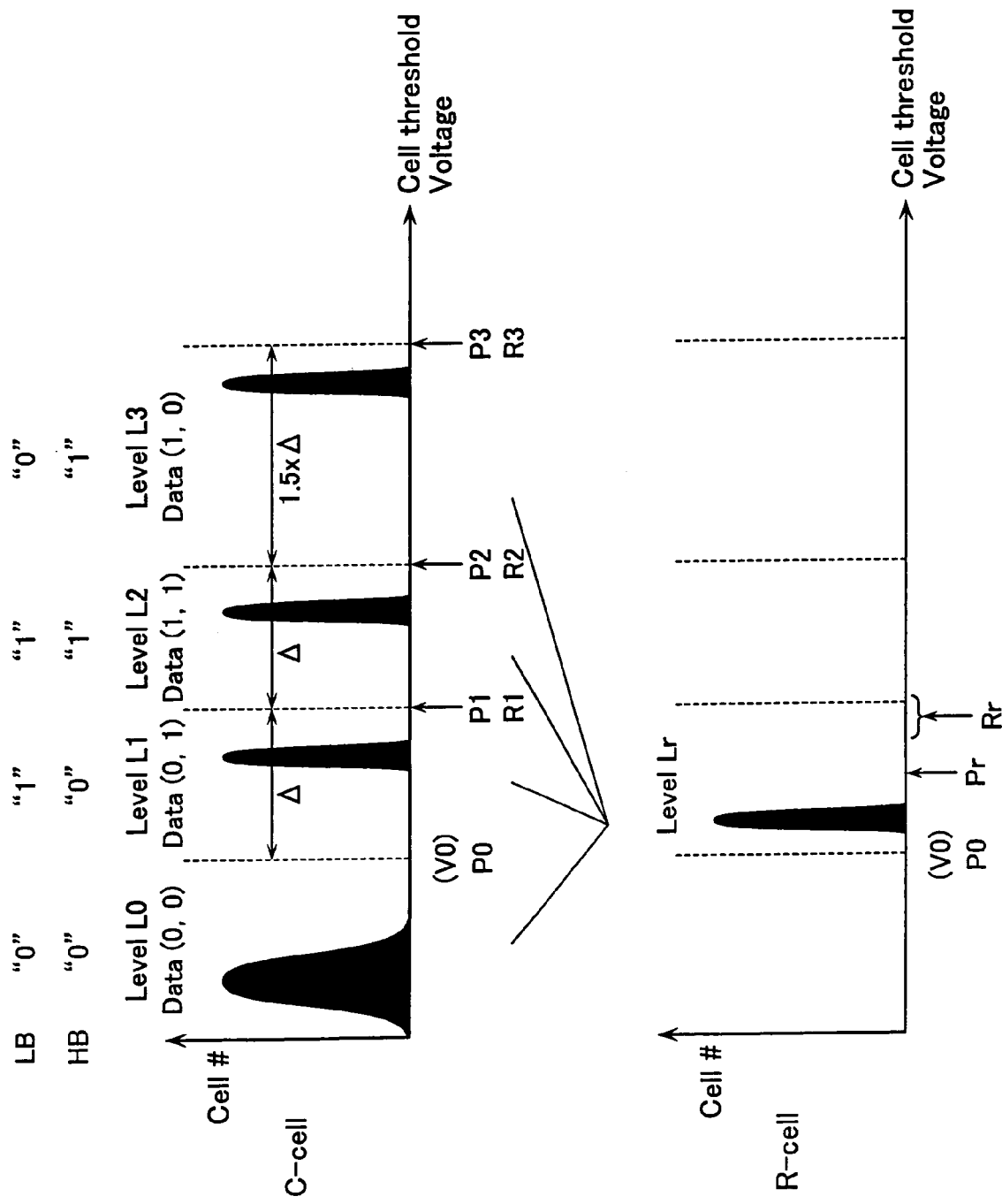
FIG. 8 shows data levels and data bit assignment of four-value data in accordance with the embodiment in association with C-cell and R-cell.

FIGS. 7 and 8 show data levels, i.e., threshold distributions of the four-value data and data bit assignments thereof in accordance with this embodiment.

Each of the information cells, T-cell and C-cell, is set at one of four data levels (i.e., threshold levels) L0, L1, L2 and L3 (where, L0<L1<L2<L3). L0 is a negative and erased threshold level defined by erase-verify voltage P0 (=0V); and L1, L2 and L3 are positive and written threshold levels defined by verify voltages P1(=P0+Δ), P2(=P0+2Δ) and P3(=P0+3.5Δ), which are applied to a selected word line at write-verify times, respectively.

With the above-described verify voltages P1, P2 and P3, the write data levels L1, L2 and L3 are set to satisfy the relationship of: L1=L2−L1<L3−L2. In other words, the gap between the uppermost data level L3 and the following level L2 is set to be larger than others.

The reference cell R-cell also is set at the same negative threshold state as the data level L0 in an erase state. Reference level Lr is set in a positive threshold range lower than the secondary data level L1 of the information cell T-cell or C-cell as defined by write-verify voltage Pr(<P1).

As the reference level Lr, it is permissible in principle to use whichever voltage except the erase level L0. However, in consideration of the reference word line level setting and write time of the reference cell, it is desirable to set the reference level Lr to be low. The reason is as follows: as the cell array becomes large in capacity and the time constant of the word line becomes large, it takes a long time for setting the word line to be high in its entirety. The reference level Lr being set to be near the lower one of data levels, it is able to make the write time of the reference cell short.

Considering the above-described situation, as shown in FIGS. 7 and 8, the reference level Lr is set to satisfy the relationship of: L0<Lr<L1, and in detail, for example, set to be about ½ of the level L1.

Supposing that the four-value data is defined as (HB,LB) (where, HB and LB are a higher (or upper) bit and a lower bit, respectively), as shown in FIG. 7, (1,0), (1,1), (0,1) and (0,0) are assigned to the data levels L0, L1, L2 and L3 of the information cell T-cell, respectively. In the C-cell array, as shown in FIG. 8, the higher bit HB is reversed in logic to that in the T-cell array. This four-value data may be judged in such a way as to detect cell current difference between an information cell T-cell (or C-cell) and a reference cell R-cell on a certain bias condition with a sense amplifier.

As described above, levels L1, L2, L3 and Lr are defined by the verify voltages P1, P2, P3 and Pr, respectively, and threshold distributions thereof have, as shown by dotted lines, the lowest values, respectively. The reason is, as described in detail later, as follows: a selected information cell's current, which flows when the verify voltage is applied, is compared with a reference cell current, and "write" completion is judged based on that the information cell's current has been detected to be smaller than the reference cell current.

By contrast, the erase data level L0 has the upper limit value as shown by a dotted line. The reason is as follows: at an erase-verify time, with applying P0=0V to the entire word lines in a NAND cell unit, which has been erased in a lump, the cell unit's current is compared with a reference current, and "erase" completion is judged based on that the cell unit's current has been detected to be larger than the reference current.

In FIGS. 7 and 8, voltages (read voltages) R1, R2, R3 and Rr applied to a selected word line TWL (or CWL) and a reference word line RWL are shown. The read operation with the read voltages will be explained in detail later. The read voltage Rr applied to the reference cell R-cell is set to have a suitable value in accordance with read steps.

Figure 9:
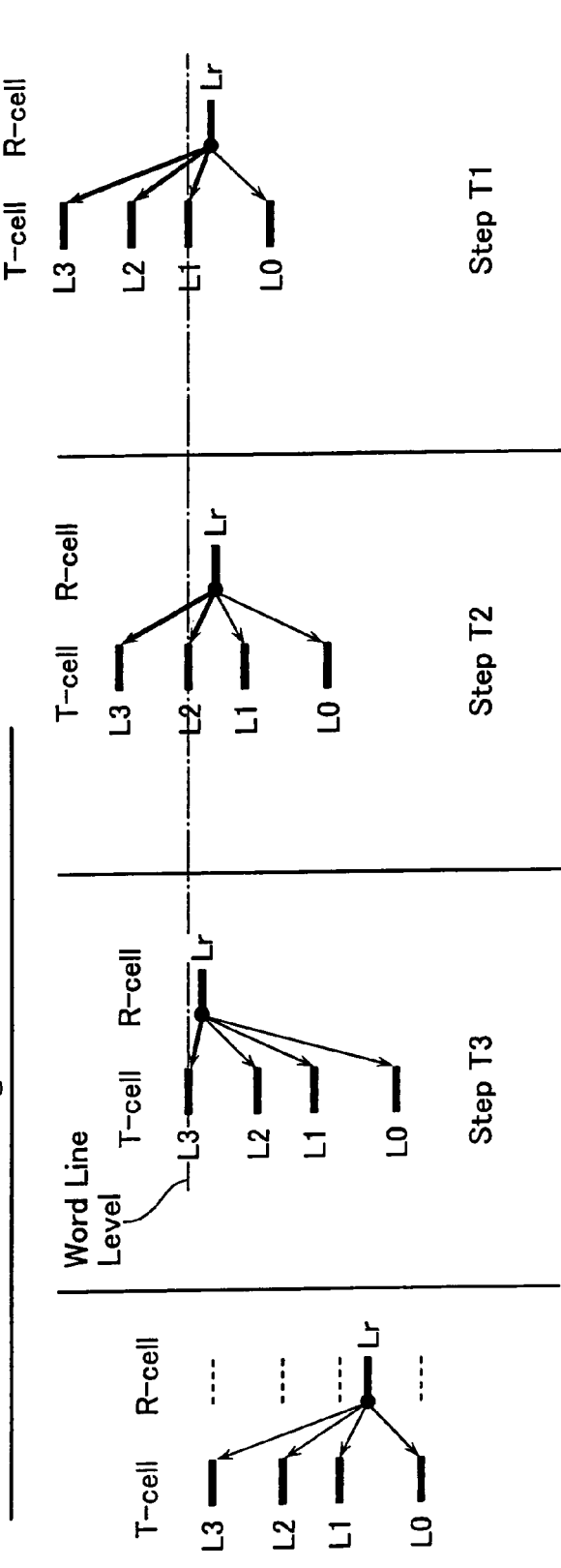
FIG. 9 is a diagram for explaining the data read principle with reference to level relationships between T-cell and R-cell.
Figure 9:
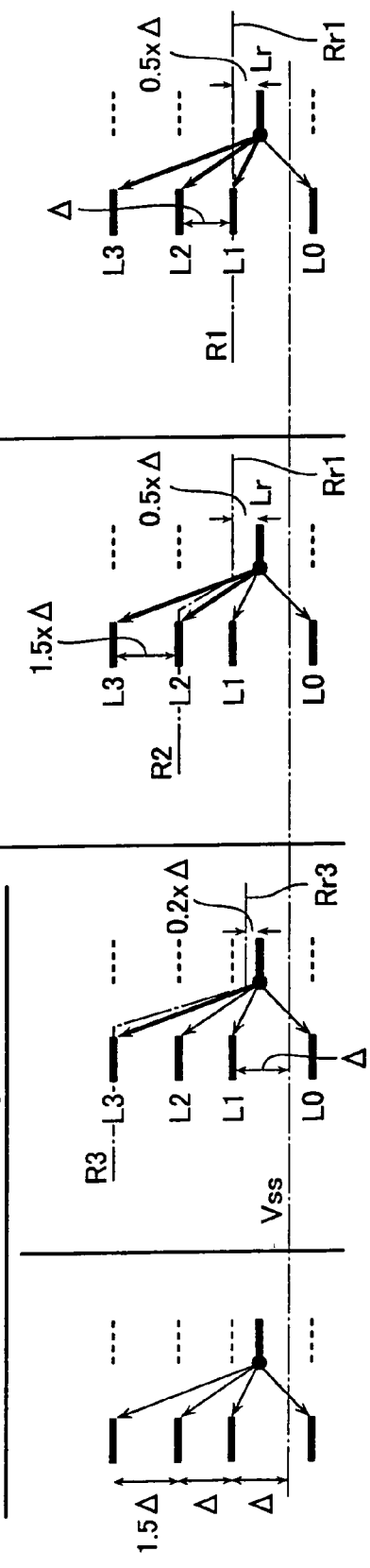

FIG. 9 shows, with giving attention to the information cell T-cell and reference cell R-cell, data level relationships at three read steps T1, T2 and T3 used for reading the four-value data. The upper column in FIG. 9 shows that the four-value data may be judged with applying relative biases to levels of T-cell and R-cell on the assumption that read voltages (i.e., word line levels) applied to a selected word line TWL and a reference word line RWL is kept constant through the three read steps.

By contrast, the lower column in FIG. 9 shows that the four-value data may be judged in such a practical manner as to switch the word line levels with reference to Vss through the three read steps.

Note here that FIG. 9 shows data levels L0, L1, L2, L3 and Lr with paying no attention to the practical threshold distribution widths thereof, and that read voltages R1, R2 and R3 equal to data levels L1, L2 and L3, respectively, are applied at the read steps T1, T2 and T3, respectively. The read voltages R1, R2 and R3 used in practice for the data levels L1, L2 and L3 are, as shown in FIGS. 7 and 8, set to be equal to the verify voltages P1, P2 and P3, respectively (i.e., the uppermost values of the data threshold distributions or slightly higher than those). On the other hand, the read voltage Rr applied to the reference cell is set to be 0.2Δ to 0.5Δ higher than the reference cell's level Lr (i.e., verify level Pr).

At the read step T1, read voltage R1 substantially equal to data level L1 is applied to the word line of the information cell T-cell while reference read voltage Rr=Rr1 higher than the reference level Lr is applied to the word line of the reference cell R-cell. At this time, if the information cell T-cell is in level L1, L2 or L3, cell current thereof is smaller than that of the reference cell R-cell, so that its state will be sensed as data "0". In other words, it is detected at this step whether the information cell is in level L0 or in one of levels L1-L3.

At the read step T2, read voltage R2 substantially equal to data level L2 is applied to the word line of the information cell T-cell while reference read voltage Rr, which is the same as in the step T1, is applied to the word line of the reference cell R-cell. At this time, if the information cell T-cell is in level L2 or L3, cell current thereof is smaller than that of the reference cell R-cell, so that its state will be sensed as data "0". By contrast, if the information cell T-cell is in level L0 or L1, cell current thereof is larger than that of the reference cell, so that its state will be sensed as data "1". Therefore, it is distinguished at this step whether the information cell is in level (L0 or L1) or level (L2 or L3).

At the read step T3, read voltage R3 substantially equal to data level L3 is applied to the word line of the information cell T-cell while reference read voltage Rr=Rr3(<Rr1) is applied to the word line of the reference cell R-cell. At this time, if the information cell T-cell is in level L3, cell current thereof is smaller than that of the reference cell R-cell, so that its state will be sensed as data "0"; and other states as data "1". Therefore, it is distinguished at this step whether the information cell is in level (L0, L1 or L2) or level L3.

Note here that the gaps between ground level Vss and data level L1, and between data levels L1 and L2 are set to be Δ while the gap between data levels L2 and L3 is set to be larger than it as being 1.5Δ. This is based on the following reason. In this embodiment, as described later, to perform read operations with reducing the influence of the word line delay, such a word line driving method is used that voltage to be applied to a word line is boosted to be higher than a desired level at the beginning, and then stepped down. This is for the purpose of substantially making the rise time of the word line short. In case of adapting such the word line drive method, to certainly distinguish between the uppermost data levels L3 and the following level L2, and sense the former as data "0"; and the latter as "1", it is preferable to set the gap between these data levels to be larger than the others.

Further, in this embodiment, the read voltage Rr of the reference cell is preferably changed in accordance with read steps. This also is, considering the time constant of the word line delay, for setting suitable reference levels in accordance with the read steps. The detail will be explained later.

Figure 10:
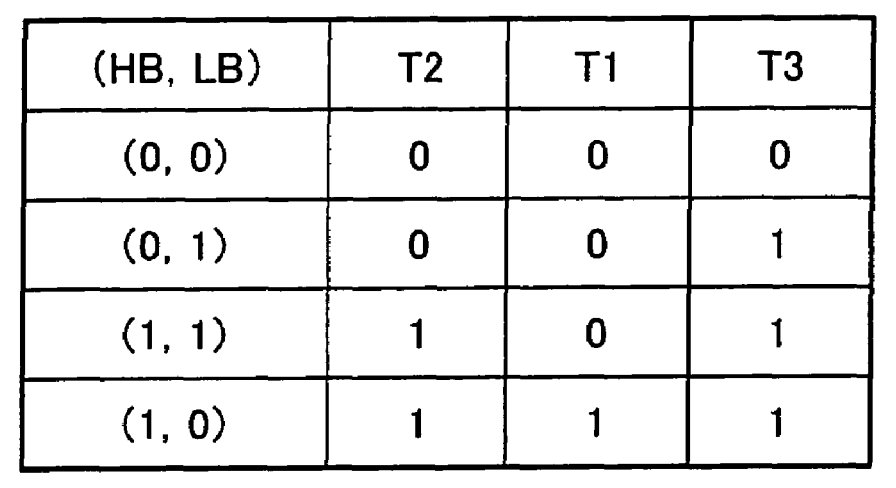

FIG. 10 shows that it may be distinguished between four-value data (1,1), (1,0), (0,1) and (0,0) defined in FIGS. 7 and 8. In order to read the upper bit dada HB and the lower bit data LB independently from each other, it may be used the number of "1" data as described as follows.

Read data obtained at the read step T2 is identical with the upper bit data HB as it is. On the other hand, the lower bit data LB is defined by even/odd of the number of "1" data obtained through the read steps T1 and T3. That is, when the number of "1" data is one, LB="1", while when the number of "1" is zero or two, LB="0".

As described above, the upper bit data HB may be defined based on only the read step T2; and the lower bit data LB may be defined independently of the upper bit data HB with judging whether the number of "1" data gotten through the read steps T1 and T3 is even or odd.

With respect to the information cell C-cell, data of each read step are reversed in logic to those shown in FIG. 10. However, the bit assignment between the upper bit data HB and cell levels also revered to that in case of T-cell, so that the even/odd property of the number of "1" data explained in case of T-cell may be used as it is in case of C-cell.

Figure 11:
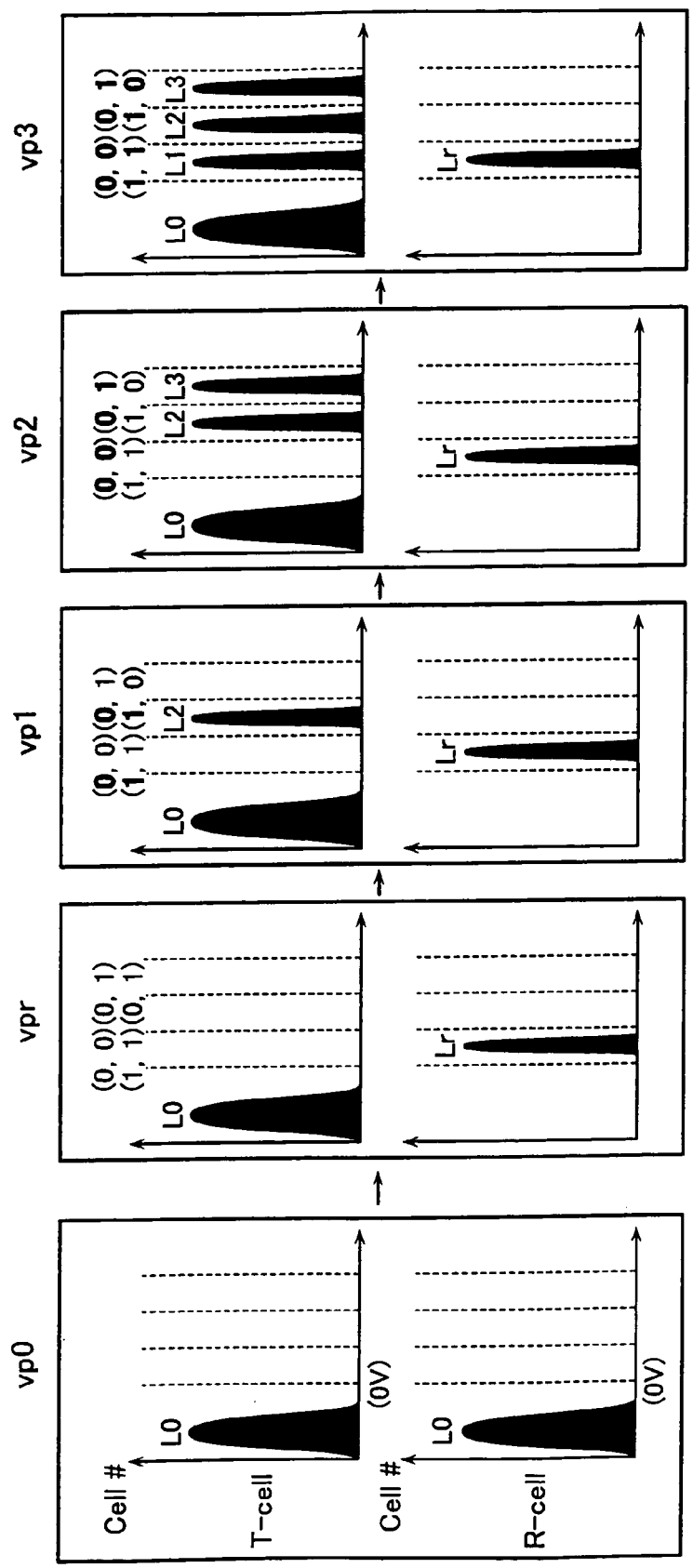
FIG. 11 is a diagram for explaining the write steps of the four-value data.

FIG. 11 shows, giving attention to one of information cell T-cell and the reference cell R-cell, erase and write sequences. Erase and write sequences for the other information is cell C-cell are performed as similar to it.

"vp0" is a verify-erase step, in which the entire cells in both of the information cell block and the reference cell block are set to have the lowest erase threshold level L0. The word line level used at the erase-verify time is TWL=CWL=Vss(=0V).

Verify-write steps "vpr" and "vp1-vp3" are for supplying write data "0" and "1" and transforming them to cell levels, thereby successively writing the reference cell R-cell and information cell T-cell (or C-cell) with the erased threshold voltage distributions.

In the verify-write step vpr of the reference cell, the threshold voltage of the reference cell R-cell is increased to level Lr. In this step, it is in need of successively selecting the reference word lines in each reference cell block selected in the T-cell array 1t and C-cell array 1c, thereby writing the threshold level Lr into the entire reference cells.

In the following verify-write step vp1, cell threshold voltage(s) of a part of the information cells T-cell and C-cell is increased to the write level L2 from the erase state L0.

In the following verify-write step vp2, cell threshold voltage(s) of a part of the information cells T-cell and C-cell, into which level L2 has been written, is increased to the write level L3 in accordance with the higher bit HB and the lower bit LB. In the next verify-write step vp3, cell threshold voltage(s) of a part of the information cells T-cell and C-cell, which are in the erase level L0, is increased to the write level L1 in accordance with the higher bit HB and the lower bit LB.

Note here that it is able to interpose a read mode(s) between the write steps vpr, vp1, vp2 and vp3. To restart the suspended write operation, it is often necessary for, for example, reading out the written data in the cell array or externally loading write data. With respect to the information cell C-cell, the upper bit HB is reversed to that of T-cell, but the write steps are the same as those of the T-cell.

Write-verify for verifying the write state in each write step will be performed with applying either one of different verify voltages Pr, P1, P2 and P3 to a selected word line in accordance with to-be-verified levels, and write completion will be judged with detecting that the cell current is in a certain range in comparison with the reference current. Therefore, as shown in FIGS. 7 and 8, written threshold distributions are positioned to be lower than the verify voltages Pr, P1-P3, respectively.

[Method of Driving Word Lines in a Read Mode]

In this embodiment, with respect to the word line driving, there is prepared a specific method for making possible to do high-speed data read in consideration of a word line delay.

The larger the cell array's capacitance, the larger the word line delay. Accordingly, due to this word line delay, when a word line is driven, a voltage change on a driver side end and that on another end far from it are greatly different from each other. A word line being driven as similar to the conventional case in spite of that the cell array capacitance is made large, it is in need of waiting data sense until the word line end reaches a desired level, thereby becoming impossible to do high-speed data read.

In this embodiment, there is provided a measure against the word line delay, in which the data level of the reference cell, Lr, (i.e., reference level) is set to be lower than the lowest write data level L1. This makes the time taken for reading data of the reference cell, which is necessary for data read, short, in other words, the rising time of the reference read voltage Rr applied to a reference word line may be shortened. Further, it is also possible to make the write time of the reference level Lr short.

In this embodiment, each of the word line select/drive circuits has at least two driving modes with respect to driving plural word lines simultaneously selected at a data read time and applied with different word line voltages as follows: a first driving mode for applying a first voltage necessary for data-sensing to a first word line from the beginning; and a second driving mode for applying a third voltage higher than a second voltage necessary for data-sensing to a second word line, and then restoring the third voltage to the second voltage.

Especially, with respect to two steps, i.e., the lower bit read steps T1 and T3, which are successively executed, it will be taken into consideration that the word line levels are set at desirable levels, respectively, in a short time.

Further, in order to obtain a high word line voltage, it is used such a method that once the word line voltage is increased to overshoot a desired level for accelerating the voltage rising at the word line end, and then it is restored to the desired level. By contrast, in case of stepping down the word line voltage, it is once reduced to undershoot a desired level, and then restored to the desired level.

Voltage waveforms of the word line driving voltages, which are generated from the row decoders 4t and 4c, will be explained in detail below.

Figure 12:
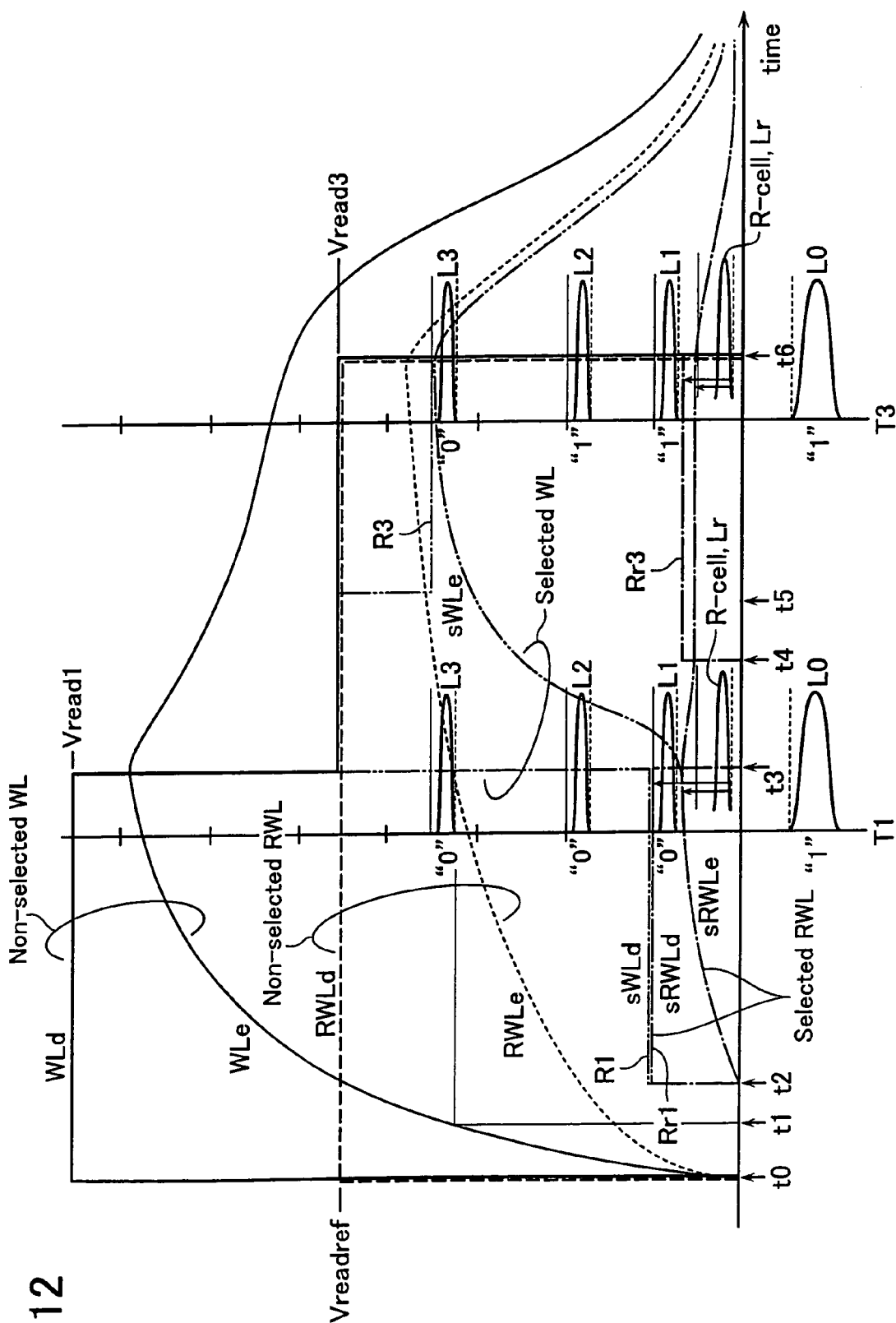
FIG. 12 shows the word line voltage waveforms at the lower bit read time.

FIG. 12 shows voltage waveforms in case of generating word line voltages required in the lower bit read steps T1 and T3. When a word line WL (TWL or CWL) and a reference word line RWL are selected at a read time, the remaining non-selected word lines in the NAND cell unit are applied with read pass voltage Vread which turns on cells without regard to cell's data.

In FIG. 12, a selected word line and a non-selected word line are shown by sWL and WL, respectively; and a selected reference word line and a non-selected reference word line by sRWL and RWL, respectively. Suffix "d" added to these word line's reference symbols means a driver side end of the word line; and suffix "e" means the other end far from the driver. The steps T1 and T3 in FIG. 12 show sense timings (i.e., sense amplifier activation timings) on the time scale of the word line voltage, and data levels L0-L3 and Lr are shown with the same scale as the word line voltage.

Figure 13:
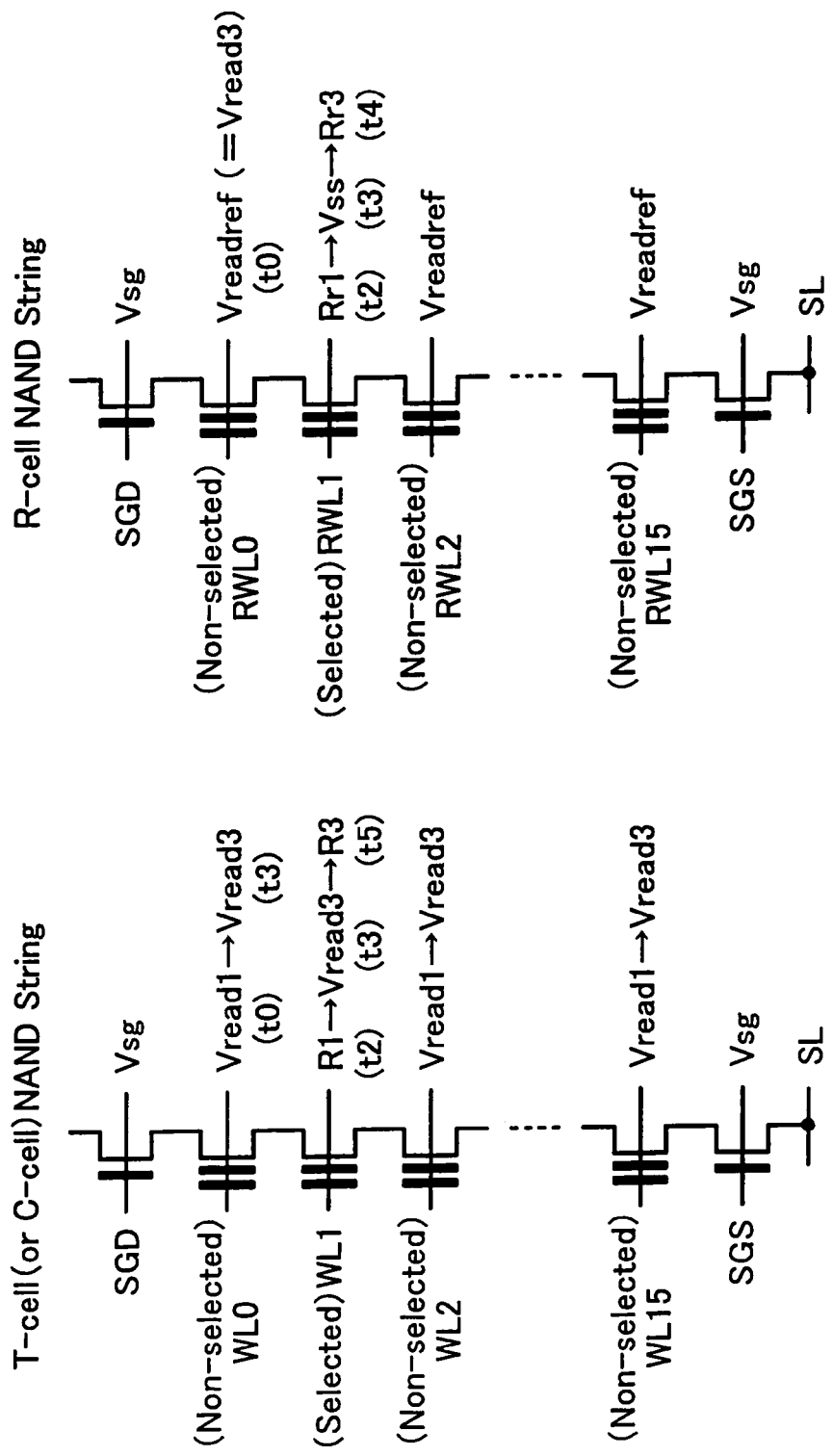
FIG. 13 shows the bias relationships of T-cell and R-cell at the lower bit read time.

FIG. 13 shows bias relationships in a case where word line WL1 and RWL1 are selected in word lines WL0-15 and reference word lines RWL0-15 in a T-cell (or C-cell) NAND string and an R-cell NAND string, respectively, which are simultaneously selected. Voltage Vsg applied to the select gate lines SGD and SGS is one, which is necessary for turning on the select gate transistors and preferably boosted higher than the power supply voltage.

Each of the word line voltage waveforms will be explained in detail below.

Non-selected Word Line WL:

Supposing that the pass voltage to be applied to non-selected word line is Vread3, which is necessary for turning on the cell with data of the uppermost level L3, pass voltage Vread1 is generated at the beginning of the word line drive, which is set to be higher than Vread3 in such a range that erroneous electron injection is negligible (timing t0).

As a result, the non-selected word line, even if it is the end WLe thereof, will rise up to the uppermost level L3 at an early timing t1 from the beginning of the word line drive. At the read step T1, this pass voltage Vread1 is used as it is.

The pass voltage driven once to a high level, Vread1, is stepped down to the pass voltage Vread3, which is necessary for sufficiently turning on the cell with the uppermost level L3 prior to the read step T3 (timing t3).

With this non-selected word line driving, the entire non-selected cells are certainly turned on at an early timing, and it may be avoided such a situation that the selected cell's current is limited by the non-selected cells. Cells with data level L3 having turned on at the read step T3, it is permitted to reduce that the non-selected word line level to Vread3, which is necessary and the lowest level.

Selected Word Line sWL:

To cancel the previous history of the selected word line sWL, it is set to be Vss. Then, after timing t1, the selected word line is raised up to the read voltage R1 necessary in the read step T1 (timing t2).

It is in need of using the read voltage R3 higher than R1 at the read step T3. Therefore, after the read step T1, the selected word line is raised up once to a voltage higher than the necessary read voltage R3, for example, Vread3 (timing t3), and then stepped down to the read voltage R3 required in the step T3 (timing t5). After the read step T3, the whole word lines are reset to be Vss (timing t6), and then set to be floating.

As described above, to obtain the high read voltage R3 necessary in the read step T3, as similar to the case of the read pass voltage, the word line is once driven to a level higher than the necessary one, and then stepped down. With this word line driving scheme, even if at the selected word line end, sWLe, the necessary read voltage R3 may be obtained in a short time.

Selected Reference Word Line sRWL:

With respect to the selected reference word line sRWL selected at the same time as the selected word line sWL, it will be used effectively such a situation that only level L0 is sensed as "1" at the step T1; and only level R3 is sensed as "0" at the step T3. That is, in order to certainly sense the level L1 or higher as "0" at the read step T1 (in detail, to prevent the level L1 from being erroneously sensed as "1"), the reference read voltage Rr applied to the selected reference word line sRWL is set to be higher one Rr=Rr1 (timing t2).

This reference read voltage Rr1 is once reset to be Vss after the step T1 (timing t3). in order to certainly sense the level L2 or lower as "1" at the read step T3 (in detail, to prevent the level L2 from being erroneously sensed as "0"), the reference read voltage Rr is set to be lower one Rr=Rr3 (timing t4). It is effective for generating the lower reference voltage Rr3 necessary in the step T3 in a short time even if at the word line end sRWLe that the reference voltage is once stepped down to be Vss at timing t3.

As described above, the reference voltage Rr is set to be lower than the lowest data level L1. As a result, it may be obtained such an advantageous effect that the rise time of the reference voltage Rr is shortened; and the write time of the reference level Lr shortened.

Non-Selected Reference Word Line RWL:

The entire cells in the reference NAND string are written into the low reference level Lr as being deferent from the T-cell or C-cell NAND string. Therefore, with respect to the non-selected reference word lines RWL, a fixed pass voltage Vreadref will be applied through the read steps T1 and T3. For example, the pass voltage Vreadref is set at the same level as the read voltage Vread3. As a result, the non-selected reference word line RWL is, even if it is the word line end RWLe, set at the read pass voltage Vreadref at timing of the read step T1.

With the above-described word line driving method, the read steps T1 and T3 may be set at early timings from the beginning of the word line driving so that the word line levels necessary for data sensing at each read step may be set. Therefore, it becomes possible to substantially reduce the influence of the word line delay, thereby performing a high speed data read.

In FIG. 12, the difference between the word line level of the driver side end sRWLd of the selected reference word line sRWL and the reference level Lr, and the reference between the word line level of the terminal end sRWLe thereof and the reference level Lr are shown by arrows. Comparing the respective cell levels L0-L3 with the selected word line level, "0" or "1" of each cell level will be understood.

Although it is assumed here that each of data levels L0-L3, Lr of the cell at the driver side end of the word line is identical with that at the terminal end thereof, cell data level is varied practically dependent on the position of the word line because word line level varies dependent on the position on the word line, and it affects cell current difference.

Figure 14:
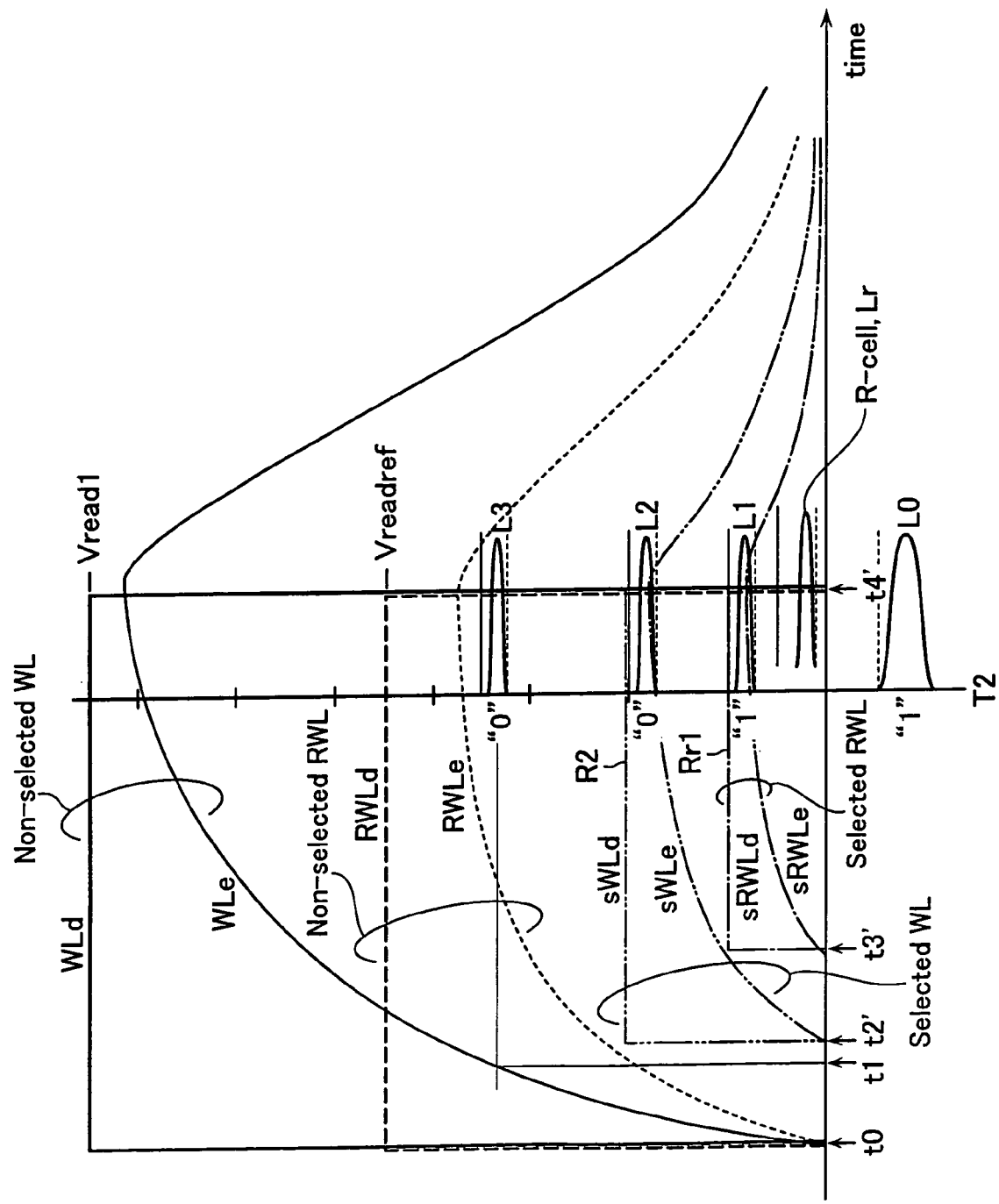
FIG. 14 shows the word line voltage waveforms at the higher bit read time.
Figure 15:
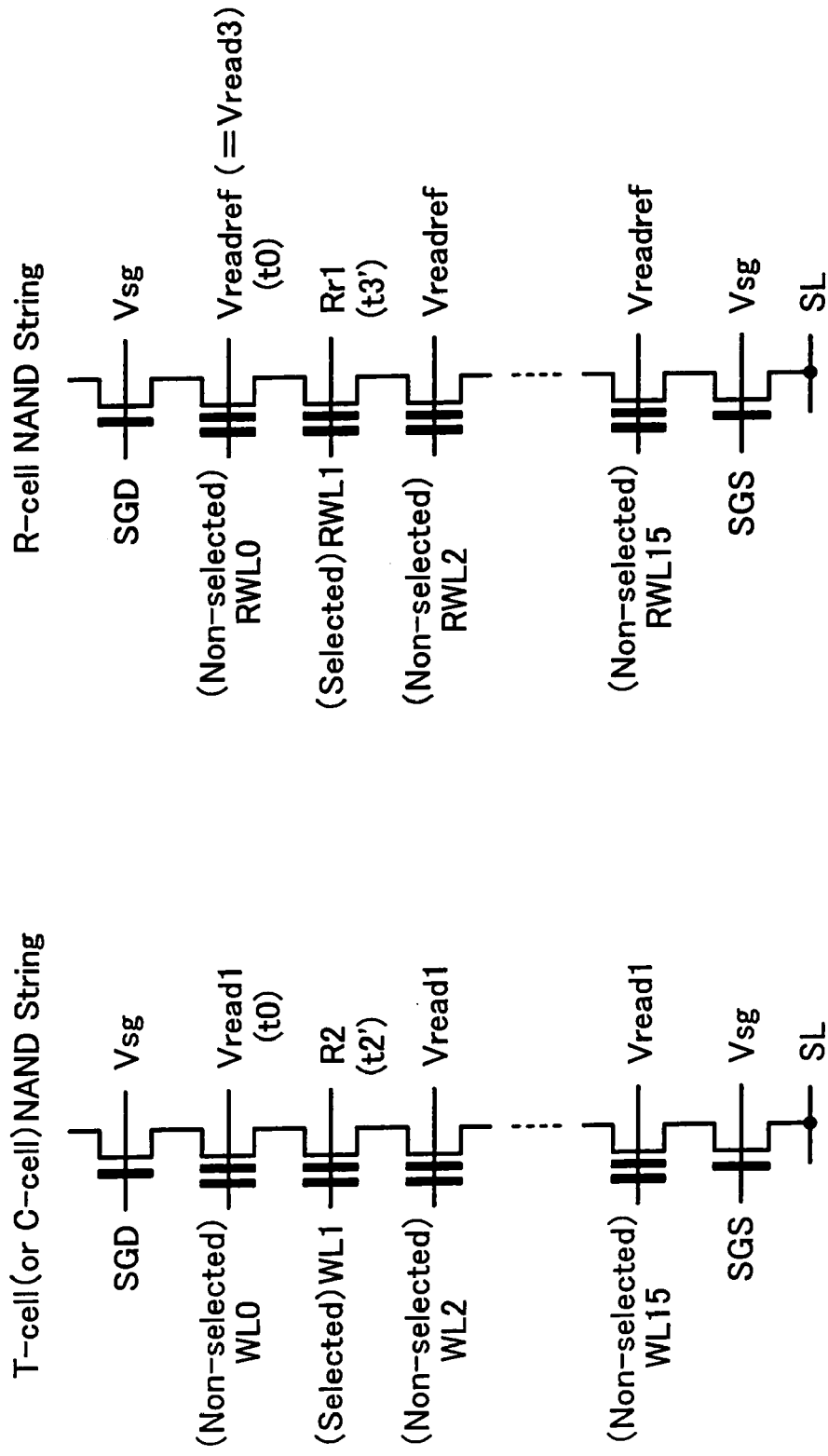
FIG. 15 shows the bias relationships of T-cell and R-cell at the higher bit read time.

FIG. 14 shows word line voltage waveforms used for the upper bit read step T2 in correspondence with those shown in FIG. 12. FIG. 15 shows the bias relationship in the NAND string at the read step T2 in correspondence with that shown in FIG. 13.

The upper bit read is performed once at the read step T2. Except that the read voltage applied to the selected word line sWL is R2, the non-selected word lines WL, selected reference word line sRWL and non-selected reference word line RWL are applied with the same voltages as those at the read step T1 shown in FIG. 12. Note here that the sensing timing in the read step T2 is set to be later than that in the read step T1. This is because that it is in need of judging the data level L1 as "1" at this step T2. That is, the read voltage R2 of the selected word line sWL at the step T2 is higher than the read voltage R1 at the read step T1, so that it takes a long time to make the word line terminal end near the read voltage to be set.

Further, the rising (timing t2') of the selected word line sWL is set to be earlier that that (timing t3') of the selected reference word line sRWL. As a result, it becomes possible to set the voltages at the ends of the selected reference word line sRWL and the selected word line sWL to be levels necessary for them at the timing of the read step T2.

Note here that, in both of FIGS. 12 and 14, the straight lines on the upper side of the distributions of data levels L0-L3, Lr designate verify levels, respectively, while the dotted lines on the lower side thereof designate threshold voltages defined by the verifies, respectively. While, in FIGS. 12 and 14, it has been shown such an example that the voltage waveform of the non-selected reference word line RWL is different from that of the non-selected word line WL, the voltage of the non-selected reference word line RWL may be set to be the same as the non-selected word line WL. This is preferable for making the word line driver simple.

Figure 16:
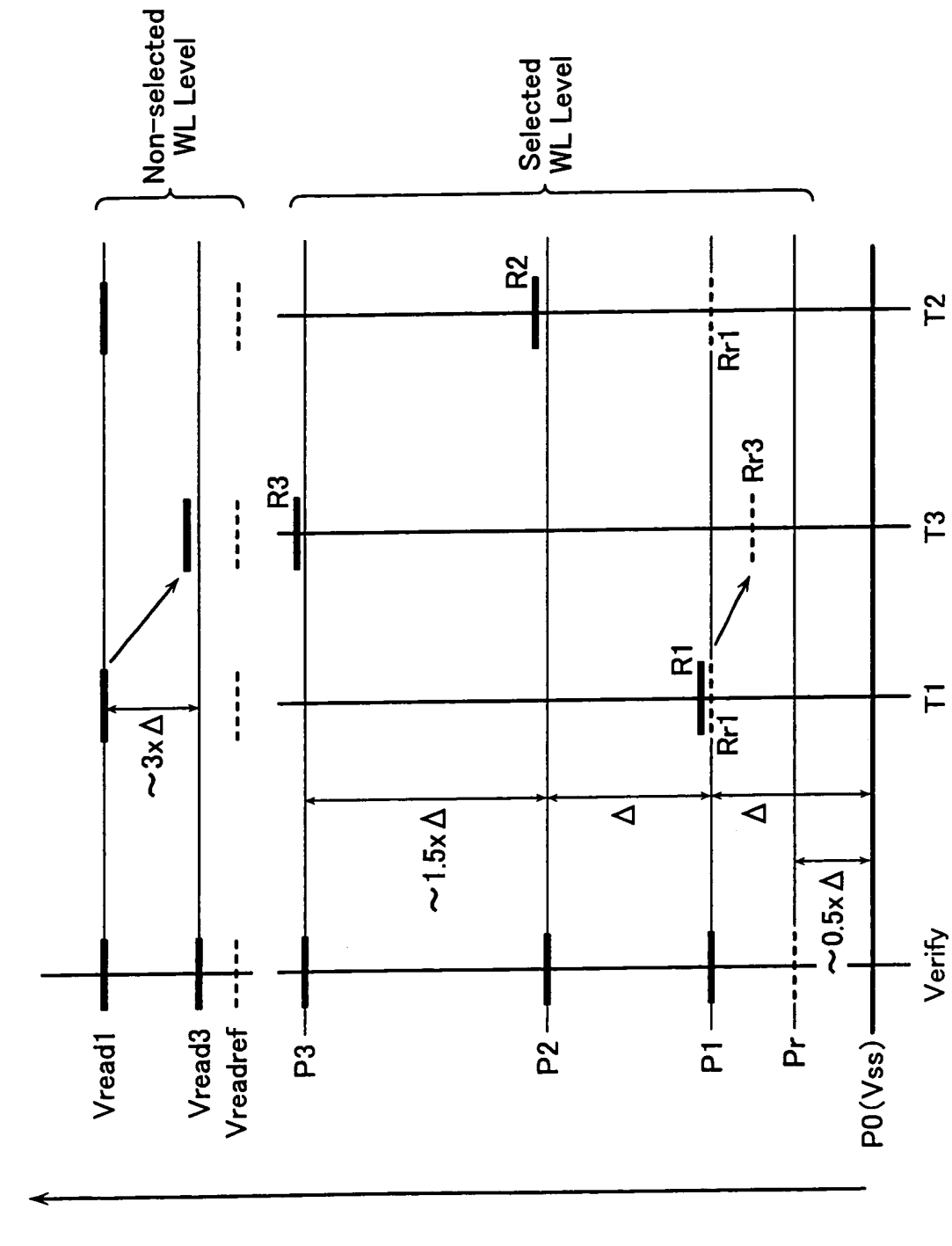
FIG. 16 shows the summarized word line level relationships at the read time.

FIG. 16 shows a summarized word line level relationship in consideration of the above-described word line delay. The word line voltage is shown on the vertical axis of FIG. 16, but the selected word line level shown at the lower side and the non-selected word line level in the same NAND string shown at the upper side are expressed with different scales from each other.

With respect to the selected word line level (i.e., verify voltage) Px (x=0, 1, 2, 3 and r) at the verify time, supposing that the level difference between P0 and P1, and that between P1 and P2 each is set to be Δ, the gap between P2 and P3 is set to be 1.5Δ while the verify voltage Pr of the reference cell is set to be about 0.5Δ.

The non-selected word line level at the write-verify time of the information cell is set to be Vread1 for T-cell and C-cell, and Vreadref for R-cell. At the erase-verify time for verifying the erased data level L0, verify voltage P0(=Vss) is applied to the entire word lines in the NAND string, so that there is not such a distinction in the word lines that one is selected and the others are non-selected.

As described above, the lower bit LB is read with the steps T1 and T3 successively performed in this order. At this time, read voltages R1 and R3 are applied to the selected word lines of T-cell and C-cell, which are equal to or nearly equal to the verify voltages P1 and P3, respectively. The selected word line voltage Rr applied to the reference cell is changed in accordance with steps in such a way that Rr1 set to be nearly equal to R1 is used at the step T1; and Rr3 set to be lower than Rr1 and between Pr and R1 at the step T3. The reason of that the word line voltage of the reference cell is changed in accordance with the steps is as follows: with the read voltage which is set to be higher than the verify voltage P1 at the step T1, levels L1-L3 are certainly read out as "0"; and with the read voltage which is set to be lower that the verify voltage P2 at the step T3, levels L0-L2 are certainly read out as "1".

Non-selected word line voltage (i.e., read pass voltage) applied to the information cells, T-cell and C-cell, is set to be Vread1 at the read step T1; and Vread3 at the read step T3. Vread3 is lower than Vread1 by about 3Δ. This corresponds that the verify voltage Pr of the reference cell R-cell is lower than the write-verify voltage P3 of the level L3 by about 3Δ. Non-selected word line voltage (i.e., read pass voltage) applied to the reference cell is set at Vreadref without regard to steps.

The upper bit HB may be read out only at the read step T2. To judge the levels L2 and L3, which are defined by the verify voltages P2 and P3, respectively, as "0", the selected word line level R1 at the step T1 is changed to R2, and others are the same as those at the step T1.

[Sense Unit Configuration]

Figure 17:
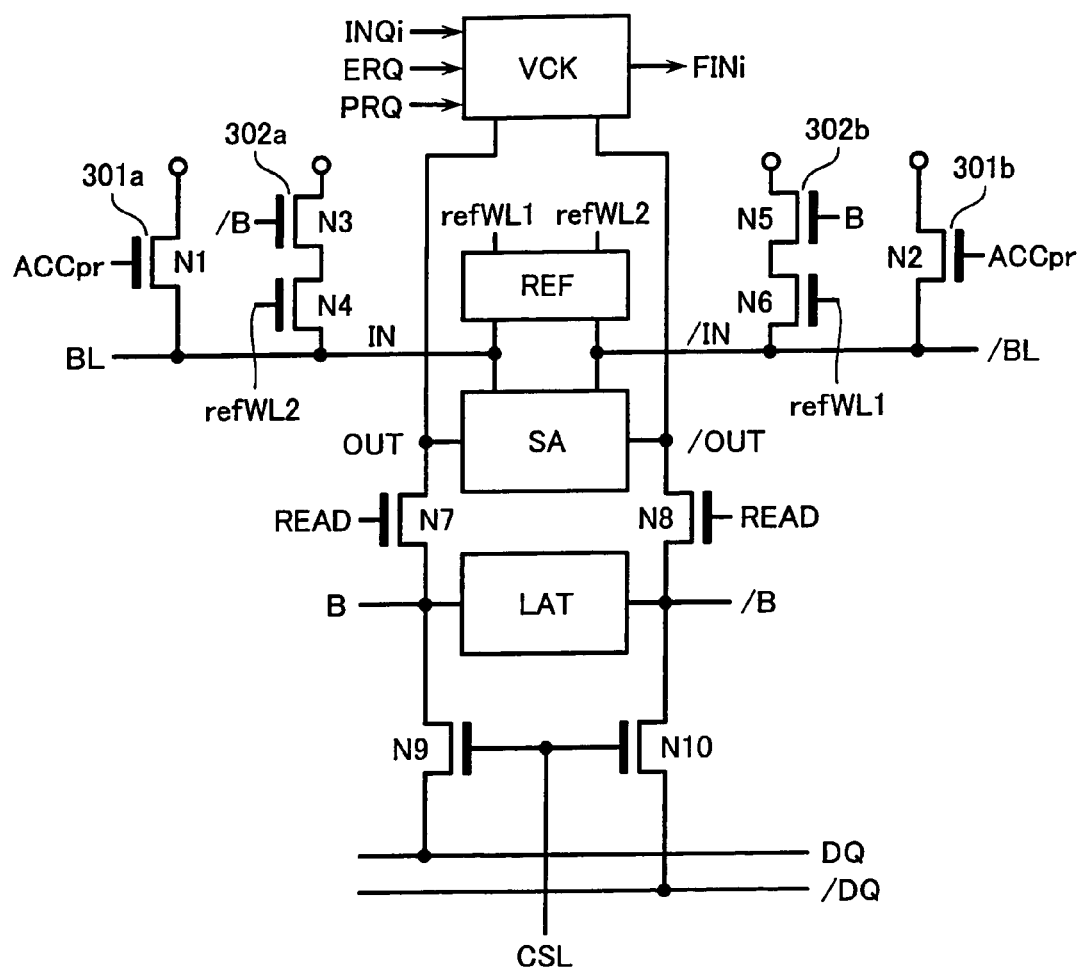
FIG. 17 shows the sense unit configuration in the embodiment.

FIG. 17 shows the configuration of the sense unit 30 used in this embodiment, which is coupled to a pair of bit lines BL and /BL. As explained with reference to FIG. 5, one sense unit 30 is used in practice for plural bit line pairs.

The sense unit 30 has a sense-latch system including differential amplifier SA (i.e., differential sense amp) of a current detection-type and a data latch circuit LAT, and a verify-result judge system with a verify-check circuit VCK. Disposed at the input nodes IN and /IN of the differential sense amplifier SA is a reference current source circuit REF, which is controlled with control signals refWL1 and refWL2. When cell current is supplied to one of the input nodes IN and /IN at the erase-verify time or the reference cell's write time, the current source circuit REF supplies reference current Iref to another input node.

The data latch circuit LAT serves to hold write data and read data read with the sense amplifier SA, and includes in practice two latches as described later. At the erase time or the reference cell write time, an order data is held in this data latch LAT for successively selecting the T-cell array and C-cell array.

There are provided data nodes B and /B, which serve for transferring data between the data latch LAT and the sense amplifier SA. The data nodes B and /B are coupled to the output nodes OUT and /OUT of the sense amplifier SA via NMOS transistors N7 and M8, respectively, which are controlled with a control signal READ.

In addition to the current source of the sense amplifier SA, bit line precharge circuits 301a and 301b are disposed at the input nodes IN and /IN, respectively, which are formed of NMOS transistors N1 and N2 serving for precharging the bit lines BL and /BL, respectively. These precharge circuits 301a, 301b serve for preventing the sense amplifier SA from being carried an idle through-current therein during a waiting time while cell data does not reach the sense amplifier SA at a read time.

Further disposed at the input nodes IN and /IN are pull-up circuits 302a and 302b, respectively. The pull-up circuit 302a is formed of NMOS transistors N3 and N4, which are controlled with the AND logic of data at the data node /B and the signal refWL2 to supply Vdd to the input node IN. Similarly, the pull-up circuit 302b is formed of NMOS transistors N5 and N6, which are controlled with the AND logic of data at the data node B and the signal refWL1 to supply Vdd to the input node /IN.

These pull-up circuits 302a and 302b are used for forcedly setting an input node corresponding to a write-inhibiting cell to be Vdd at a write-verify time, thereby setting a write completion state. Therefore, these circuits are made inactive at a normal data read time or an erase-verify time.

(Reference Current Source Circuit REF)

Figure 19:
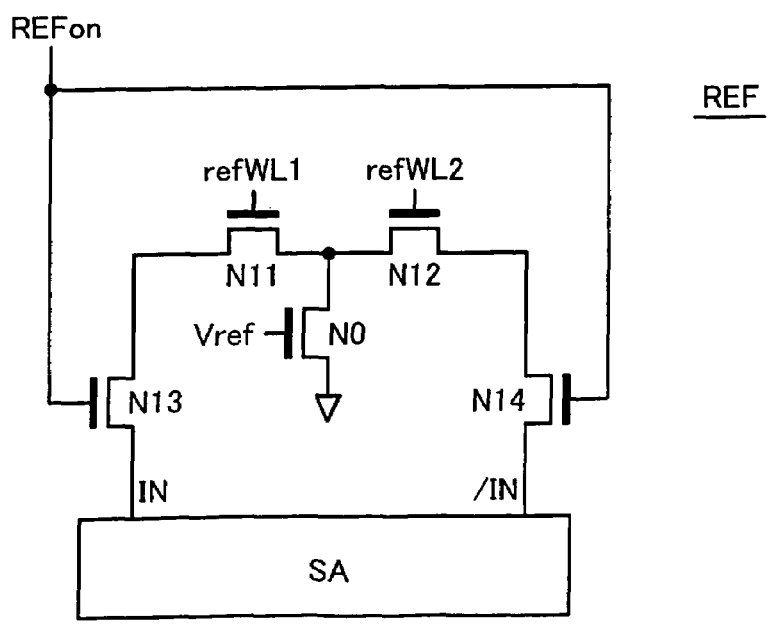
FIG. 19 shows the reference current source circuit REF in the sense unit.

The reference current source circuit REF has, as shown in FIG. 19, a current source NMOS transistor N0, the gate of which is applied with a reference voltage Vref. This transistor N0 is for carrying a reference current at the erase-verify time or the reference cell's write time, which serves for comparing the cell current to be sensed with it, and selectively coupled to either one of the input nodes IN and /IN.

That is, the transistor N0 is coupled to one input node IN of the sense amp SA via NMOS transistors N11 and N13 and coupled to the other input node /IN via NMOS transistors N12 and N14. NMOS transistors N13 and N14 are turned on simultaneously with an activation signal REFon. Control signals refWL1 and refWL2 are selectively set to be "1" when the current source transistor N0 is required. Therefore, the transistor N0 is coupled to either one of the input nodes IN and /IN in response to the control signals refWL1 and refWL2.

(Sense Amplifier SA)

Figure 18:
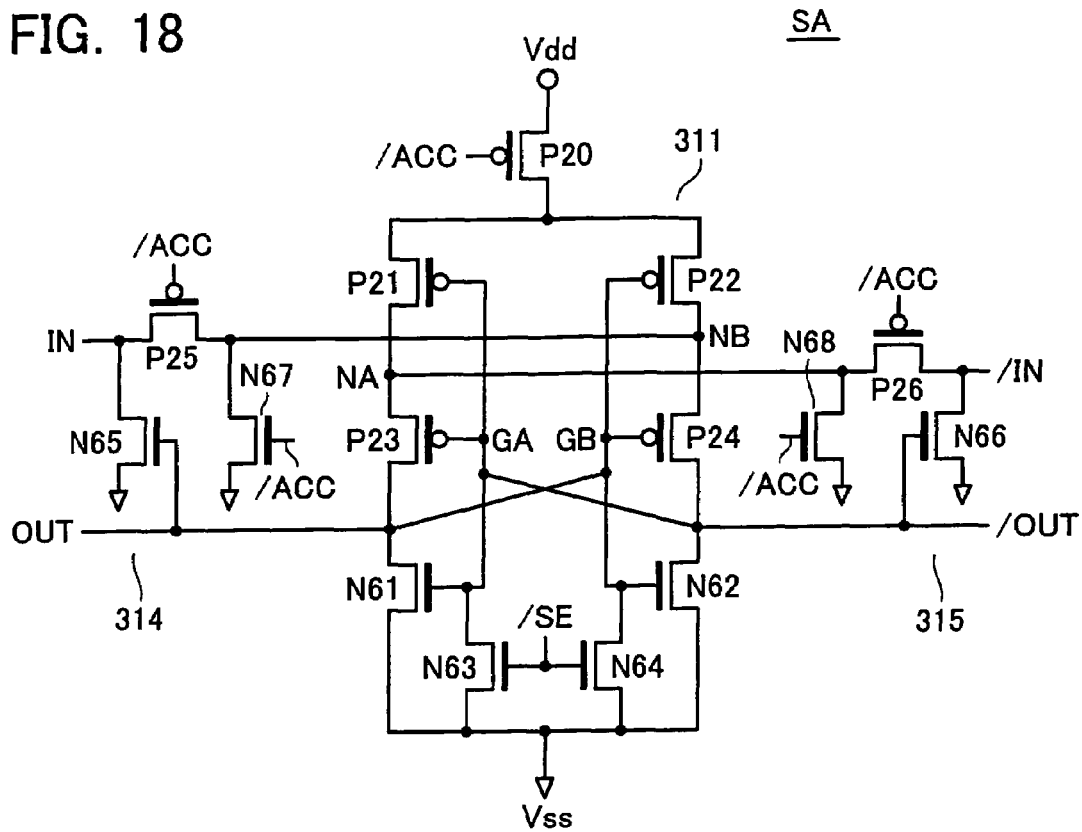
FIG. 18 shows the sense amplifier SA in the sense unit.

FIG. 18 shows the detailed configuration of the sense amplifier SA. This sense amplifier SA is a current detecting type of a differential sense amp formed to include a kind of a flip-flop 311.

The drain of PMOS transistor P23 and NMOS transistor N61, which are connected in series with a common gate GA, is coupled to one output node OUT. Similarly, the drain of PMOS transistor P24 and NMOS transistor N62, which are connected in series with a common gate GB, is coupled to the other output node /OUT. The common gates GA and GB are cross-coupled to the output nodes /OUT and OUT, respectively.

PMOS transistors P23 and P24 are coupled to power supply node Vdd via PMOS transistors P21 and P22, respectively, and via current source PMOS transistor P20. The gates of the PMOS transistors P21 and P22 are coupled to the common gates GA and GB, respectively. The current source PMOS transistor P20 is controlled with an activation signal /ACC.

The sources of NMOS transistors N61 and N62 are coupled to ground potential node Vss. The common gates GA and GB are coupled to Vss via NMOS transistors N63 and N64, respectively, the gates of which are controlled with a sense signal /SE.

The connection node NA of PMOS transistors P21 and P23 connected in series is coupled to one input node /IN via PMOS transistor P26 driven by the activation signal /ACC; and the connection node NB of PMOS transistors P22 and P24 connected in series to the other input node IN via PMOS transistor P25 driven by the activation signal /ACC.

Further coupled to these nodes NA and NB are NMOS transistors N68 and N67, which are driven by the activation signal /ACC, thereby serving for setting the nodes NB and NA to be Vss when the sense amplifier is inactive.

Feed back circuits 314 and 315 are disposed at the nodes IN and /IN, which serves for forcedly setting one of the input nodes to Vss based on the sensed result feed back. That is, NMOS transistors N65 and N66 are disposed between the Vss node and the input nodes IN and /IN, respectively, the gates of which are driven by the output nodes OUT and /OUT.

In this embodiment, high-speed data read is made possible based on such a fact that the sense amplifier SA is a current detecting type of a differential amplifier, and normal data read is performed by detecting cell current difference between a pair of cells. That is, the sense amplifier SA detects cell current difference between an information cell, T-cell or C-cell, and a reference cell, R-cell, via a pair of bit lines BL and /BL.

The operation of the sense amplifier SA will be explained below, but the bit line precharge operation will be explained later. In a normal data read mode, cell current difference being detected between the information cell and the reference cell, the reference current source circuit REF shown in FIG. 17 is not used. In a non-activated state with /ACC="H" and /SE="H", NMOS transistors N63 and N64 being kept on, the output nodes OUT, /OUT and the common gate nodes GA and GB are kept at Vss.

When a pair of word line TWL or CWL and reference RWL are selected, and the pair of bit lines BL and /BL are coupled to the input nodes IN and /IN, the activation signal /ACC becomes "L", and then the sense signal /SE becomes "L" a little late, so that the sense amplifier SA is activated. Supposing that an information cell T-cell and a reference cell R-cell are selected on the bit lines BL and /BL sides, respectively, cell currents thereof are supplied to the nodes NB and NA.

Just before the sense amplifier activation, NMOS transistors N61 and N62 are off, but PMOS transistors P21, P22, P23 and p24 are on. Therefore, just after the sense amplifier activation, the output nodes OUT and /OUT, which has been reset to be Vss, are charged-up with the power supply current from Vdd and the cell currents imposed thereon. When a voltage difference is generated between the output nodes OUT and /OUT (i.e., between the gate nodes GA and GB), it is performed such a positive feed back operation in the flip-flop 311 that the voltage difference between the output nodes OUT and /OUT is amplified, so that the voltage difference will be rapidly increased.

Supposing that, for example, OUT (i.e., GB) is lower than /OUT (i.e., GA), due to the positive feed back from /SE, NMOS transistor N61 is on; NMOS transistor N62 off; PMOS transistors P22 and P24 on; and PMOS transistors P21 and P23 off, so that the output nodes OUT and /OUT become Vss and Vdd, respectively.

With the above-described current detection method, it is possible to sense the cell current difference between the information cell and the reference cell in a short time. One of the output nodes OUT and /OUT being set to be Vss; and the other Vdd, such a feed back control is performed that one of NMOS transistors N65 and N66 is turned on, whereby one of the input nodes IN and /IN is set to be Vss. This is because that it is in need of controlling the bit lines in accordance with the verify result at a write-verify time.

(Data Latch Circuit LAT)

Figure 20:
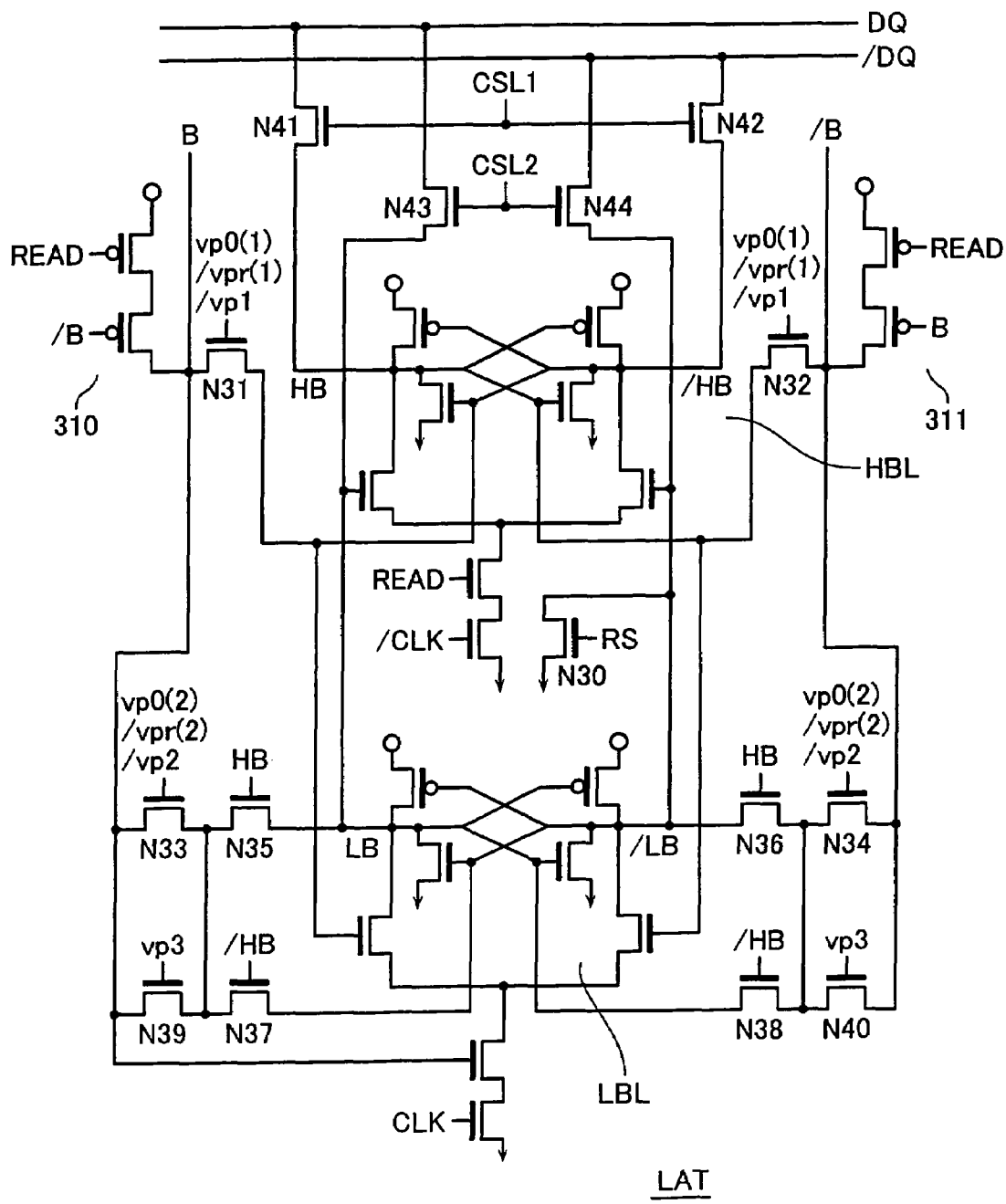
FIG. 20 shows the data latch circuit LAT in the sense unit.

FIG. 20 shows the data latch circuit LAT. To store the four-value data with two bits, the data latch circuit LAT has two latches HBL and LBL. These latches HBL and LBL are basically used for loading the upper bit data and lower bit data, respectively, at a write time.

Nodes of these latches HBL and LBL are coupled to data lines DQ and /DQ via column select transistors (N41,N42) and (N43,N44), which correspond to transistors N9 and N10 in FIG. 17, controlled with column select signals CSL1 and CSL2, respectively.

To perform data read with the above-described even/odd judgment, two data latches HBL and LBL will be coupled in series to constitute a shift resister, which is controlled with clocks CLK and /CLK, at a read time.

Data nodes B and /B are not only selectively coupled to the output nodes of the sense amplifier SA but also used for potential-controlling the bit lines BL, /BL in an operation mode with the reference current source circuit REF. Disposed between these data nodes B, /B and those of data latches HBL, LBL are transfer gate circuits. Further disposed at these data nodes B and /B are charge-up circuits 310 and 311, which are off at a read time (READ="1"), otherwise charge-up one of the nodes B and /B to Vdd.

The detail of the data latch circuit LAT will be explained when various operation modes are explained later.

(Verify-Check Circuit VCK)

Figure 21:
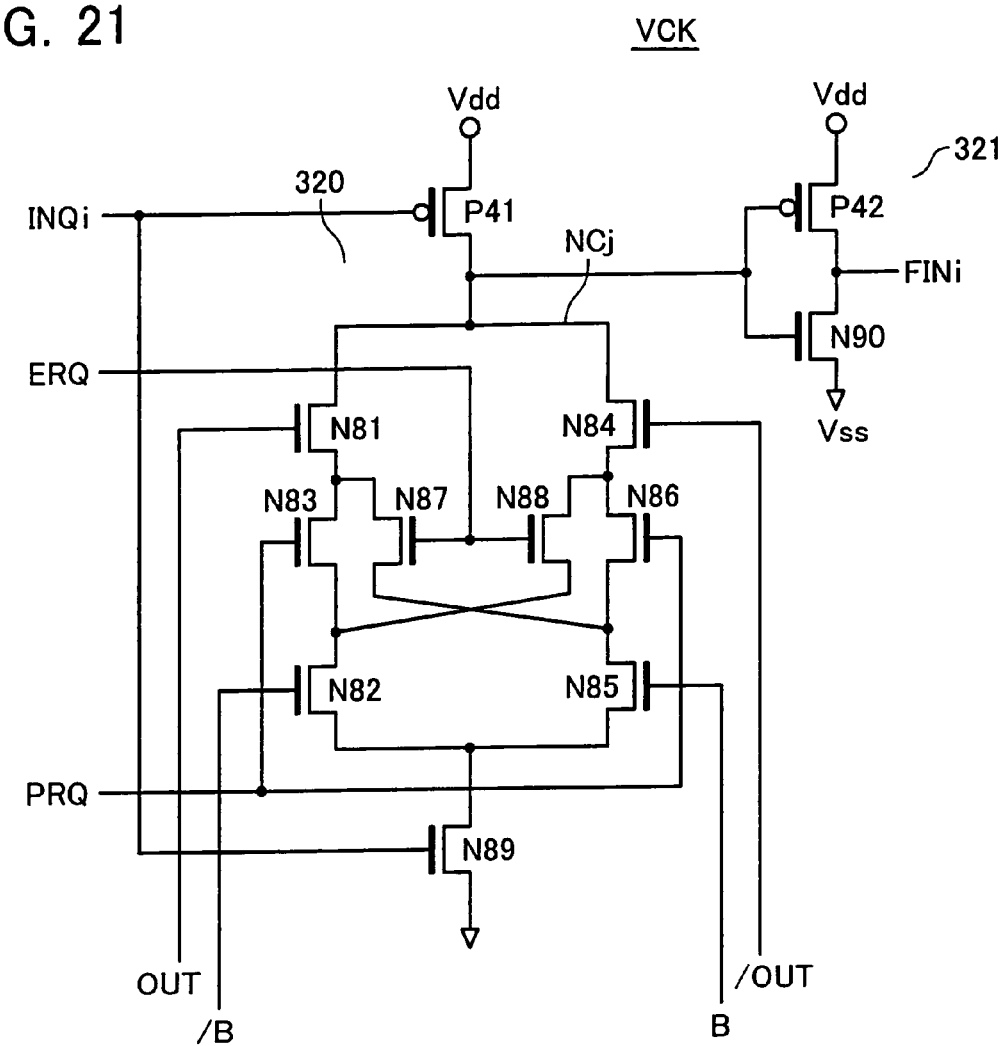
FIG. 21 shows the verify-check circuit VCK in the sense unit.

FIG. 21 shows the detailed configuration of the verify-check circuit VCK in the sense unit 30. This verify-check circuit VCK has a data comparison circuit 320, which judges whether the verify-read data at the sense amp output nodes OUT and /OUT is identical with the expectance data held in latch HBL or LBL or not.

Expectance data states at the erase-verify time and the write-verify time are different from each other because the erase-verify is for verifying that the cell's threshold voltage has been sufficiently lowered while the write-verify is for verifying that the cell's threshold voltage has been boosted to a certain level. In detail, it is required to satisfy the following situation: the erase-verify ends when it is detected that nodes B and /OUT or nodes /B and OUT have been reversed in logic while the write-verify ends when it is detected that nodes B and /OUT or nodes /B and OUT have become the same logic.

Therefore, four current passages are formed between PMOS transistor P41 and NMOS transistor N89, which are controlled with a check signal INQi to be complementarily turned on.

A first current passage is formed of NMOS transistors N81 and N82, the gates of which are coupled to nodes OUT and /B, respectively, and NMOS transistor N83 disposed therebetween to be driven by a check signal PRQ at a write-verify time. A second current passage is formed of NMOS transistors N84 and N85, the gates of which are coupled to nodes /OUT and B, respectively, and NMOS transistor N86 disposed therebetween to be driven by the check signal PRQ at the write-verify time. These two current passages constitute a data comparison circuit used at the write-verify time.

A third current passage is formed of NMOS transistors N81 and N85, the gates of which are coupled to nodes OUT and B, respectively, and NMOS transistor N87 disposed therebetween to be driven by a check signal ERQ at an erase-verify time. A fourth current passage is formed of NMOS transistors N84 and N82, the gates of which are coupled to nodes /OUT and /B, respectively, and NMOS transistor N88 disposed therebetween to be driven by the check signal ERQ at the erase-verify time. These two current passages constitute another data comparison circuit used at the erase-verify time.

Drain node NCi of PMOS transistor P41, the source of which is coupled to Vdd, is charged-up to an "H" level (=Vdd) during INQi="L". When INQi="H" is input, and verify-read data is identical with the expectance value, the node NCi is discharged to be an "L" level. In response to this "L" level transition of the node NCi, inverter 321 outputs FINi="H".

Figure 22:
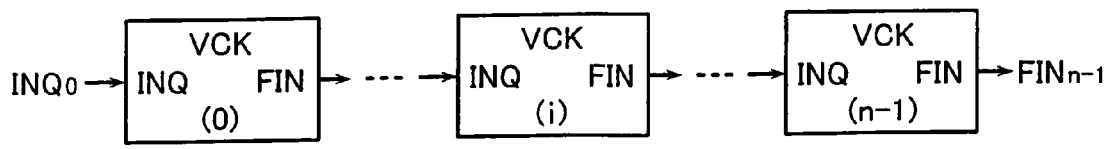
FIG. 22 shows the completion detection circuit with the verify-check circuit.

As shown in FIG. 22, the verify-check circuits VCKi in the entire sense units, which serve for simultaneously reading one page data, are sequentially coupled in such a manner of "domino theory" that a check output FIQi of a stage becomes a check input INQi+1 of the following stage. At a verify-check time, check input INQ0="H" is input to the first stage verify-check circuit VCK0. If there is at least one insufficiently written cell or insufficiently erased cell in one page, the final check output FINn−1 is "L". When the entire cells in one page have been sufficiently written or erased, FINn−1="H" is generated, and this becomes a pass flag serving for teaching a write or erase completion.

(Bit Line Precharge Operation)

Figure 23:
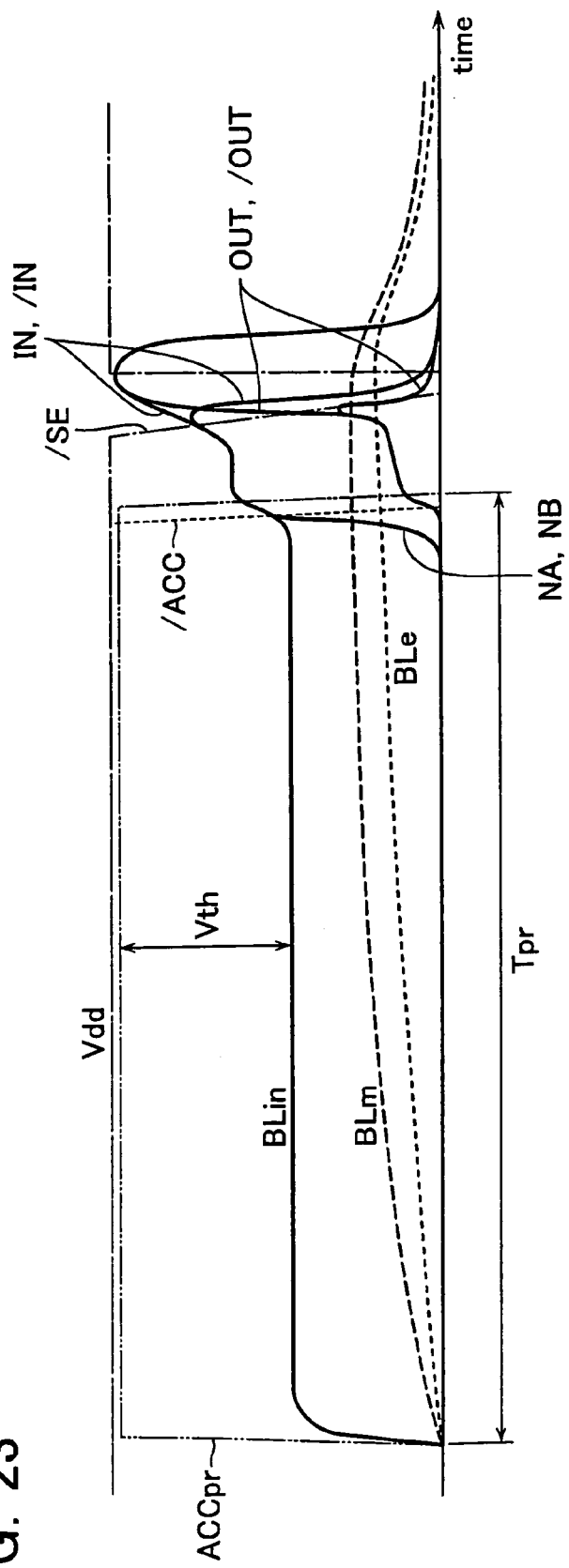
FIG. 23 shows voltage waveforms for explaining the bit line precharge and sense operations with the sense unit in accordance with the embodiment.

FIG. 23 shows operation waveforms of the sense amplifier with bit line precharge waveforms. The bit line is usually formed, as shown in FIG. 2, as extending over plural blocks, and has a large time constant. Therefore, in case a cell is selected in a block disposed far from the sense amplifier SA, it takes a large delay time until when the cell data (i.e., cell current difference) reaches the sense amplifier SA.

If the sense amplifier SA is kept active from the beginning of the cell drive to the data sensing time, a though-current flows in the sense amplifier SA while it is active. That is, while the sense amplifier SA supplies current to the bit lines BL, /BL with the activation signal /ACC="L", it is set in a waiting state with the sensing signal /SE="H", the through-current is carried via a passage with PMOS transistors P21, P23 and NMOS transistor N64 and another passage with PMOS transistors P22, P24 and NMOS transistor N63.

It is preferable that the above-described through-current of the sense amplifier SA is made as little as possible. In this embodiment, as shown in FIG. 17, current supplying sources 301a and 301b are disposed for the bit lines BL and /BL as independent of the current source in the sense amplifier SA to precharge the bit lines BL and /BL with the precharge signal ACCpr="H", as shown in FIG. 23. During the bit line precharge time Tpr, the activation signal /ACC is kept "H", i.e., the sense amplifier SA is kept at rest.

FIG. 23 shows bit line voltage waveforms from the beginning of the bit line precharge with respect to a first bit line position "BLin" near the input node of the sense amplifier SA; a second bit line position "BLe" far from the sense amplifier SA; and a third bit line position "BLm" midway therebetween. As shown in this drawing, the bit line voltage becomes about Vdd-Vth (Vth: threshold voltage of precharge transistors N1 and N2) just after starting the bit line precharge for the position BLin near the sense amp input node while other bit line voltages for BLe and BLm rise up with time constant delays.

After a certain bit line precharge period Tpr, the precharge operation ends with ACCpr="L", and at about the same time, the sense amplifier SA is activated with /ACC="L". At this time, transistors P25 and P26 are turned on, thereby coupling the sense amplifier input nodes IN, /IN to nodes NB, NA, respectively.

With the above-described driving, current supply to the bit lines BL and /BL is continued without breaking before and after the sense amplifier activation. When the sense amplifier SA is activated, nodes NA and NB are boosted in accordance with cell data, and the output nodes OUT and /OUT are also boosted in potential. The sensing signal /SE="L" being input without a large waiting time after the sense amplifier activation, the input current difference is amplified, so that one of the output nodes OUT and /OUT becomes Vss; and the other Vdd.

With the above-described bit line precharge operation, it becomes possible to effectively reduce the through-current in a waiting state of the sense amplifier. The meaning of the bit line precharge operation is basically different from that in a voltage detecting type of a sense amplifier as follows. The voltage detecting type sense amplifier senses whether the bit line is discharged or not, or the bit line discharge is large or small. In this case, the bit line precharge is an operation for setting the bit line voltage serving as a judging base of the bit line discharge state.

By contrast, the bit line precharge in this embodiment does not aim to set the bit line voltage, but aims to supply a direct current in place of the sense amplifier, which is to be supplied in principle to the bit line from the sense amplifier for serving as a base of cell current difference detection. The sense amplifier being kept inactive during the bit line precharge, it becomes possible to reduce the through current of the sense amplifier.

Further, the bit line precharge in this embodiment starts just before or just after the cell array access starting (i.e, word line drive starting). Therefore, the above-described word line drive and the bit line precharge may be overlapped, so that it is made short the waiting time from the access start timing to data sense timing.

The above-described method, in which the bit line precharge is performed with current sources disposed independent of that in the sense amplifier, and the sense amplifier activation is delayed, is preferable to reduce the influence of the word line disturbance at a read time. In the NAND-type flash memory, many word lines are driven simultaneously at the read time, and transition bit line current flows due to capacitive coupling from the word line at the beginning of the word line driving in addition to cell current. In this embodiment, the above described transition current flows. If the transition current is larger in comparison with the cell current, it causes erroneous data read in this embodiment, too. The above-described influence on the read data due to the word line driving is a so-called word line disturbance.

The farther from the sense amplifier the cell position is, substantially the longer the bit line length is; and the larger the word line disturb is. In this embodiment, the sense amplifier is activated after the bit line precharge operation with a certain period, so that it is possible to avoid data sensing in a state where the transition current flows, thereby resulting in that the influence of the word line disturbance is practically removed.

Next, data read, verify-erase and verify-write operations will be explained in detail in association with the above-described sense unit 30.

[Data Read]

Figures 24, 25:
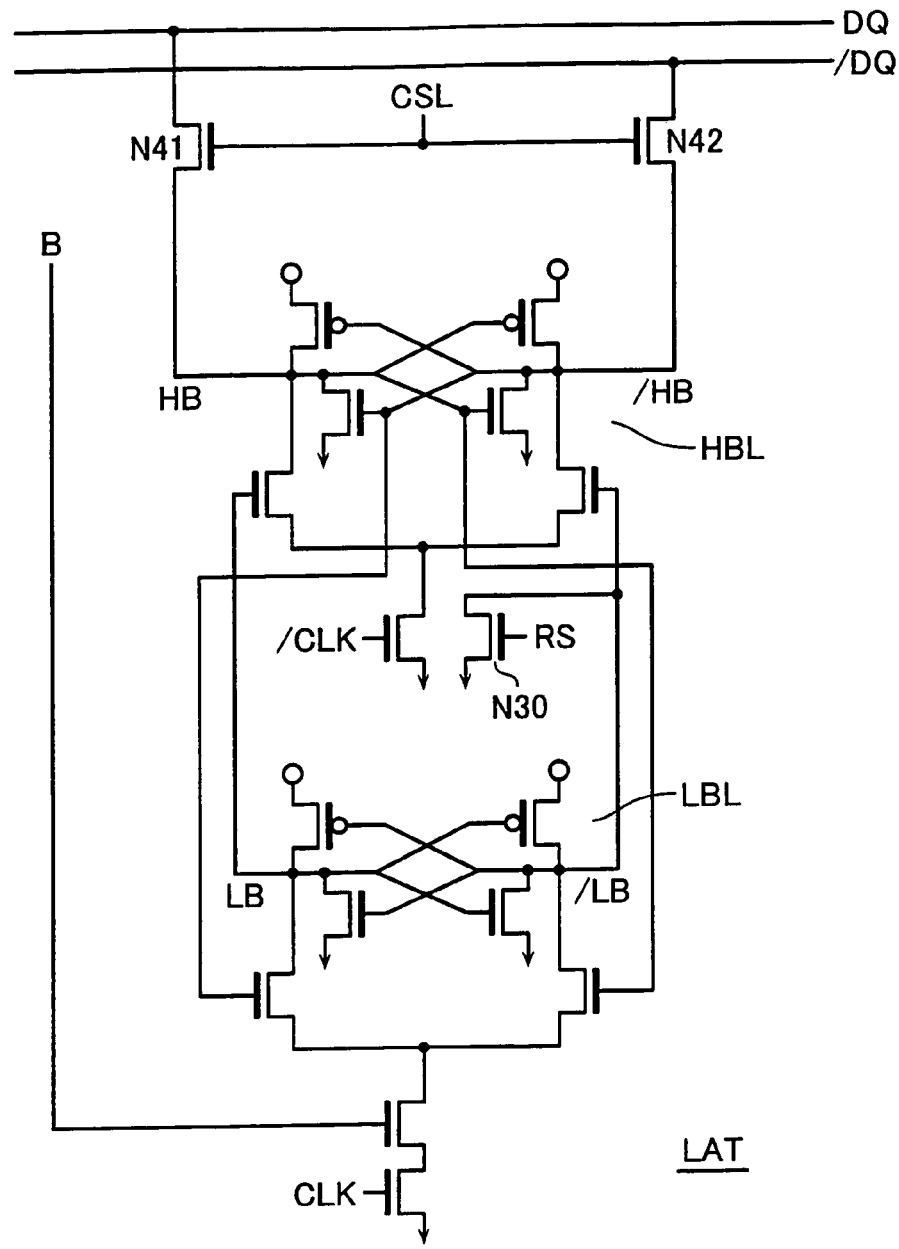
FIG. 24 shows the circuit portion in the data latch circuit LAT related to the read operation.
FIG. 25 shows then clock generation steps at the read time.

FIG. 24 shows a data read system in the data latch circuit LAT shown in FIG. 20. Although two data latches HBL and LBL are used for storing write data for writing four-value data, these latches HLB and LBL are, as shown in FIG. 24, coupled in series to constitute a two-bit shift resister in a read mode.

This is means for reading out independently the upper bit data and the lower bit data of each other. As apparent from FIG. 10, the upper bit data HB is "0" or "1" obtained at the step T2, while the lower bit data LB is detected as "1" when the number of "1" data obtained through the steps T1 and T3 is odd; and "0" when the "1" data number is even. That is, the upper bit data and the lower bit data may be read independently from each other with detecting evenness/oddness of "1" data number based on the two-bit shift resister operation.

In detail, supposing that the upper data latch HBL is dealt with a resister for storing the final read data, it is initially reset to be in a data "0" state. That is, reset signal RS being input to the reset NMOS transistor N30, data latch LBL is reset to be in the "1" state (i.e., LB="H"), and in response to it, data latch HBL is reset to be in the "0" state (i.e., HB="L").

Complementary clocks CLK and /CLK, which are used for controlling data shift of the shift resister with data latches HBL and LBL, are generated as shown in FIG. 25 based on the drive signals for steps T1, T2 and T3. These clocks CLK, /CLK are kept "1" except the read operation time.

Figure 26:
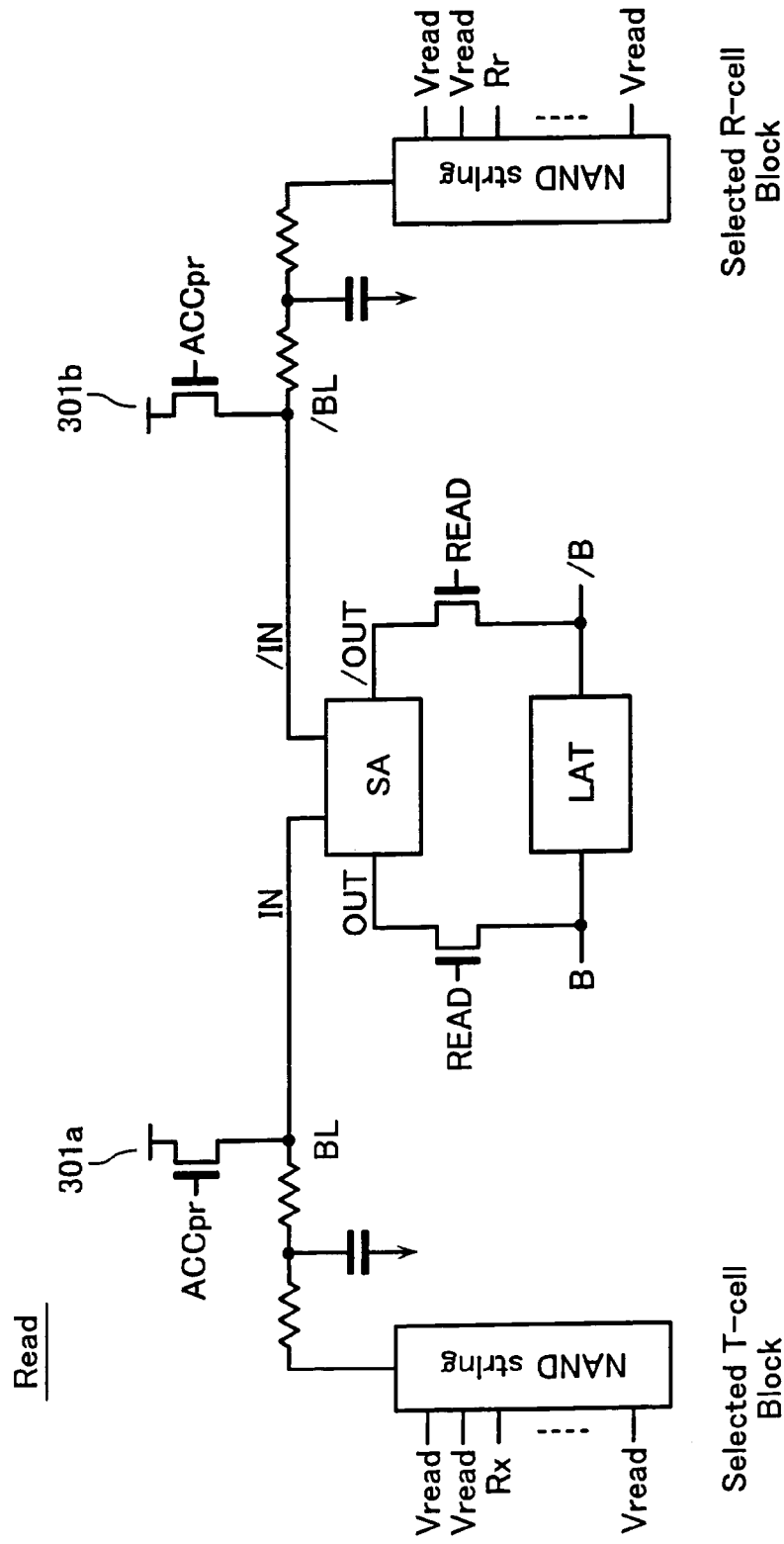
FIG. 26 shows the relationship between the bias of the NAND string and the sense amplifier at the read time.

As shown in FIG. 26, the reference current source circuit REF is separated from the input nodes IN and /IN of the sense amplifier SA at a read time. With respect to a T-cellNAND string selected in one cell array, read voltage Rx is applied to a selected word line; and pass voltage Vread to non-selected word lines. With respect to an R-cellNAND string selected in the other cell array, read reference voltage Rr is applied to a selected reference word line, which is determined in accordance with read steps; and pass voltage Vread to non-selected reference word lines. These pass voltage Vread, read voltage Rx and reference voltage Rr are suitably set as explained with reference to FIG. 12.

After the bit line precharge is performed for a certain period with the bit line precharge circuits 301a and 301b, cell currents of the selected T-cell and R-cell are supplied to the input nodes IN and /IN of the activated sense amplifier SA. Data nodes B and /B are coupled to the output nodes OUT and /OUT in response to the signal READ. Based on an AND logic of the data at the data node B and the clock CLK, shift clock CLK is supplied to the data latch LBL.

The operation of the data latch circuit LAT at a read time will be explained in detail below. At the upper bit read step T2, in case the output node OUT of the sense amplifier SA is "1" (i.e., B="1"), data "1" (HB="H", /HB="L") is obtained in the data latch HBL in response to the clocks CLK and /CLK. In case of OUT="0" (B="0"), the data latch HBL is kept in the initial state "0". As a result, the upper bit data is read in the data latch HBL.

At the lower bit read steps T1 and T3, in case both of the sensed outputs OUT and OUT are "0", the data latch HBL is kept in the initial state. In case both of the sensed outputs OUT and OUT are "1", the data latch HBL becomes "1" in response to clocks CLK and /CLK at the step T1, and it returns to "0" again in response to clocks CLK and /CLK at the step T3. That is, HB="0" is finally obtained through the two steps.

If OUT="1" is obtained at either one of the steps T1 and T3, the data latch HBL becomes "1" in response to clocks CLK and /CLK at the step. Therefore, the lower bit data may be read in the data latch HBL through the two steps.

[Verify-Erase]

Figures 27, 28:
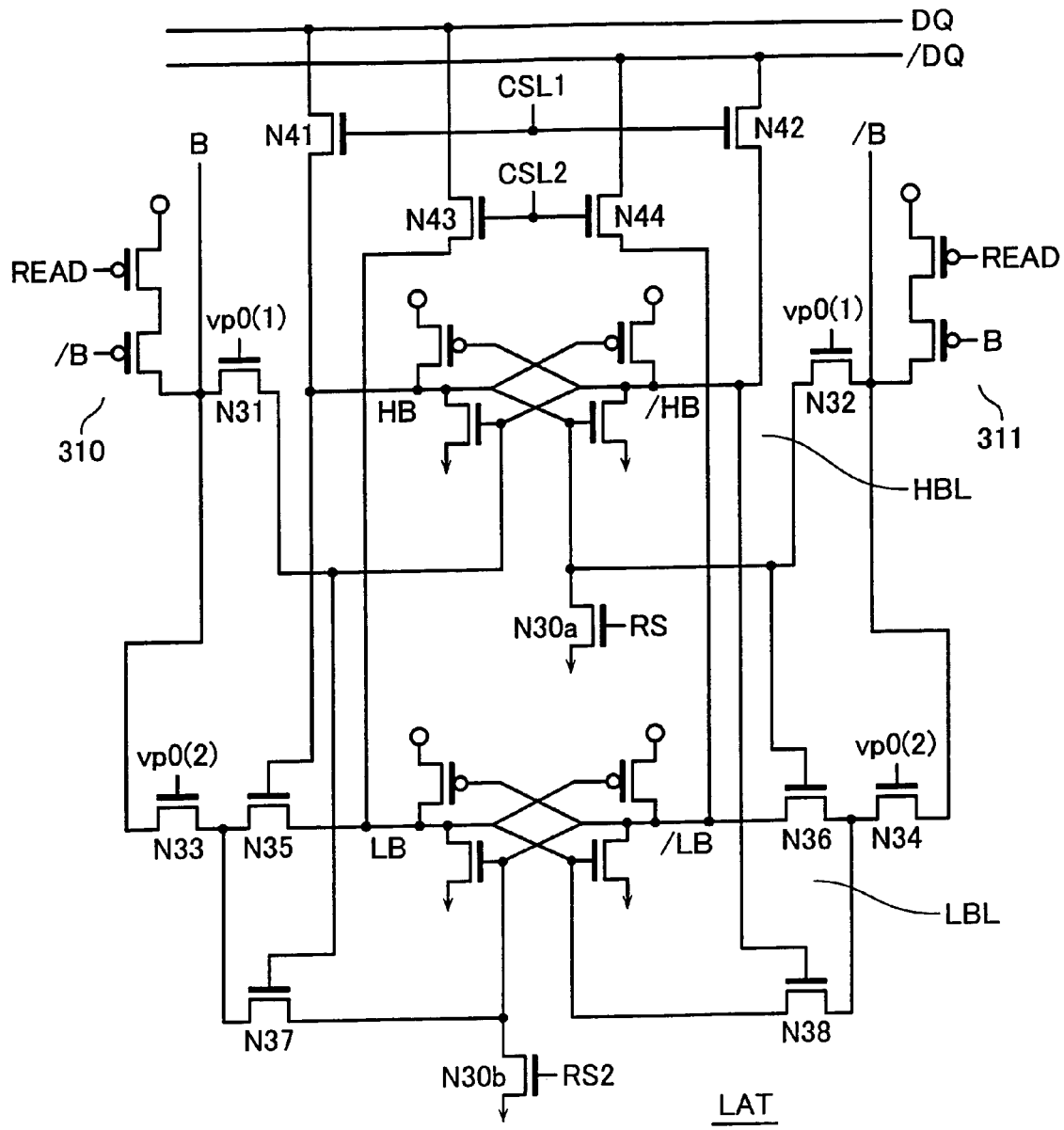
FIG. 27 shows the circuit portion in the data latch circuit LAT related to the verify-erase operation.
FIG. 28 shows the erase step and the data holding state of the data latch circuit LAT.
Figure 29:
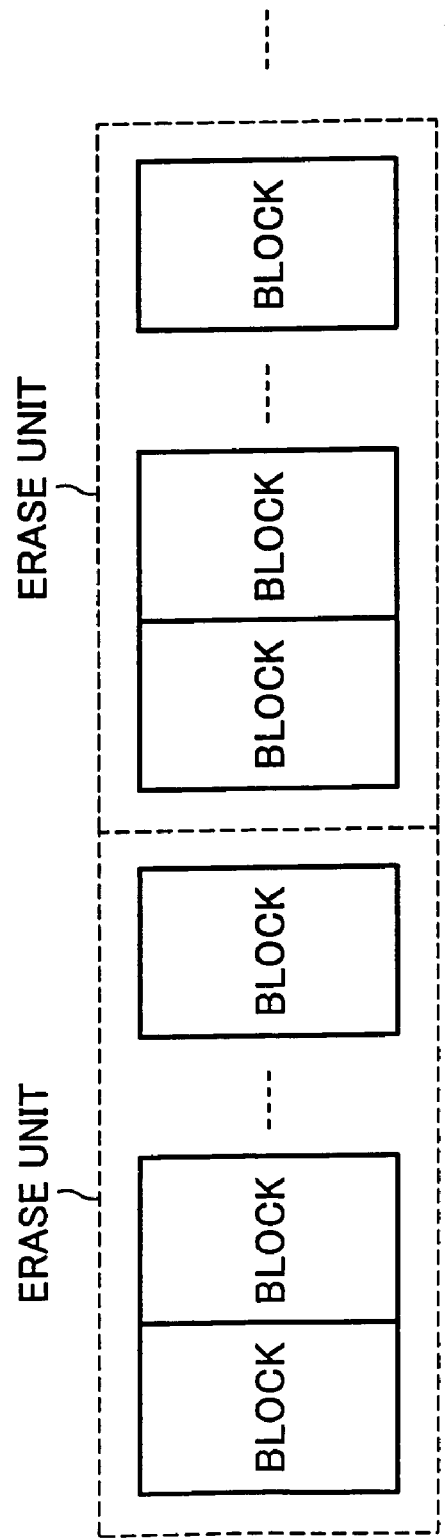
FIG. 29 shows an erase unit setting method.

FIG. 27 shows a data latch system in association with the verify-erase. Data erase is performed by repeat of an erase voltage application operation for applying an erase voltage to the entire cells (including information cells and reference cells) in an erase unit and a verify operation for verifying the erase state. The minimum erase unit is a block, but it is permitted to include plural blocks in one erase unit as shown in FIG. 29.

Erase operation is for setting cells to be in the lowest level L0 state. For the purpose, Vss is applied to the entire word lines in a selected block; and a large erase voltage Vera to the p-type well, on which the cell array is formed. With this voltage application, electrons in the floating gates of the entire cells will be discharged.

It is able to simultaneously erase plural blocks connected to the bit lines BL and /BL disposed at the both side of the sense amplifier. However, erase-verify read operations for BL side and /BL side are required to be performed independently of each other because it is in need of comparing erased cell's current with the reference current Iref of the reference current source circuit REF in the sense unit 30.

In this embodiment, complementary data are stored in the data latches HBL and LBL, and blocks of the cell arrays 1t and 1c are sequentially selected with the complementary data, thereby being subjected to verify-erase. For example, "0" and "1" are stored in the data latches HBL and LBL, respectively.

In FIG. 27, it is shown that reset transistor N30a controlled with reset signal RS is disposed for setting "0" in the data latch HBL; and reset transistor N30b controlled with reset signal RS2 is disposed for setting "1" in the data latch LBL. In practice, this data latch system is, as shown in FIG. 20, constituted to be able to reset the data latches HBL and LBL to be in a state with complementary data.

The erase step vp0 shown in FIG. 11 is divided into two verify-erase steps vp0(1) and vp0(2). As shown in FIG. 28, at the step vp0(1), verify-erase for a selected block on the bit line BL side is performed based on "0" data set in data latch HBL; and at the step vp0(2), verify-erase for another selected block on the bit line /BL side is performed based on "1" data set in data latch LBL.

At the step vp0(1), transfer NMOS transistors N31 and N32 are turned on, and reference current source transistor N0 is coupled to the input node /IN in response to REFon=refWL2="1". In this state, bit line precharge is performed for a certain period as similar to the normal data read, and then sensing is performed.

In case the current of the selected NAND string is smaller than the reference current Iref, the output node /OUT becomes "H", and the bit line /BL is forcedly set to be Vss. As a result, it is confirmed that the selected block in the cell array 1t is insufficiently erased. It being sufficiently erased, the output node OUT becomes "H", and the bit line BL is set to be Vss. Therefore, based on B="1" and OUT="1", it is detected that the selected block has been erased.

At the step vp0(2), transfer NMOS transistors N33 and N34 are turned on; transfer NMOS transistors N37 and N38 controlled with the data latch HBL are turned on; and reference current source transistor N0 is coupled to the input node IN in response to REFon=refWL1="1". In this state, a selected block in the cell array 1c is subjected to verify-erase. Based on /B="1" and /OUT="1", it is detected that the selected block has been erased.

Figure 32:
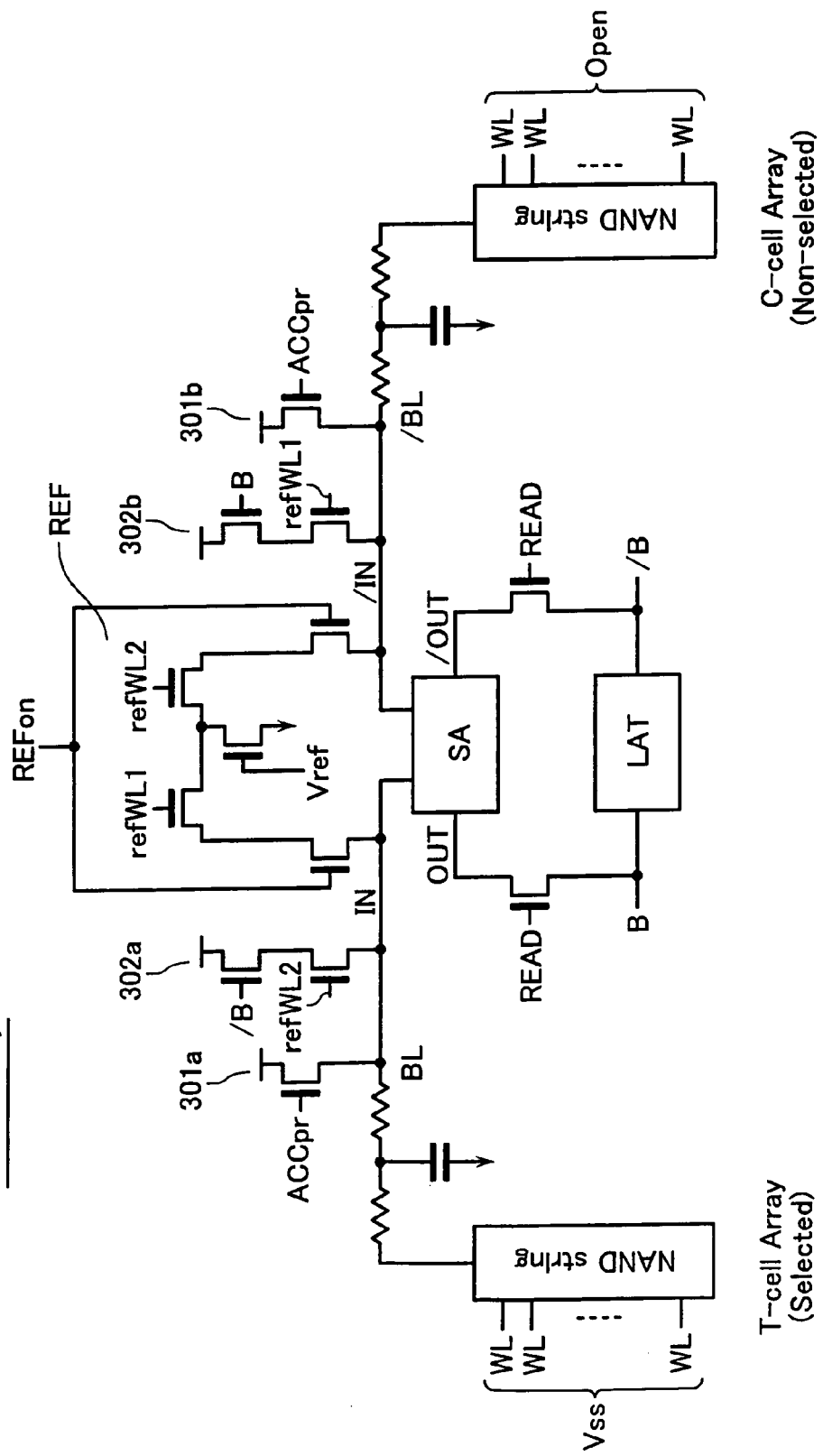
FIG. 32 shows the relationship between the bias of the NAND string and the sense amplifier at the erase-verify time.

FIG. 32 shows a state where the entire word lines in the selected block on the bit line BL side (i.e., on the cell array 1t side) are set to be Vss at the verify-erase step vp0(1). At this time, the reference current of the reference current source REF is coupled to the input node /IN in response to REFon=refWL2="1". Therefore, the entire blocks on the cell array 1c side are non-selected, and word lines thereof are set in a floating state.

Figure 30:
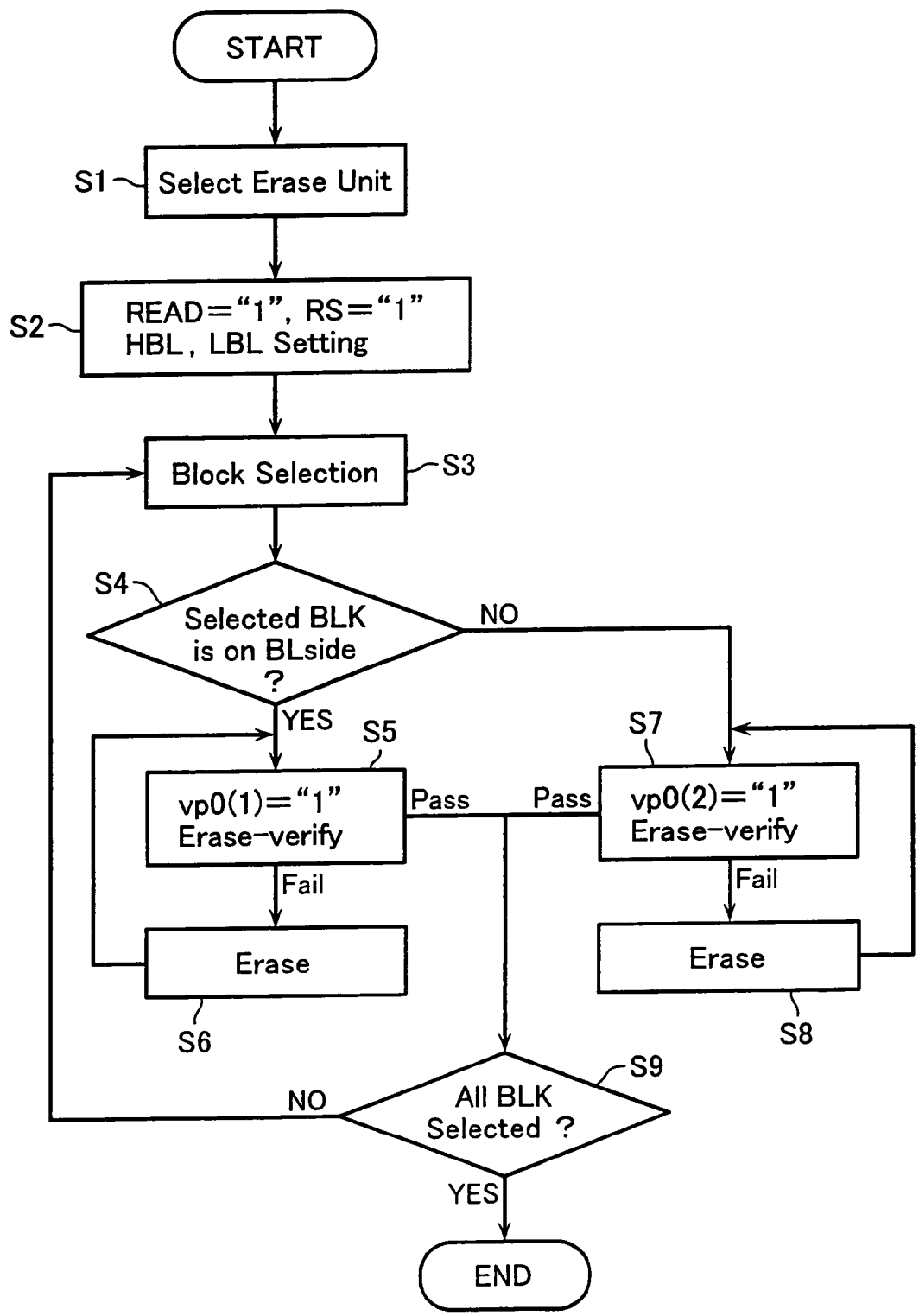
FIG. 30 shows the data erase sequence.

The detailed verify-erase operation will be explained with reference to FIGS. 30 and 31 below. Following command input, address being input, an erase unit is selected (step S1). As described above, the erase unit is at least one block, or preferably includes plural blocks.

Next, in accordance with READ="1" and RS="1", complementary data are set in data latches HBL and LBL in the sense unit 30 (step S2).

Next, in case the erase unit includes plural blocks, one block is selected (step S3). It is judged whether the selected block is on the bit line BL side or not (step S4). If "YES", the selected block on the bit line BL side is subjected to erase-verify in accordance with vp0(1)="1" (step S5); and in case there is an insufficiently erase cell, erase operation is performed (step S6).

If the judgment at step S4 is "NO", a selected block on the bit line /BL side is subjected to erase-verify in accordance with vp0(2)="1" (step S7); and in case there is an insufficiently erase cell, erase operation is performed (step S8).

The above-described verify-read and erase are repeated until the erase-verify read is passed. When the erase-verify is passed, it is judged whether the entire selected blocks have been completely erased or not (step S9). If "NO", the next block is selected (step S3). As described above, verify-erase operations are repeated until the entire selected blocks have been erased.

Erase-verify is performed block by block with Vss (verify voltage P0) applied to the entire word lines in the block. The entire cells having been set to be a negative threshold voltage state lower than the verify voltage P0, it is carried a cell current larger than the reference current, so that the erase state will be confirmed.

The verify-checks in the steps S5 and S7 are performed with the verify-check circuit VCK. When erase is completed in the entire and simultaneously operable sense units 30, the pass flag FINn−1="H" will be output.

Figure 31:
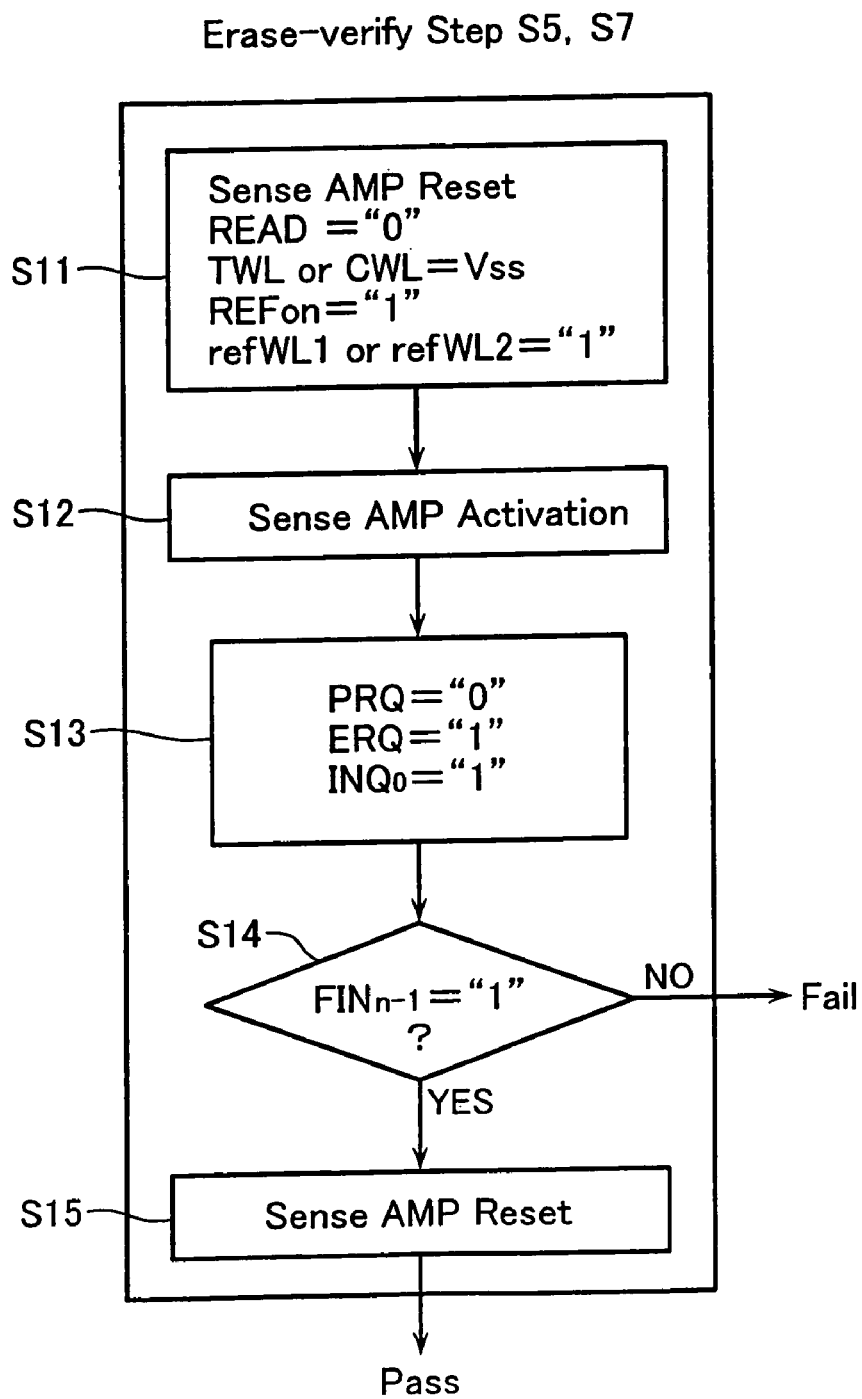
FIG. 31 shows the detail of the data erase step.

FIG. 31 shows the detailed flow of the verify-read steps S5 and S7. Initially, the sense amplifier is reset; read control signal READ is set to be "0"; the entire word lines in the selected block are applied with Vss; control signal REFon is set to be "1"; and one of the control signals refWL1 and refWL2 is set to be "1" (step S11). With this initial setting, a bit line is coupled to one of the input nodes IN and /IN; and the reference current source to the other.

Then, the sense amplifier is activated (step S12). Following it the verify-check circuit VCK is made operable in the erase-verify mode with PRQ="0", ERQ="1" and INQ0="1" applied (step S13). Detecting whether FINn−1 becomes "1" or not, "PASS" or "FAIL" will be judged (step S14). If "FAIL", erase is performed while if "PASS", the sense amplifier is reset (step S15).

[Reference Cell Verify-Write]

After data erase has been performed for the cell array including R-cell use block, and prior to four-value data write, it is required to write the reference threshold level Lr into the entire cells in a block serving as the R-cell block. This reference cell verify-write is performed as follows: word lines in the selected block are sequentially selected, to each of which write voltage Vpgm is applied for injecting electrons into the floating gate. In this case also, write voltage application and write-verify are repeatedly performed.

Being different from the data write for the information cell, T-cell or C-cell, the reference cell write is performed in such a way that one page write data become an all "0" state, i.e., the entire cells simultaneously selected become a cell state of "0".

It is in need of setting at least one reference cell block for each side of the bit lines BL and /BL. In the reference cell write mode, write data supplied to selected bit lines are set as an all "0" state, there is no need of loading write data in the sense unit.

Figures 33, 34:
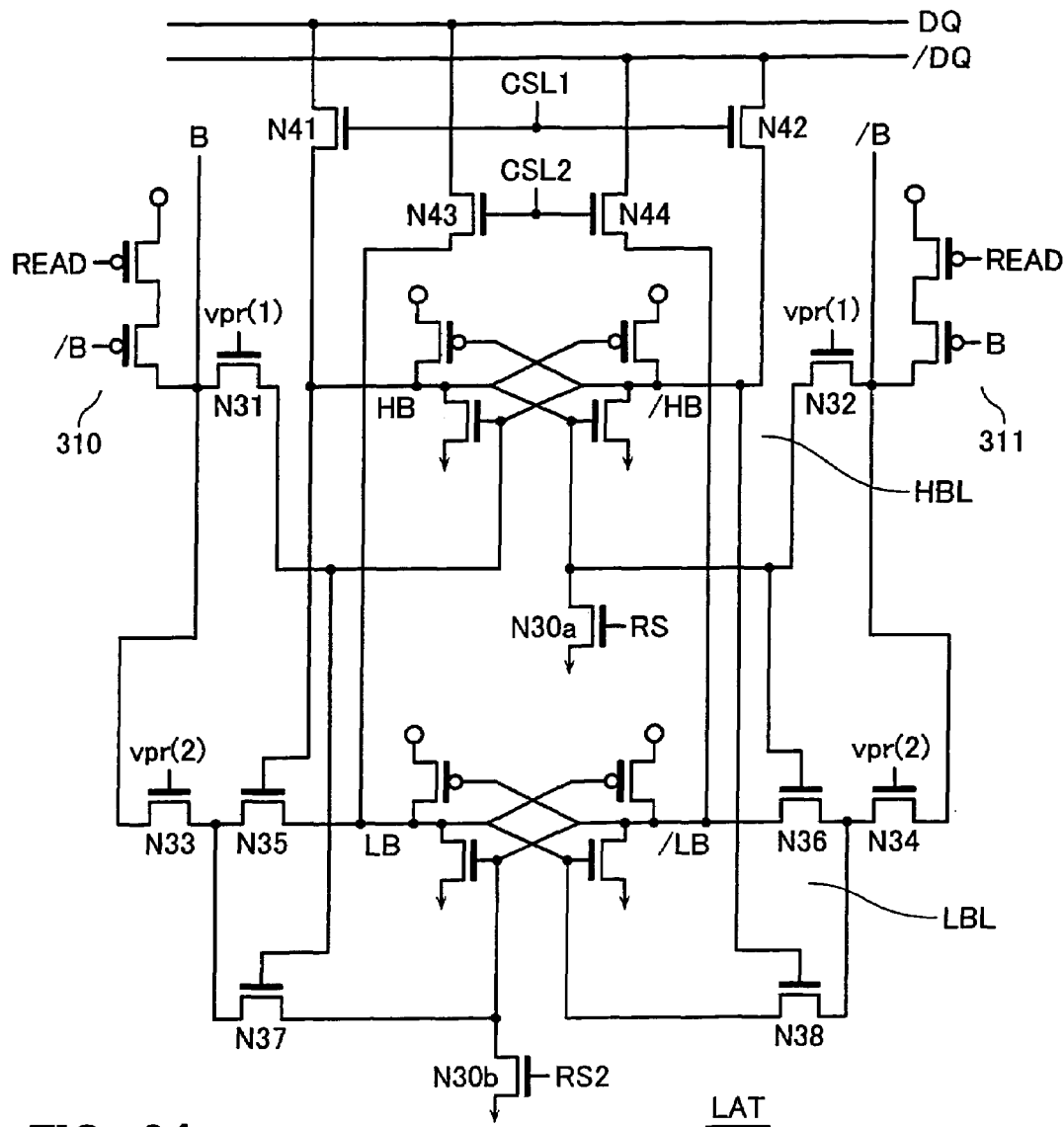
FIG. 33 shows the circuit portion in the data latch circuit LAT related to the reference cell write operation.
FIG. 34 shows then reference cell write step and the data holding state of the data latch circuit LAT.

Therefore, the data latch system in the sense unit 30 is, as shown in FIG. 33, the same as in the erase mode. Complementary data are stored in the data latches HBL and LBL, and bit lines BL and /BL are sequentially selected in accordance with the complementary data.

The reference cell write step vpr shown in FIG. 11 is, as shown in FIG. 34, divided into two steps vpr(1) and vpr(2), the former being for writing the reference cells on the bit line BL side in accordance with data "0" in the data latch HBL; the latter being for writing the reference cells on the bit line /BL side in accordance with data "1" in the data latch LBL. Data transfer NMOS transistors N31, N32 and N33, N34 are driven by timing signals corresponding to the steps vpr(1) and vpr(2).

Figure 37:
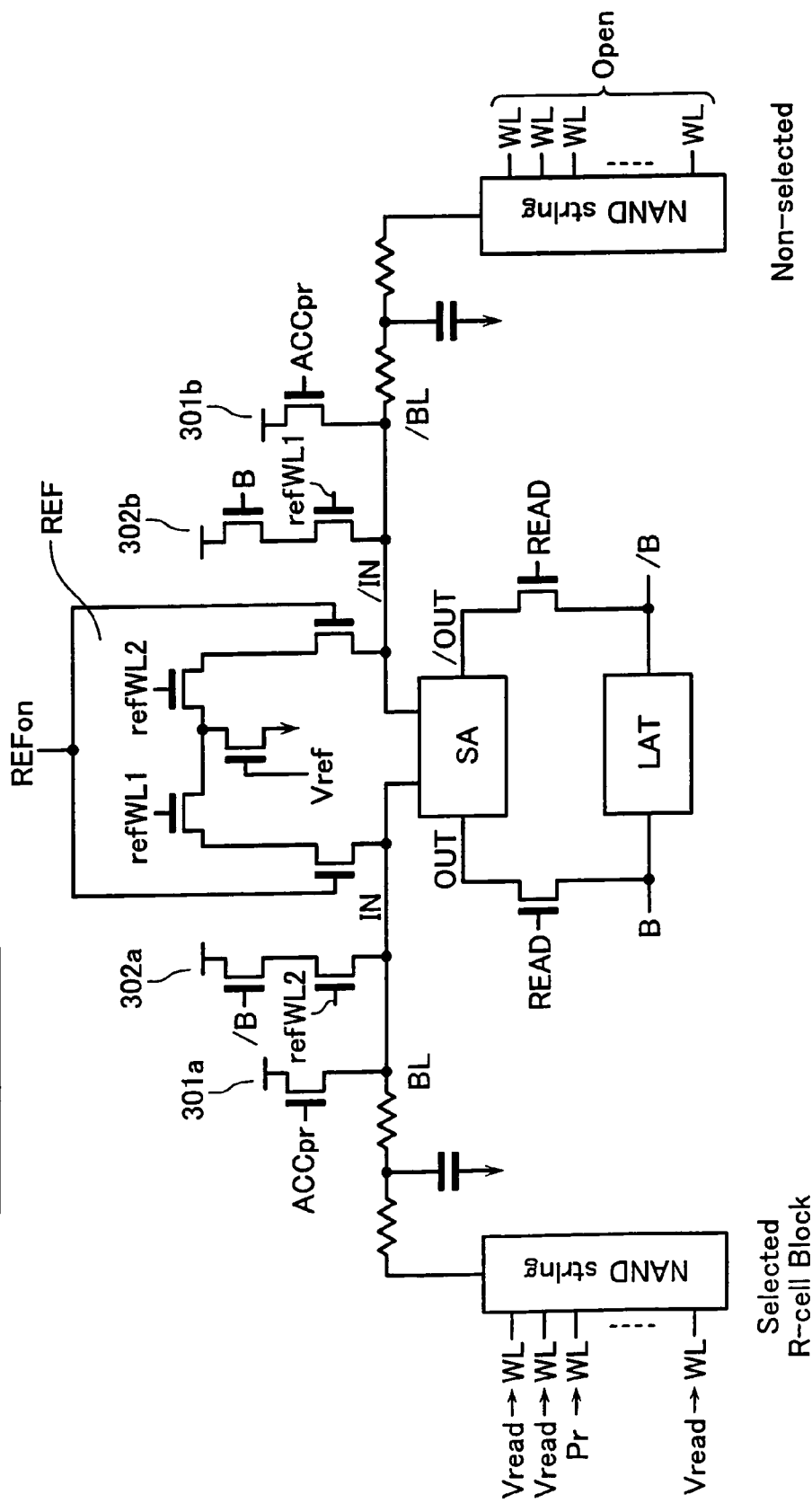
FIG. 37 shows the relationship between the bias of the NAND string and the sense amplifier at the reference cell write time.

The write-verify at the step vpr(1) is, as shown in FIG. 37, for comparing the R-cell current of a selected R-cell block in a selected cell array 1t with the reference current Iref of the reference current source circuit REF to verify that cell data becomes "0" under the condition of: verify voltage Pr is applied to the selected reference word line in the selected R-cell block; pass voltage Vread to non-selected word lines; and control signals REFon=refWL2="1" to the reference current source circuit REF. The entire blocks in the cell array 1c are set in an inactive state with the entire word lines kept floating. In case there is an insufficiently written cell, "1" data will be sensed. Therefore, write operations are repeated until there have been detected no "1" data cells.

Figure 35:
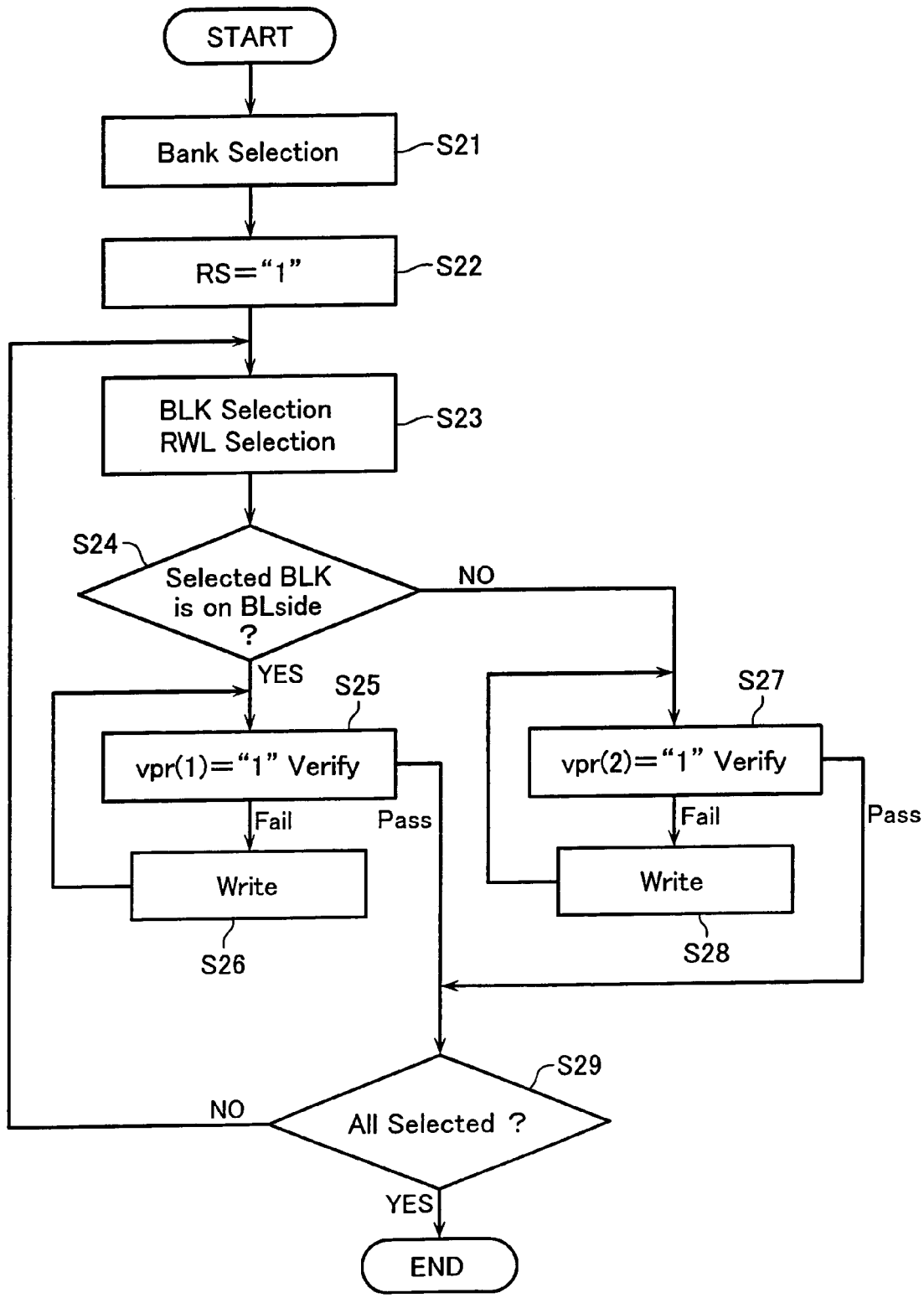
FIG. 35 shows the reference cell write sequence.
Figure 36:
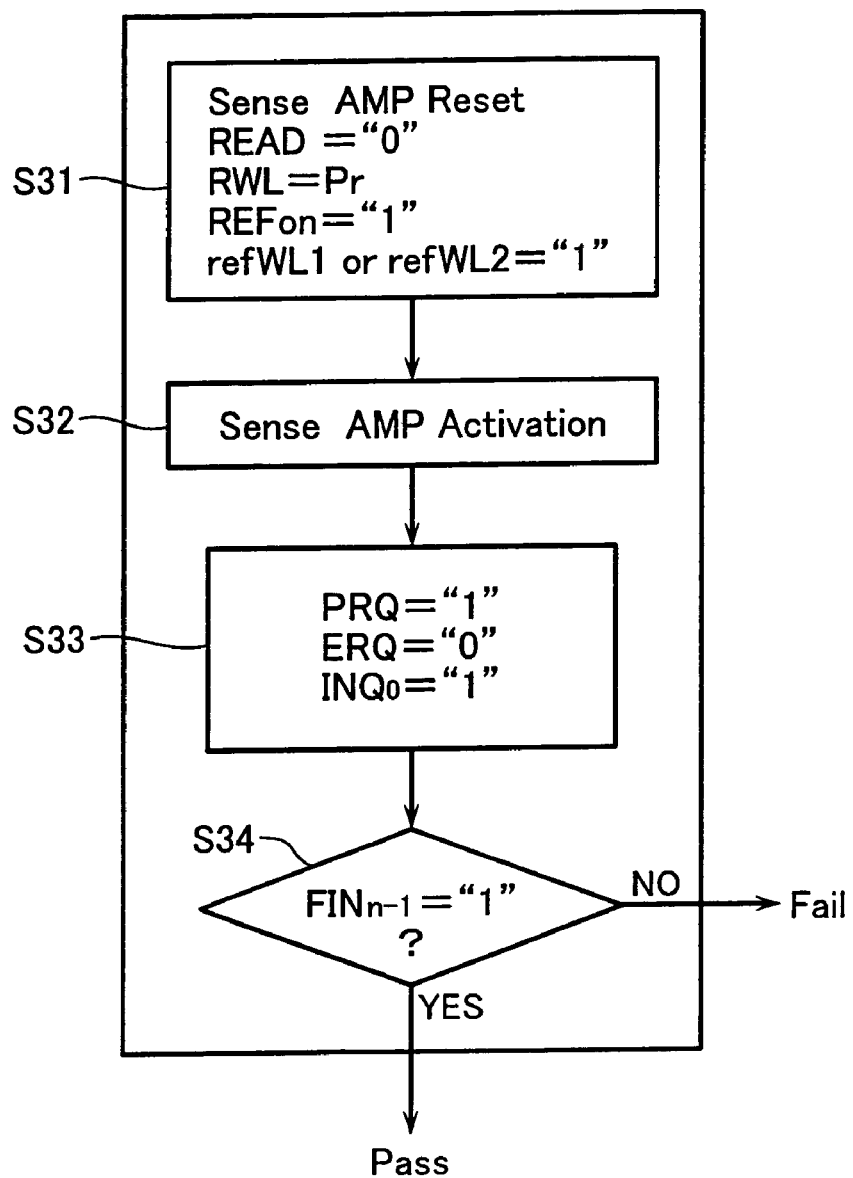
FIG. 36 shows the detail of the reference cell write-verify step.

With reference to FIGS. 35 and 36, the reference cell write sequence will be explained below.

Firstly, select a bank, in which there are reference cells to be written (step S21), and then set complementary data in the data latches HBL and LBL with the reset signal RS="1" (step S22). The data reversed to each other are transferred to data nodes B and /B with timing signals corresponding to the steps vpr(1) and vpr(2).

In the reference cell write mode, it is in need of writing the entire cells in at least two blocks, which are selected as reference cell blocks in the selected bank. Therefore, block (BLK) selection and reference word line (RWL) selection in the block are performed (step S23).

Next, judge whether the selected block is disposed on the bit line BL side or not (step S24). If bit line BL side is selected, perform verify-read for the selected block on the bit line BL side with vpr(1)="1" (step S25). In case the verify result is "FAIL", write the reference cell (step S26). These verify step and write step are repeated until the verify result becomes "PASS".

In case the bit line /BL side is selected, perform verify-read for the selected block on the bit line /BL side with vpr(2)="1" (step S27). If the verify result is "FAIL", write the reference cell (step S28). These verify step and write step are repeated until the verify result becomes "PASS".

Detect whether all blocks and all reference word lines therein have been selected or not (step S29), and repeat the above-described operations until it is judged "PASS" at the step S29.

FIG. 36 shows the detail of the reference cell write-verify steps S25 and S27. At the step S31, the sense amplifier is reset; signal READ is set to be "0"; and verify voltage Pr is applied to the selected reference word line RWL while the reference current source is coupled to one of the bit lines BL and /BL (REFon="1", refWL1 or refWL2="1").

Next, the sense amplifier is activated, and verify-read is performed (step S32). In case of this verify-read, as similar to the normal read operation, the bit line precharge is performed before the sense amplifier activation. To judge the verify result, PRQ is set to be "1"; and INQ0="1" is input (step S33).

The reference cell write completion is judged based on whether FINn−1 becomes "1" or not (step S34). The above-described reference cell write operation will be repeated until the write completion is detected.

"0" write of the reference cell, R-cell, is performed with the write voltage Vpgm applied to a selected word line to inject electrons into cell's floating gate from the channel like that of the normal information cell, T-cell or C-cell. The reference cell write-verify is, as described above, performed with two steps as follows: one step is for the reference cells in the T-cell array 1$t$ side (i.e., on the bit line BL side); and the other step is for those in the C-cell array 1$c$ side (i.e., bit line /BL side).

FIG. 37 shows the reference cell write-verify condition when the bit line BL side is selected. Verify voltage Pr is applied to the selected reference word line in the selected R-cell block; pass voltage Vread to non-selected reference word lines; and the entire blocks on the bit line /BL side are non-selected (all word lines are floating). At this time, the reference current source is coupled to the input node /IN on the bit line /BL side in accordance with REFon=refWL2="1".

[Information Cell Verify-Write]

Figures 38, 39:
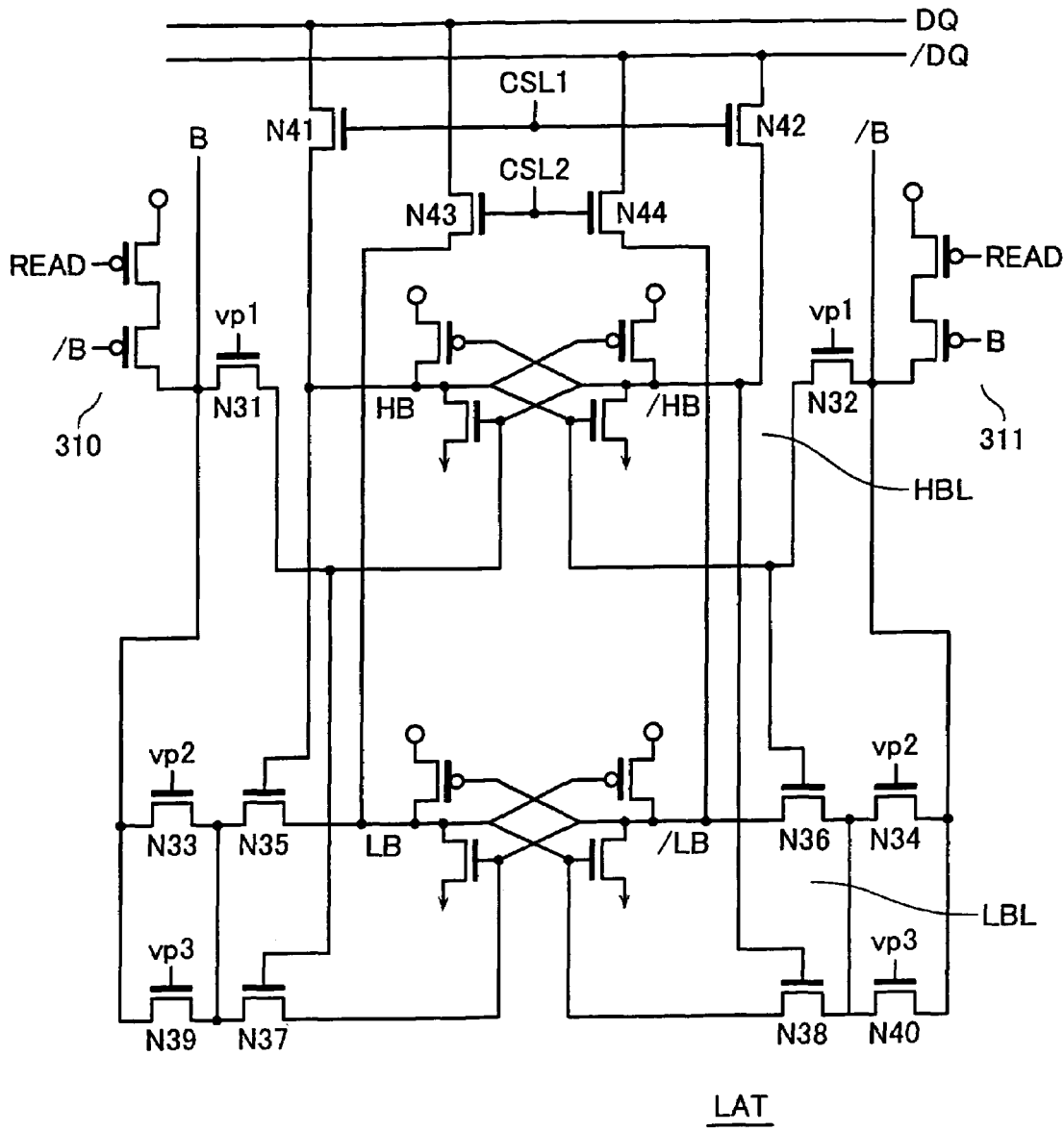
FIG. 38 shows the circuit portion in the data latch circuit LAT related to the information cell write operation.
FIG. 39 shows the information cell write step and write data state change.

FIG. 38 shows the data latch system in the sense unit 30 in association with the verify-write. As write data, the upper bit (i.e., the upper page) data and the lower bit (i.e., the lower page) data are loaded in the data latches HBL and LBL, respectively, from the external.

In detail, the upper bit and lower bit write data are transferred via the data lines DQ and /DQ to be loaded in the latches HBL and LBL via column gates (N41, N42) and (N43, N44) driven by the column select signals CSL1 and CSL2, respectively.

Data write is, as shown in FIG. 11, performed with three steps as follows: verify-write step vp1 for writing the level L2 (the upper bit HB write); verify-write steps vp2 and vp3 for writing the levels L3 and L1, respectively, (the lower bit LB write).

At the write time of the lower bit LB, it is necessary that the upper bit HB has been determined because it is in need of inverting data set at the node B and /B in accordance with the upper bit HB. Therefore, if a read operation interrupts the write sequence after the write step vp1, to restart the steps vp2 and vp3, it is required to read out the upper bit data, which has already been written in the cell array, and load it in the data latch HBL.

FIG. 39 shows that "0" or "1" of the upper bit HB is determined at the write step vp1; "0" or "1" of the lower bit LB in case of HB="0" is determined at the write step vp2; and "0" or "1" of the lower bit LB in case of HB="1" is determined at the write step vp3. Determined data is shown in boldface in FIG. 39.

The upper bit data transferring NMOS transistors (N31 and N32), the lower bit data transferring NMOS transistors (N33 and N34) and (N39 and N40) are controlled by timing signals corresponding to the steps vp1, vp2 and vp3, respectively.

Data write is performed for a write unit (one page) defined by a set of cells selected in one page bank with plural bit lines BL (or /BL), which are simultaneously coupled to the entire sense units, and one word line TWL (or CWL). Write-verify is performed with reference to the reference level Lr of the reference cell.

The upper bit write is the same in principle as the lower bit write. That is, these data write are performed by repeat of write voltage application and write-verify for verifying the write state.

At the write voltage application time, to cause electron injection into the floating gate of the selected cell with "0" data supplied, the cell channel will be preliminarily set in potential in accordance with the write data. Non-selected word lines in the selected block are applied with a certain pass voltage necessary for preventing the non-selected cells from being written.

Figure 40:
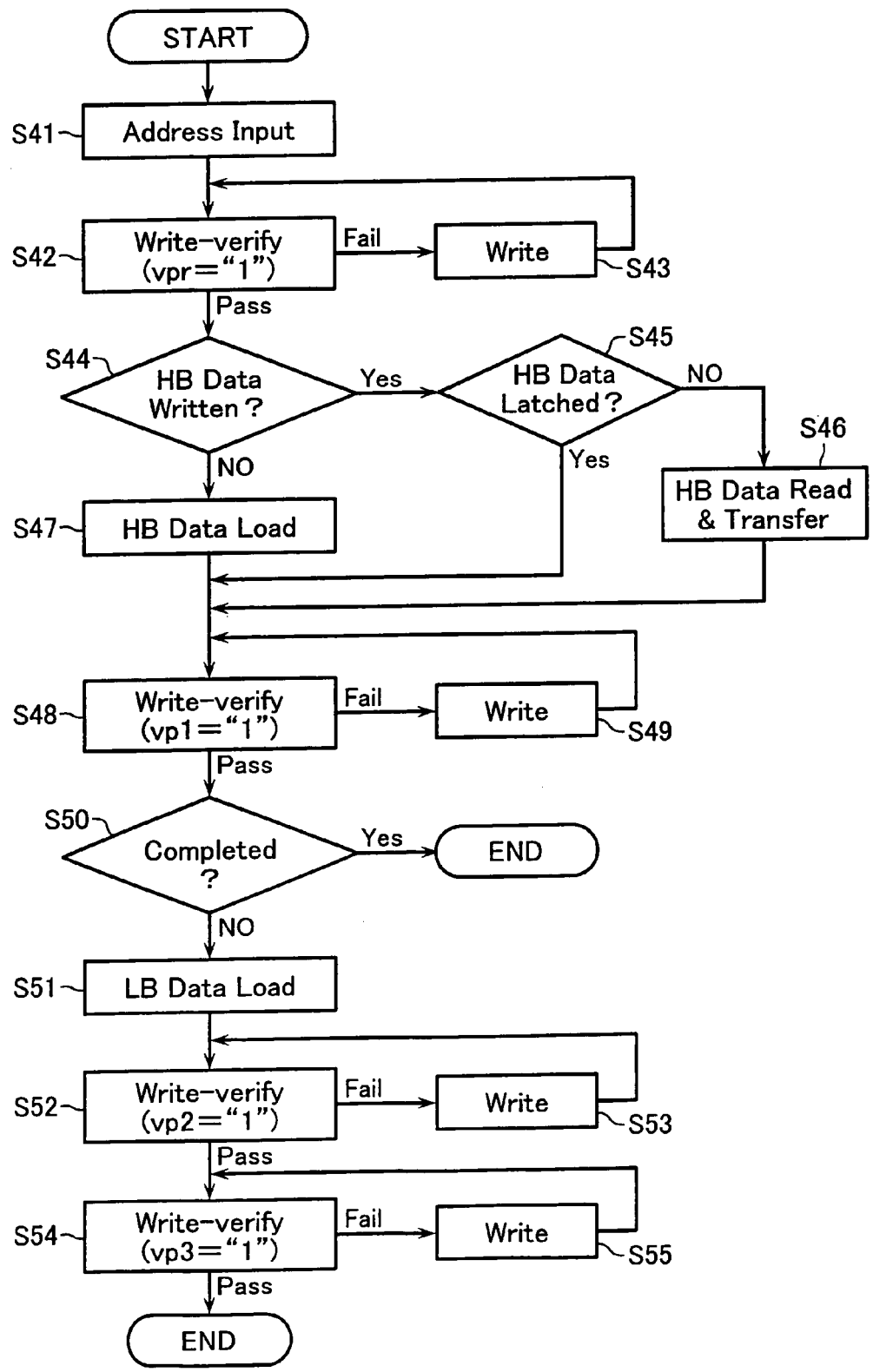
FIG. 40 shows the information cell write sequence.

FIG. 40 shows a page write sequence. Following command input, address is input to select a main page (step S41). Next, write-verify is performed for verifying whether the reference cell corresponding to the selected page (i.e., reference cell, R-cell, on the bit line side opposite to the selected bit line) has been written or not (step S42). If not written, write the reference cell (step S43).

If it is verified that the reference cell has been written, go to the next step S44. In this case, it is considered that the write sequence may be interrupted by, for example, a read access for the same bank. Therefore, judge whether the upper sub-page (HB) data has been written or not (step S44). Only in a case that the HB data has not been written, HB data is input from the external to be loaded in the data latch HBL (step S47).

In case the HB data has been written, judge whether it is stored in the data latch HBL or not (step S45). If "NO", the HB data is read out from the cell array and transferred to the data latch HBL (step S46).

Next, the HB data write-verify is performed (step S48). At this time, the HB data is output to data nodes B and /B in response to the write timing signal vp1="1".

If the write-verify is "FAIL", write data (step S49). HB data having been written, the verify step S48 will become "PASS" soon. Data write is performed with write voltage Vpgm to a selected word line TWL (or CWL). In a cell, the channel of which is set to be Vss in accordance with HB data, electrons are injected into the cell's floating gate, so that the cell's threshold voltage is increased (i.e., "0" write). In another cell, the channel of which is set in a higher floating state, electron injection into the floating gate does not occur (i.e., "1" write or write-inhibiting).

The above-described operation will be repeated until the verify result becomes "PASS". Then, judge whether the entire sub-page data have been written or not (step S50). If "NO", the lower sub-page (LB) data is input from the external to be loaded in the data latch LBL (step S51).

The LB data write is, as described above, performed with two steps in accordance with the HB page data. That is, write-verify with write timing signal vp2="1" (step S52) and data write (step S53) are repeated until the verify result becomes "PASS". Following it write-verify with write timing signal vp3="1" (step S54) and data write (step S55) are repeated until the verify result becomes "PASS". One page data write is performed as described above.

Figure 41:
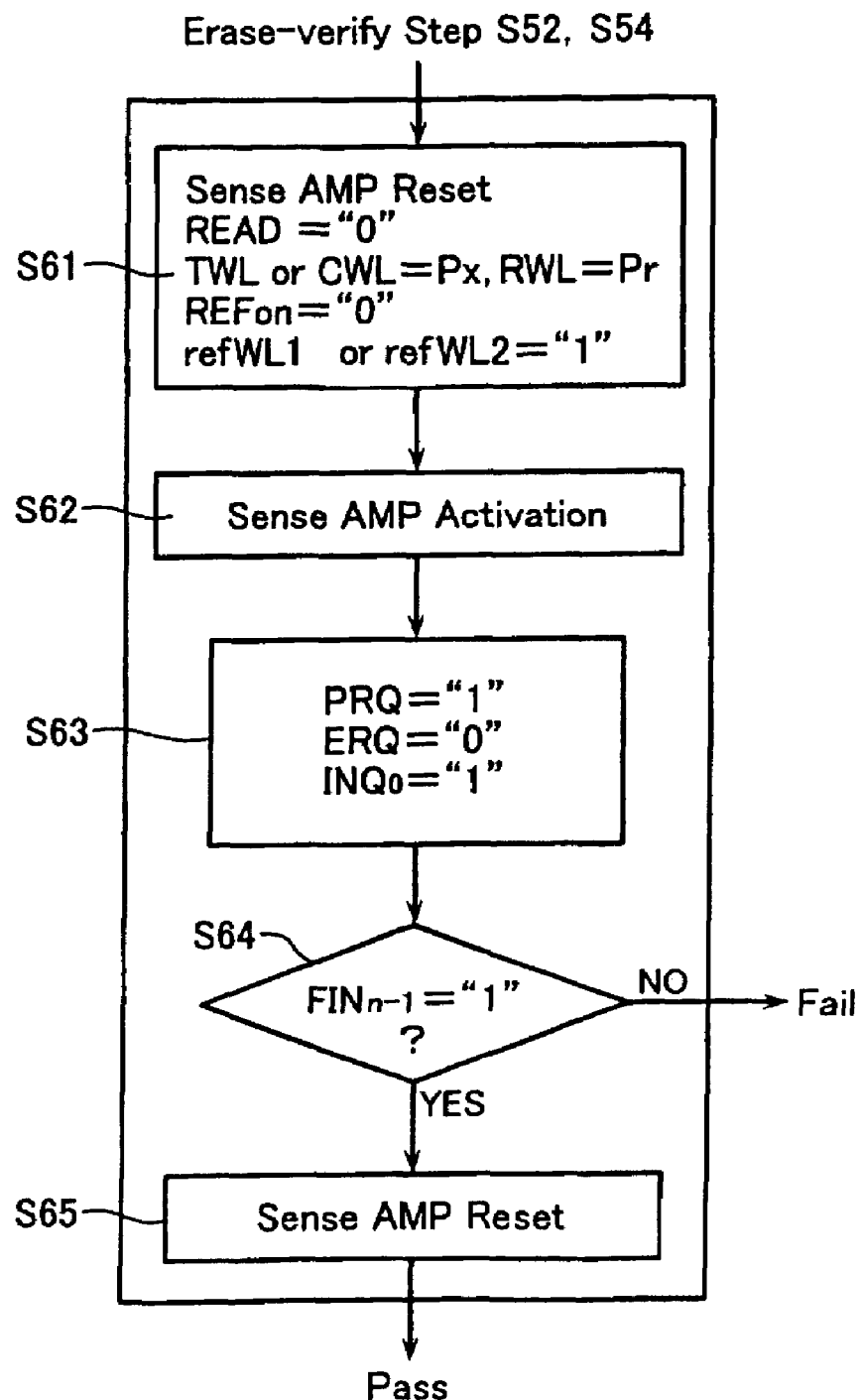
FIG. 41 shows the detail of the information cell write-verify step.

FIG. 41 shows a detailed flow of the write-verify steps S52 and S54. Initially, the sense amplifier is reset; the sense amplifier and the data latch are separated from each other with the read control signal READ="0"; a selected word line TWL (or CWL) is applied with verify voltage Px; a reference word line RWL selected simultaneously with the selected word line is applied with verify voltage Pr (step S61).

At this time, the control signal REFon is set to be "0", so that the reference current source is not coupled to the sense amplifier. One of the control signals refWL1 and refWL2 is set to be "1" in accordance with which side of the bit lines BL and /BL is subjected to the write-verify. This is for making the latch data influence the verify-judgment via the data nodes B and /B.

The verify voltage Px is: P2 necessary for verifying that the threshold voltage is increased to L2 in case of HB data write; P3 necessary for verifying that the threshold voltage is increased to L3, and P1 necessary for verifying that the threshold voltage is increased to L1 in case of the LB data write, while the verify voltage of the reference word line RWL is Pr (refer to FIG. 7). Then, activate the sense amplifier to sense data (step S62).

Figure 42:
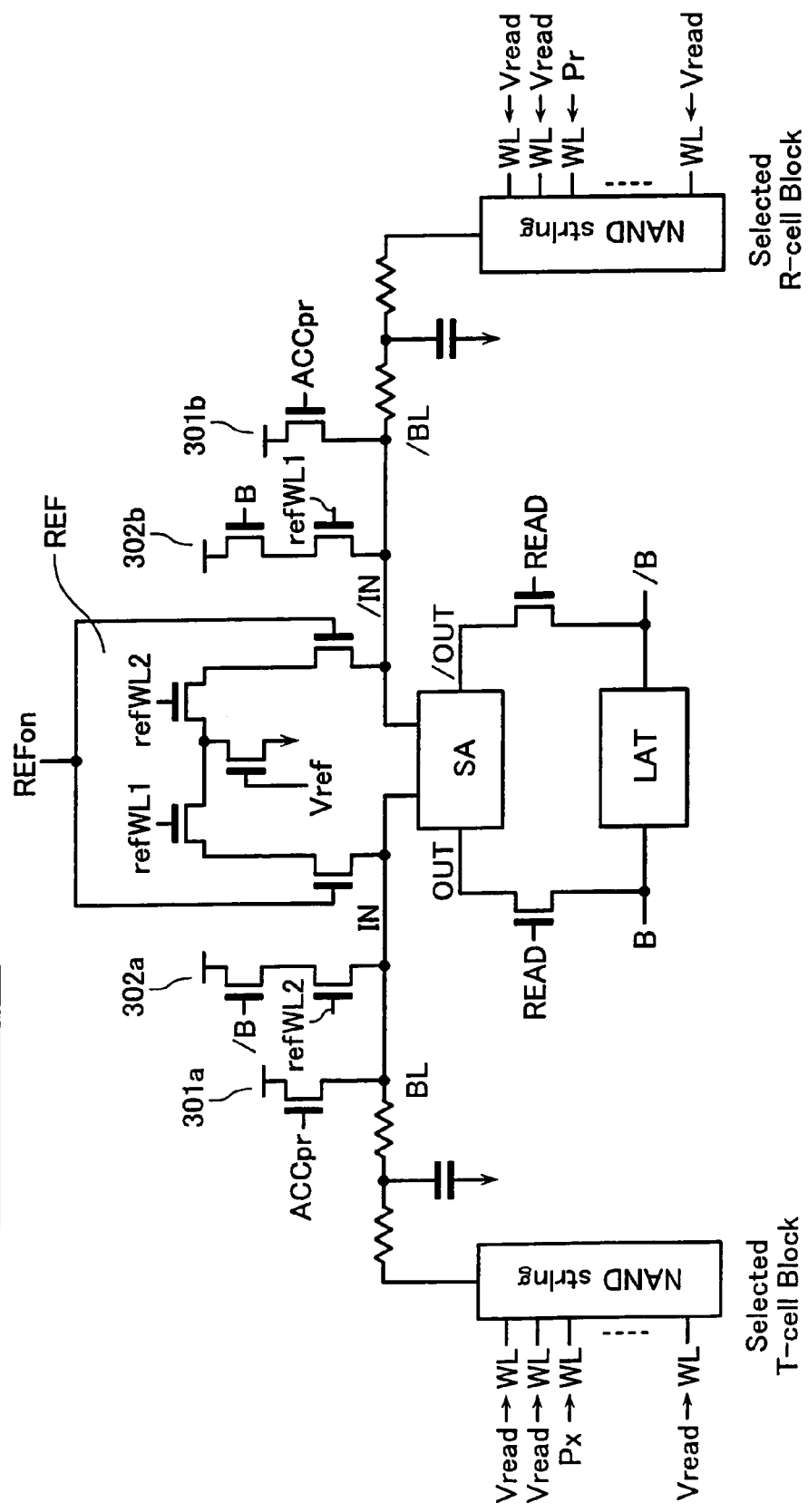
FIG. 42 shows the relationship between the bias of the NAND string and the sense amplifier at the information cell write time.

FIG. 42 shows a state where T-cell block and R-cell block are selected on the bit line BL side and /BL side, respectively, and verify voltages Px(x=1, 2, 3) and Pr are applied to the selected word lines, respectively. At this time, the reference current source circuit REF is separated from the input nodes IN and /IN. Although, in FIG. 42, a simplified read pass voltage applied to the non-selected word lines is expressed as Vread, the level will be selected, as described with reference to FIG. 12, in accordance with steps and cells.

In case of verify-read on the bit line BL side, refWL2 is set to be "1", as explained above. As a result, in case of B="1" and /B="0", T-cell current on the bit line BL side is compared with R-cell current on the bit line /BL side, so that the write data is judged. When B="0" and /B="1", write is inhibited. At this time, the charge-up circuit 302a becomes on, and the input node IN on the bit line BL side is kept Vdd without regard to cell data, whereby it will be judged that the output node /OUT is "H", i.e., judged that it is the same as the write completion state.

The write-verify read operation in the state shown in FIG. 42 will be explained in detail below. Firstly, as similar to the normal read operation, bit line precharge is performed with the precharge circuits 301a and 301b. Then the sense amplifier SA is activated to sense data as follows. If the cell current of the reference cell R-cell on the bit line /BL side is smaller than that of the information cell T-cell on the bit line BL side, output node OUT becomes "H", so that the bit line BL is forcedly set to be at Vss. This means that that the selected cell T-cell has not been written into a desired level. This state also provides such a condition of "0" write that the bit line BL is set to be "L" in the next write cycle.

If data write is sufficiently performed and the cell current of T-cell becomes smaller than that of R-cell, the output node /OUT becomes "H", so that the bit line /BL is forcedly set to be at Vss. Based on B="1" and /OUT="1", write completion will be judged. In this case, the bit line BL becomes Vdd, and the selected cell T-cell is set in the write inhibiting state in the next write cycle.

After data sensing, one of the bit lines BL and /BL is Vdd; and the other Vss, and then the verify-check circuit VCK becomes operable in the write-verify mode with PRQ="1", ERQ="0" and INQ0="1" applied (step S63). Judging whether FINn has become "1" or not, verify-judgment will be performed (step S64). If "NO", write is performed while if "YES", the sense amplifier SA is reset and the pass flag is output (step S65).

In case of C-cell verify-writing, refWL1 is set to be "1" in place of refWL2. As a result, based on /B="1" and OUT="1", the write completion will be judged.

The present invention is not limited to the above-described embodiment. For example, while T-cell array and C-cell array in the bank each has one reference cell (R-cell) block therein in the above-described embodiment, it is able to increase the reference cell blocks in accordance with the cell array capacity.

Figure 43:
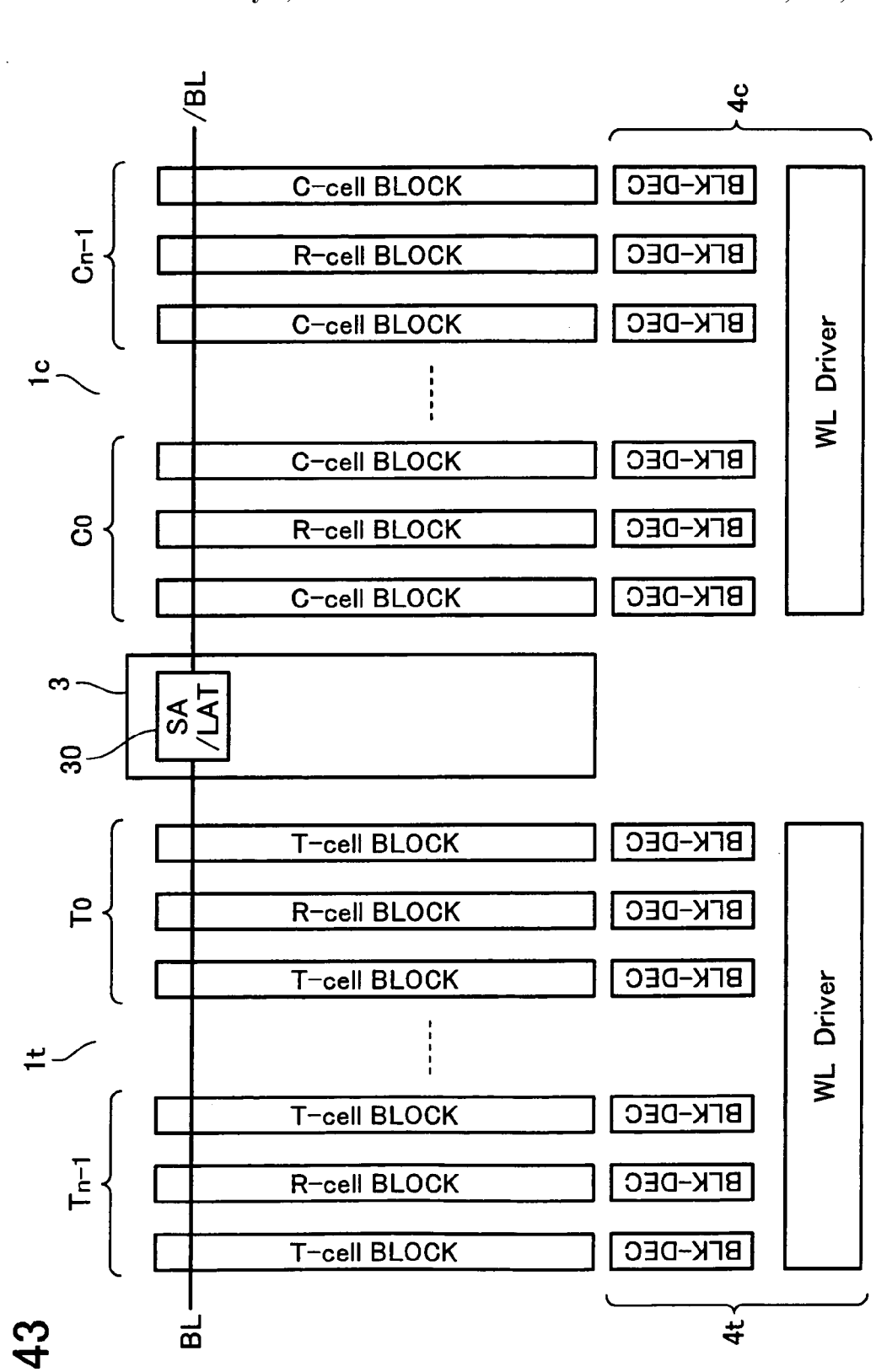
FIG. 43 shows another cell array layout.

For example, FIG. 43 shows an example that T-cell array and C-cell array are divided into "n" groups of T0 to Tn−1 and "n" groups of C0 to Cn−1, respectively, in the direction of the bit line, and one R-cell block is disposed at the center of each group. Each of the row decoders 4t and 4c is constituted to have a block decoder BLK-DEC for selecting a block and word line/select gate line drivers adapted to multiple blocks in common.

With the above described reference cell block arrangement, address is assigned in such a way that when a T-cell block (or a C-cell block) is selected in one group in the cell array 1t and 1c, a R-cell block is selected in another group disposed distant in reverse from the sense amplifier with about the same distance. As a result, the bit line length on the selected T-cell or C-cell side is kept substantially the same as that on the corresponding R-cell side.

Note here that it is not always necessary to use the central block in each of the groups T0 to Tn−1 and C0 to Cn−1 as the reference cell (R-cell) block. For example, in each of groups T0 to Tn−1 and C0 to Cn−1, a block disposed farthest from the sense unit 30 may be used as the reference cell block. This means such a condition is satisfied as follows: the bit line length on the selected reference cell block side, i.e., substantial bit line length from the sense unit to the selected R-cell, is always equal to or larger than that on the selected T-cell or C-cell. In other words, it means that the bit line length difference between the bit line BL and /BL is not varied from being negative to being positive, and this is preferable to precisely perform data sensing.

While the memory cell in the above-described embodiment has such a stacked gate structure that a floating gate and a control gate are stacked, other non-volatile memory cell structures may be used such as SONOS (Silicon Oxide Nitride Oxide Silicon) structure, MONOS (Metal Oxide Nitride Oxide Silicon) structure and the like.

Further, the present invention may be adapted to other non-volatile memories, each of which stores a kind of physical quantity level not limited to a threshold level, such as a phase-change memory PRAM (Phase-change PAM), a resistance memory RRAM (Resistance RAM), an ovonic memory OUM (Ovonic Unified Memory), a magnetoresistive memory MRAM (Magnetoresistive RAM), a ferroelectric memory (Ferroelectric RAM), and the like.

[Application Devices]

As an embodiment, an electric card using the non-volatile semiconductor memory device according to the above-described embodiment of the present invention and an electric device using the card will be described bellow.

Figure 44:
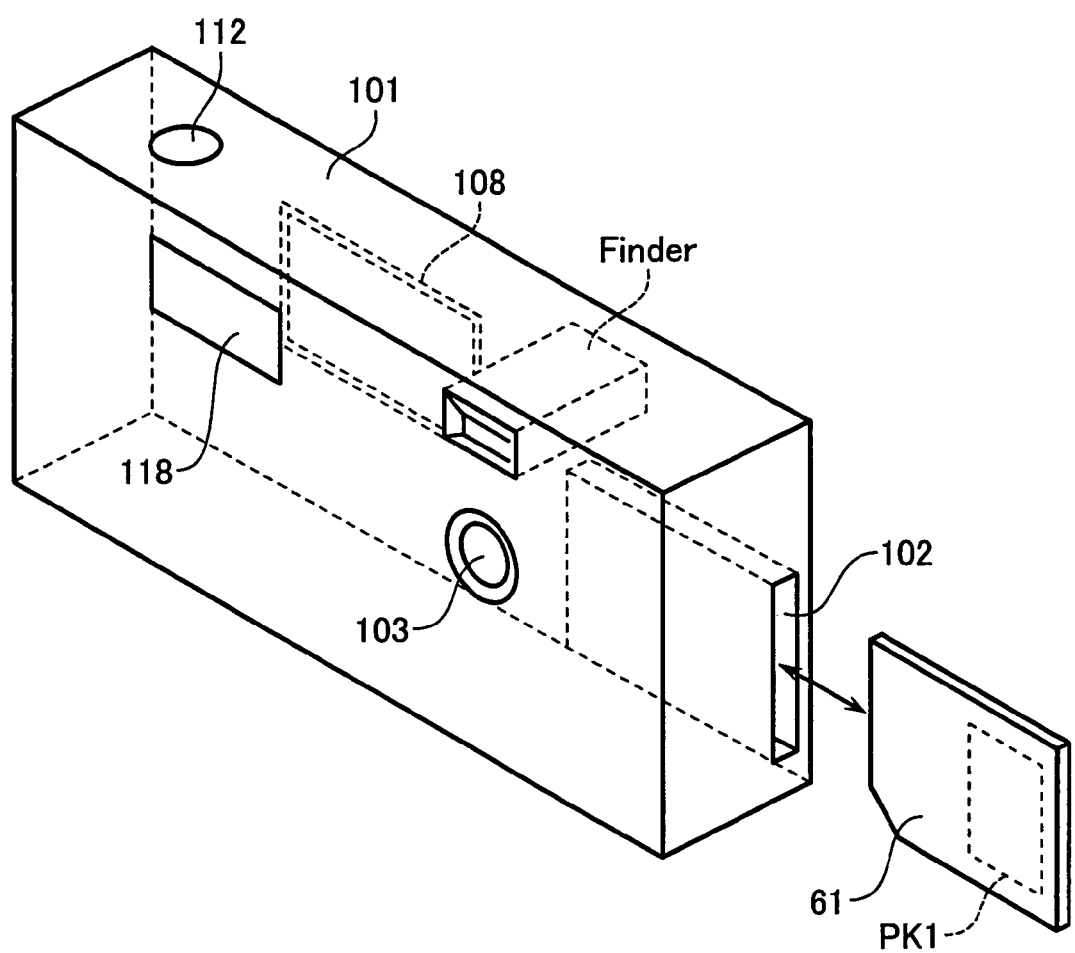
FIG. 44 shows another embodiment applied to a digital still camera.

FIG. 44 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 45:
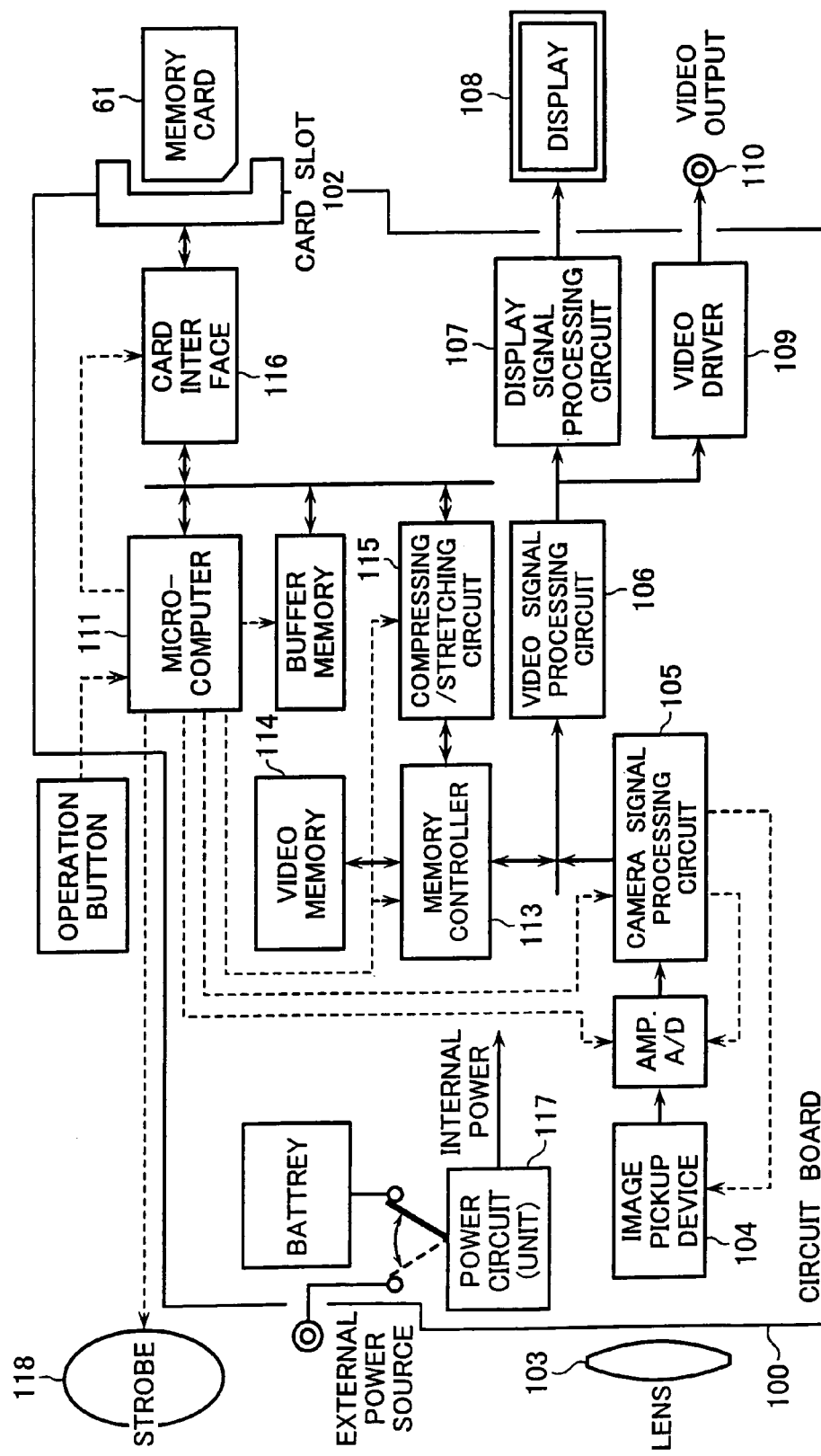
FIG. 45 shows the internal configuration of the digital still camera.
Figure 46A:
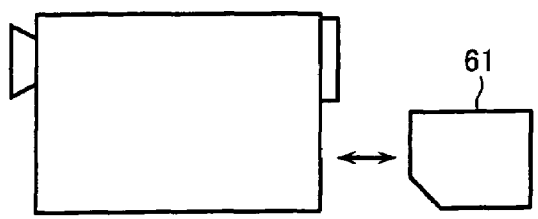
FIGS. 46A to 46J show other electric devices to which the embodiment is applied.
Figure 46F:
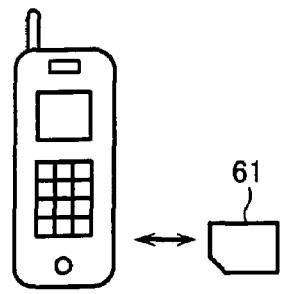
Figure 46B:
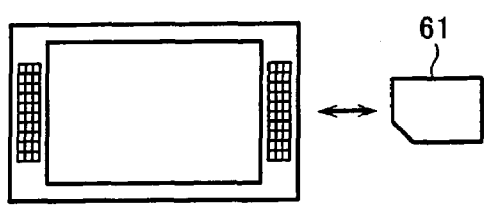
Figure 46G:
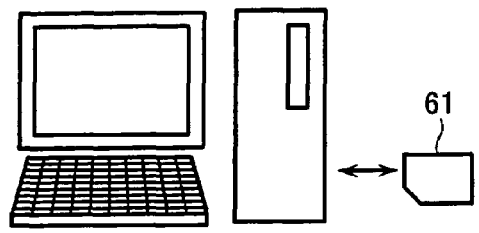
Figure 46C:
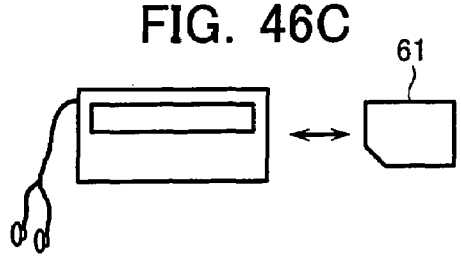
Figure 46H:
Figure 46D:
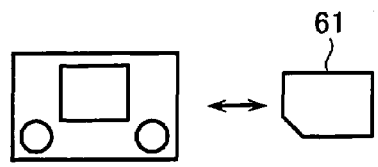
Figure 46I:
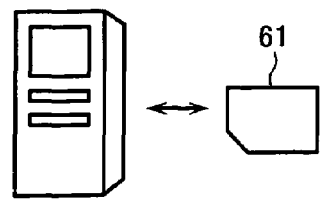
Figure 46E:
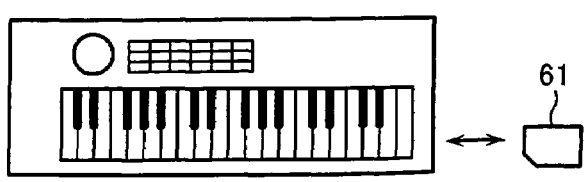
Figure 46J:
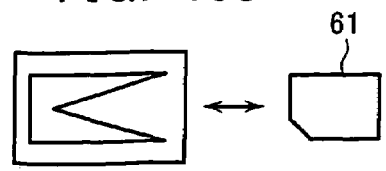

FIG. 45 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 46A to 46J, as well as in portable electric devices. That is, the electric card can also be used in a video camera shown in FIG. 46A, a television set shown in FIG. 46B, an audio apparatus shown in FIG. 46C, a game apparatus shown in FIG. 46D, an electric musical instrument shown in FIG. 46E, a cell phone shown in FIG. 46F, a personal computer shown in FIG. 46G, a personal digital assistant (PDA) shown in FIG. 46H, a voice recorder shown in FIG. 46I, and a PC card shown in FIG. 46J.

What is claimed is:

1. A semiconductor memory device comprising:
   first and second cell arrays each having a plurality of electrically rewritable and non-volatile memory cells arranged therein; and
   a sense amplifier circuit configured to read out data of the first and second cell arrays, wherein
   plural information cells and at least one reference cell are set in each of the first and second cell arrays, one of four data levels L0, L1, L2 and L3 (where, L0<L1<L2<L3) being written into the information cell, reference level Lr (where, L0<Lr<L1) being written into the reference cell to used for detecting the data level of the information cell, and wherein
   the sense amplifier circuit is configured to detect a cell current difference between the information cell and the reference cell simultaneously selected from one of the first and second cell arrays and the other, respectively.

2. The semiconductor memory device according to claim 1, wherein
   the four data levels L0, L1, L2 and L3 of the information cell are threshold voltage levels defined as follows: L0 is an erase state with a negative threshold voltage; and L1, L2 and L3 are write states with positive threshold voltages defined by the expression of L1=L2−L1<L3−L2, and wherein
   the reference level Lr is a write state with a positive threshold voltage lower than L1.

3. The semiconductor memory device according to claim 1, wherein
   the information cell stores one of the four data levels L0, L1, L2 and L3 as a four-value data (HB,LB) where HB is a higher bit; and LB a lower bit.

4. The semiconductor memory device according to claim 3, wherein
   the four-value data is read out with the following procedures of:
   a first read procedure for applying a first read voltage and a reference voltage to a selected information cell and a selected reference cell, respectively, thereby reading out a higher bit, the first read voltage being equal to or nearly equal to the data level L2, the reference voltage being higher than the reference level Lr;

a second read procedure for applying a second read voltage and the reference voltage to the selected information cell and the selected reference cell, respectively, thereby reading out a lower bit when the higher bit is in a first logic state, the second read voltage being equal to or nearly equal to the data level L3; and a third read procedure for applying a third read voltage and the reference voltage to the selected information cell and the selected reference cell, respectively, thereby reading out a lower bit when the higher bit is in a second logic state, the third read voltage being equal to or nearly equal to the data level L1.

5. The semiconductor memory device according to claim 4, wherein
the lower bit is read out independently from the higher bit with judging whether the number of "1" data obtained through the second and third read procedures is even or odd.

6. The semiconductor memory device according to claim 3, wherein
the four-value data is written with the following procedures of:
a first write procedure for writing the reference level into the reference cell, which is in an erase state with the data level L0;
a second write procedure for selectively increasing the threshold voltage of the information cell, which is in the erase state with the data level L0, to the data level L2 based on the higher bit data;
a third write procedure for selectively increasing the threshold voltage of the information cell with the data level L2, to the data level L3 based on the higher bit data and the lower bit data; and
a fourth write procedure for selectively increasing the threshold voltage of the information cell, which is in the erase state with the data level L0, to the data level L1 based on the higher bit data and the lower bit data.

7. The semiconductor memory device according to claim 1, wherein
the first and second cell arrays are disposed as sandwiching the sense amplifier circuit therebetween, each of the first and second cell arrays having NAND strings each having plural memory cells connected in series.

8. The semiconductor memory device according to claim 7, wherein
each of the first and second cell arrays has plural blocks arranged in the direction of a bit line, each block being constituted by a set of NAND strings arranged in the direction of a word line, at least one block in each the first and second cell array being selected as a reference cell-use block while the remaining blocks being selected as information cell-use blocks; and wherein
the sense amplifier circuit has plural sense units each having a differential amplifier, which detects cell current difference between the information cell and the reference cell in the information cell-use block and the reference cell-use block, respectively, which are selected in one and the other of the first and second cell arrays, so as to sense data.

9. The semiconductor memory device according to claim 8, wherein
the sense unit further comprises:
a reference current source circuit selectively connected to one input node of the differential amplifier to supply a reference current to it for detecting a cell current input to the other input node;

two data latches disposed to be data-transferable between those and the differential amplifier, in which the higher bit data and the lower bit data are loaded, respectively; and a bit line precharging circuit disposed in addition to the current source in the differential amplifier for precharging a selected bit line during a certain period prior to activation of the differential amplifier.

10. The semiconductor memory device according to claim 8, wherein
at a data read time and an information cell's write-verify time, the information cell is coupled to one bit line within a pair of bit lines selected in the first and second cell array while the reference cell is coupled to the other, the pair of bit lines being coupled to two input nodes of the differential amplifier.

11. The semiconductor memory device according to claim 8, wherein
at a verify-erase time and a reference cell's verify-write time, the first and second cell arrays are sequentially selected in accordance with the complementary data stored in the two data latches, and when a bit line in a selected cell array at the verify-read time is coupled to one input node of the differential amplifier, the reference current source circuit is coupled to the other input node.

12. The semiconductor memory device according to claim 8, wherein
at a data read time, it is judged whether the number of "1" read data is even or odd based on the data-transferring operation of a shift-register constituted by the two data latches.

13. A semiconductor memory device comprising:
first and second cell arrays each having word lines and bit lines disposed in parallel and a plurality of electrically rewritable and non-volatile memory cells arranged at the crossings thereof, plural information cells and at least one reference cell being set in each of the first and second cell arrays, one of four data levels L0, L1, L2 and L3 (where, L0<L1<L2<L3) being written into the information cell, a reference level Lr (where, L0<Lr<L1) being written into the reference cell to be used for detecting the data level of the information cell;
word line driver circuits configured to selectively drive word lines in the first and second cell arrays; and
a sense amplifier circuit connected to a pair of bit lines, to which the information cell and the reference cell simultaneously selected from one and the other of the first and second cell arrays, are coupled, so as to detect a cell current difference between the information cell and the reference cell, thereby reading out data of the information cell, wherein
each of the word line driver circuits has at least two driving modes with respect to driving plural word lines simultaneously selected at a data read time and applied with respectively predetermined word line voltages as follows: a first driving mode for applying a first voltage necessary for data-sensing to a first word line from the beginning; and a second driving mode for applying a third voltage higher than a second voltage necessary for data-sensing to a second word line, and then restoring the third voltage to the second voltage.

14. The semiconductor memory device according to claim 13, wherein
the four data levels L0, L1, L2 and L3 of the information cell are threshold voltage levels defined as follows: L0 is an erase state with a negative threshold voltage; and L1, L2 and L3 are write states with positive threshold voltages defined by the expression of L1=L2−L1<L3−L2, and wherein the reference level Lr is a write state with a positive threshold voltage lower than L1.

15. The semiconductor memory device according to claim 14, wherein
each the information cell stores one of the four data levels L0, L1, L2 and L3 as a four-value data (HB,LB) where HB is a higher bit; and LB a lower bit.

16. The semiconductor memory device according to claim 15, wherein
the four-value data is read out with the following procedures of:
a first read procedure for applying a first read voltage and a reference voltage to a selected information cell and a selected reference cell, respectively, thereby reading out a higher bit, the first read voltage being equal to or nearly equal to the data level L2, the reference voltage being higher than the reference level Lr;
a second read procedure for applying a second read voltage and the reference voltage to the selected information cell and the selected reference cell, respectively, thereby reading out a lower bit when the higher bit is in a first logic state, the second read voltage being equal to or nearly equal to the data level L3; and
a third read procedure for applying a third read voltage and the reference voltage to the selected information cell and the selected reference cell, respectively, thereby reading out a lower bit when the higher bit is in a second logic state, the third read voltage being equal to or nearly equal to the data level L1.

17. The semiconductor memory device according to claim 16, wherein
the lower bit is read out independently from the higher bit with judging whether the number of "1" data obtained through the second and third read procedures is even or odd.

18. The semiconductor memory device according to claim 15, wherein
the four-value data is written with the following procedures of:
a first write procedure for writing the reference level into the reference cell, which is in an erase state with the data level L0;
a second write procedure for selectively increasing the threshold voltage of the information cell, which is in the erase state with the data level L0, to the data level L2 based on the higher bit data;
a third write procedure for selectively increasing the threshold voltage of the information cell with the data level L2, to the data level L3 based on the higher bit data and the lower bit data; and
a fourth write procedure for selectively increasing the threshold voltage of the information cell, which is in the erase state with the data level L0, to the data level L1 based on the higher bit data and the lower bit data.

19. The semiconductor memory device according to claim 13, wherein
the first and second cell arrays are disposed as sandwiching the sense amplifier circuit therebetween, each of the first and second cell arrays having NAND strings each having plural memory cells connected in series.

20. A semiconductor memory device comprising:
first and second bit lines constituting a pair;
a plurality of first NAND strings selectively coupled to the first bit line, the first NAND string including a plurality of memory cells connected in series, each memory cell serving as an information cell to be written into one of four data levels of L0, L1, L2 and L3 (where, L0<L1<L2<L3);
a plurality of second NAND strings selectively coupled to the second bit line, the second NAND string including a plurality of memory cells connected in series, each memory cell serving as an information cell to be written into one of the four data levels of L0, L1, L2 and L3;
at least one third NAND string selectively coupled to the first bit line, the third NAND string including a plurality of memory cells connected in series, each memory cell serving as an reference cell to be written into data level Lr (where, L0<Lr<L1);
at least one fourth NAND string selectively coupled to the second bit line, the fourth NAND string including a plurality of memory cells connected in series, each memory cell serving as an reference cell to be written into the data level Lr;
a decode circuit configured to select one of the first NAND strings and the fourth NAND string simultaneously, or one of the second NAND strings and the third NAND string simultaneously, at a read time; and
a sense amplifier circuit configured to be coupled to the first and second bit lines to detect a cell current difference between a selected information cell and a selected reference cell, thereby sensing data of the selected information cell.

21. A data read method of a semiconductor memory device with NAND strings arranged therein, each NAND string including a plurality of memory cells connected in series, which are selectively driven by different word lines to store multi-value data, comprising first and second read procedures sequentially performed to detect different data levels of a selected memory cell in a selected NAND string, wherein
the first read procedure is performed with a first read voltage applied to a selected word line and a first pass voltage applied to non-selected word lines, the first pass voltage being set to turn on cells without regard to cell data;
the second read procedure is performed with a second read voltage applied to the selected word line and a second pass voltage applied to the non-selected word lines, the second read voltage being higher than the first read voltage, the second pass voltage being set to turn on cells without regard to cell data and stepped down from the first pass voltage; and
at the switching time from the first read procedure to the second read procedure, the first read voltage is boosted to a third read voltage higher than the second read voltage and then restored to the second read voltage.

* * * * *